United States Patent [19]
Burns, Jr. et al.

[11] Patent Number: 5,990,509
[45] Date of Patent: *Nov. 23, 1999

[54] 2F-SQUARE MEMORY CELL FOR GIGABIT MEMORY APPLICATIONS

[75] Inventors: Stuart Mcallister Burns, Jr., Ridgefield, Conn.; Hussein Jbrahim Hanafi, Goldens Bridge, N.Y.; Jeffrey J. Welser, Greenwich, Conn.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/787,418

[22] Filed: Jan. 22, 1997

[51] Int. Cl.$^6$ ............... H01L 27/108; H01L 29/76; H01L 29/94; H01L 29/788
[52] U.S. Cl. ............... 257/296; 257/316; 257/330; 257/623; 438/257
[58] Field of Search ............... 257/296, 302, 257/303, 316, 330, 623; 438/257, 259, 263

[56] References Cited

U.S. PATENT DOCUMENTS 4,716,548  12/1987  Mochizuki .
4,774,556   9/1988  Fujii et al. .

(List continued on next page.)

FOREIGN PATENT DOCUMENTS 61-140170  6/1986  Japan ............... 257/302

OTHER PUBLICATIONS

Chang et al. (1980) "Vertical FET Random–Access Memories with Deep Trench Isolation" IBM Technical Disclosure Bulletin, 22 (8B): 3683–3687.

Frank et al. (1992) "Monte Carlo Simulation of a 30 nm Dual–Gate MOSFET: How Short Can Si Go?" IEEE: 2 1.1.1–21.1.4.

Hamamoto et al. (1995) "Cell–Plate–Line and Bit–Line Complementarily Sensed (CBCS) Architecture for Ultra Low–Power Non–Destructive DRAMs" Symposium on VLSI Circuits Digest of Technical Papers: 79–80.

Hanafi et al. (1995) "A Scalable Low Power Verticle Memory" IEEE: 27.2.1–27.2.4.

Pein et al. (1993) "A 3–D Sidewall Flash EPROM Cell and Memory Array" IEEE Electron Device Letters 14(8): 415–417.

Pein et al. (1995) "Performance of the 3–D PENCIL Flash EPROM Cell and Memory Array" IEEE Transactions on Electron Devices, 42(11).

Tiwari et al. (1995) "Volatile and Non–Volatile Memories in Silicon with Nano–Crystal Storage" IEEE: 20.4.1–20.4.4.

*Primary Examiner*—Olik Chaudhuri
*Assistant Examiner*—Howard Weiss
*Attorney, Agent, or Firm*—Daryl K. Neff

[57] ABSTRACT

A densely packed array of vertical semiconductor devices having pillars and methods of making thereof are disclosed. The array has columns of bitlines and rows of wordlines. The gates of the transistors act as the wordlines, while the source or drain regions acts as the bitlines. The array also has vertical pillars, each having a channel formed between source and drain regions. Two transistors are formed per pillar. This is achieved by forming two gates per pillar formed on opposite pillar sidewalls which are along the bitline direction. This forms two wordlines or gates per pillar arranged in the wordline direction. The source regions are self-aligned and located below the pillars. The source regions of adjacent bit lines are isolated from each other without increasing the cell size. Two floating gates per pillar may be used for EEPROM or flash memory application. The isolated sources allow individual cells to be addressed and written via direct tunneling, in both volatile and non-volatile memory cell configurations. For Gbit DRAM applications, stack or trench capacitors may be formed on the pillars, or in trenches surrounding the pillars, respectively. When two capacitors or two floating gates are formed per pillar, the effective memory cell size is 1 bit/$2F^2$.

12 Claims, 49 Drawing Sheets

U.S. PATENT DOCUMENTS

| | | |
|---|---|---|
| 4,796,228 | 1/1989 | Baglee . |
| 4,876,580 | 10/1989 | Nishizawa ............................... 257/330 |
| 4,929,988 | 5/1990 | Yoshikawa . |
| 4,964,080 | 10/1990 | Tzeng . |
| 4,979,004 | 12/1990 | Esquivel et al. . |
| 5,001,526 | 3/1991 | Gotou . |
| 5,006,909 | 4/1991 | Kosa . |
| 5,016,067 | 5/1991 | Mori . |
| 5,016,068 | 5/1991 | Mori . |
| 5,017,977 | 5/1991 | Richardson . |
| 5,071,782 | 12/1991 | Mori . |
| 5,078,498 | 1/1992 | Kadakia et al. . |
| 5,146,426 | 9/1992 | Mukherjee et al. . |
| 5,258,634 | 11/1993 | Yang . |
| 5,338,953 | 8/1994 | Wake . |
| 5,350,937 | 9/1994 | Yamazaki et al. . |
| 5,382,540 | 1/1995 | Sharma et al. . |
| 5,386,132 | 1/1995 | Wong . |
| 5,460,994 | 10/1995 | Kim ....................................... 438/242 |
| 5,467,305 | 11/1995 | Bertin et al. . |
| 5,497,017 | 3/1996 | Gonzales . |
| 5,574,299 | 11/1996 | Kim . |

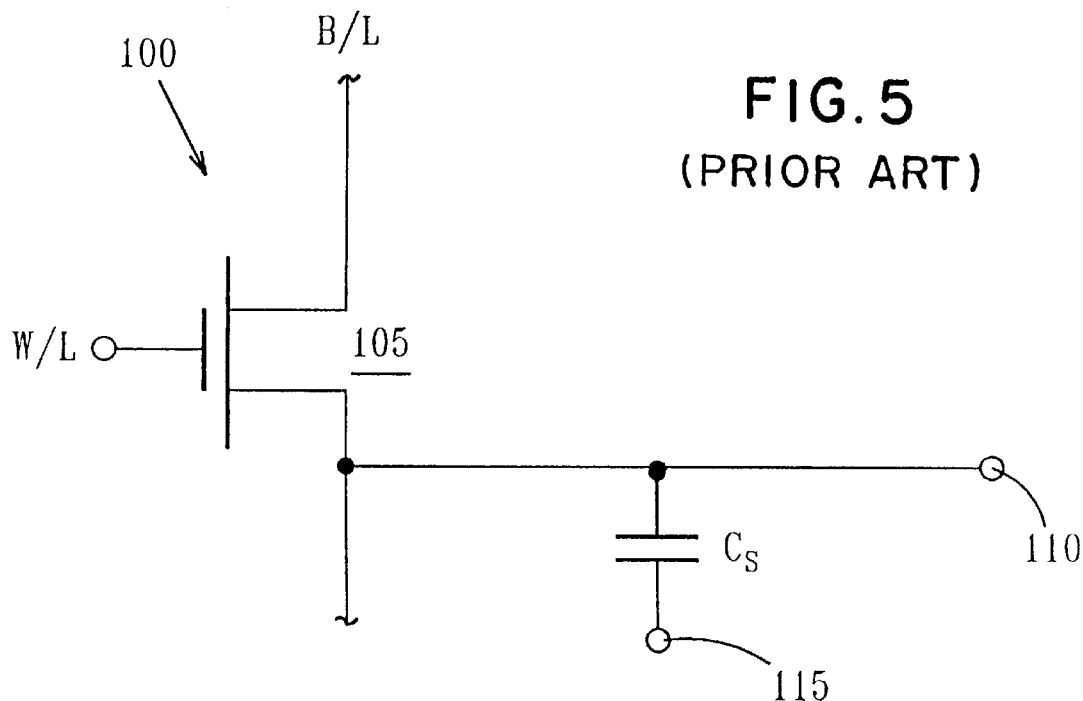
FIG. 5
(PRIOR ART)
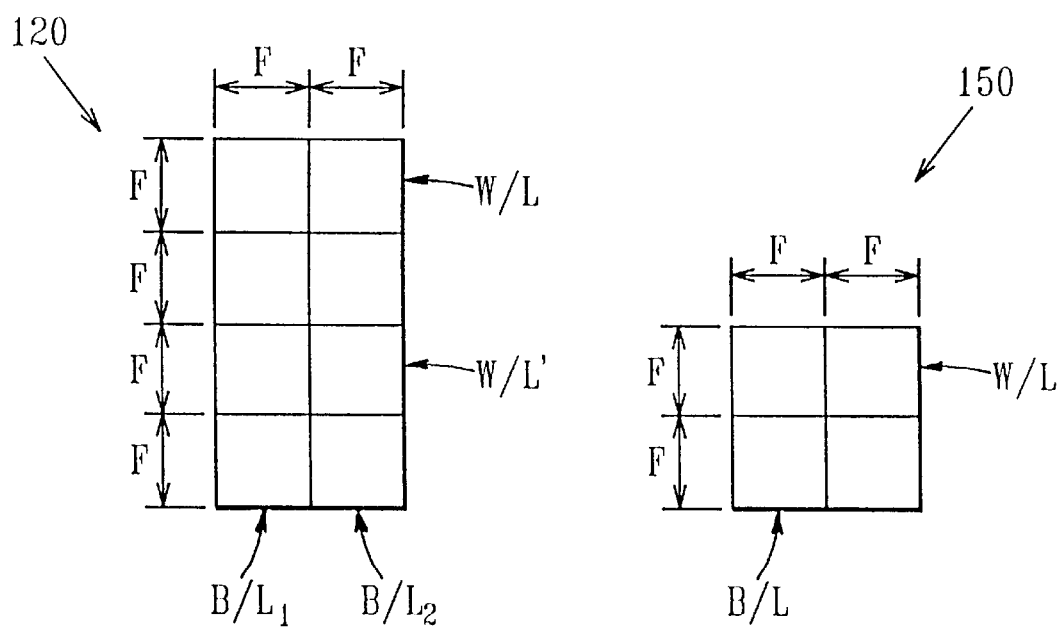
FIG. 6
(PRIOR ART)
FIG. 7
(PRIOR ART)

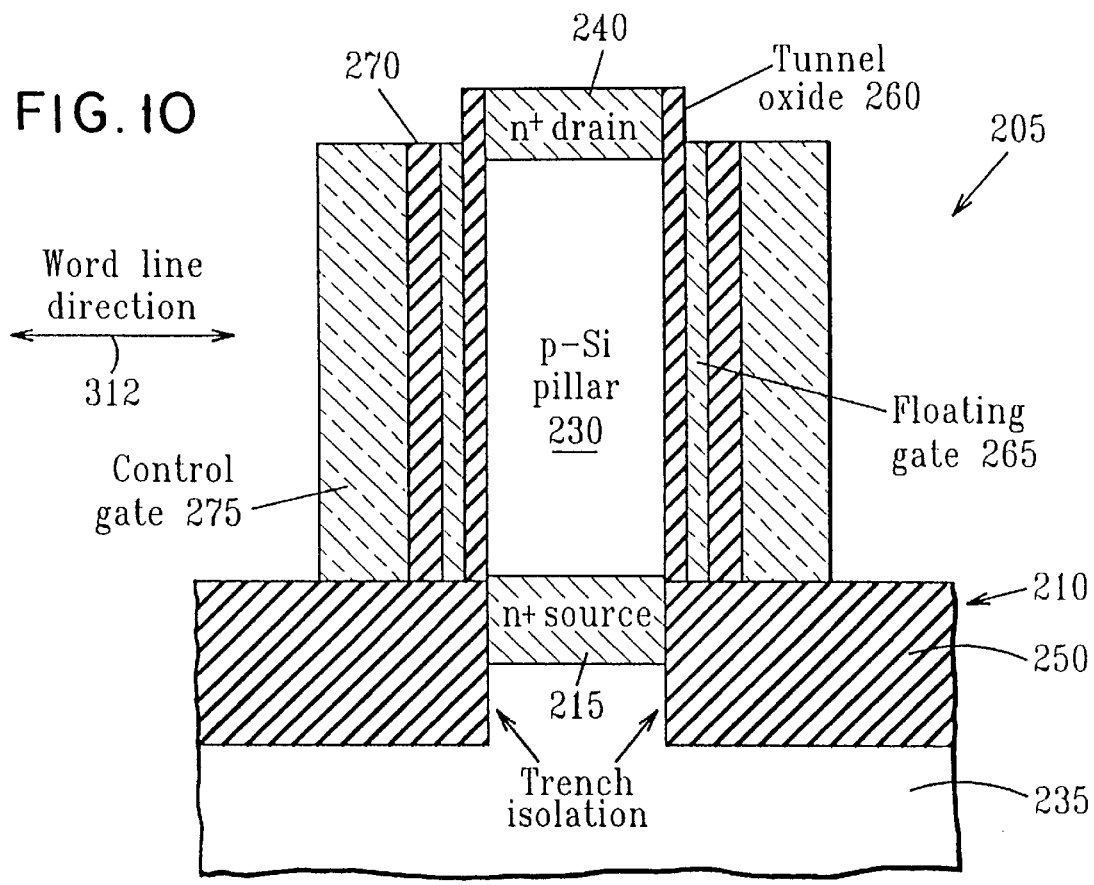
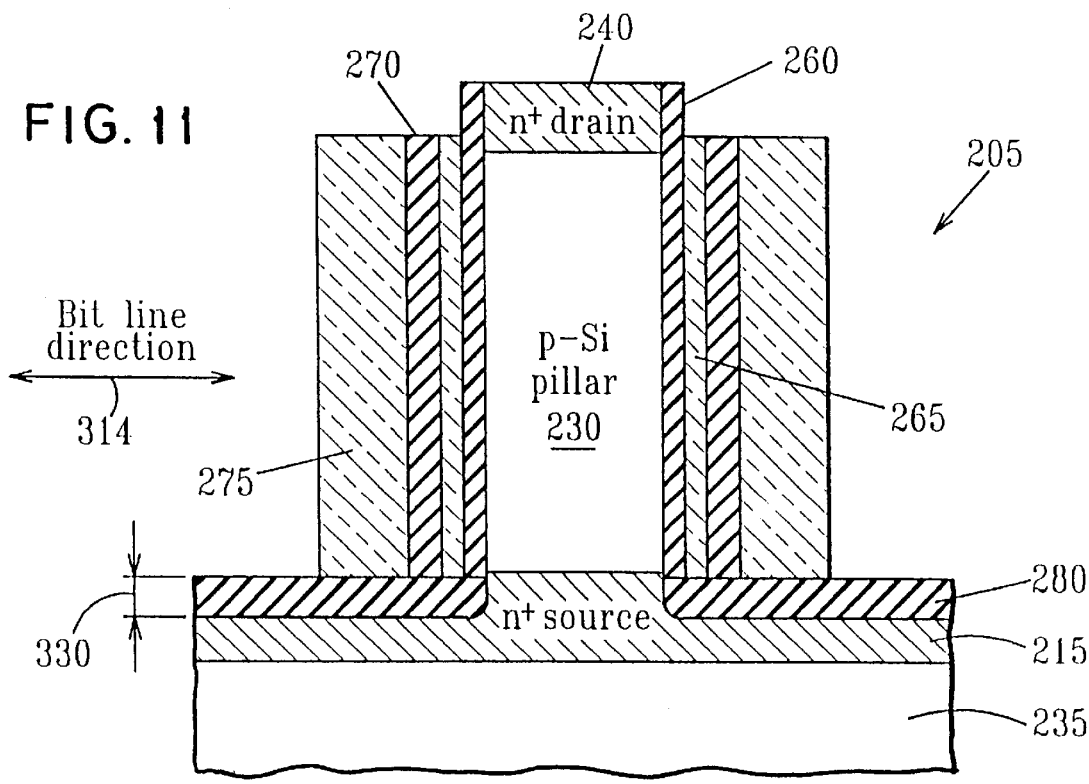

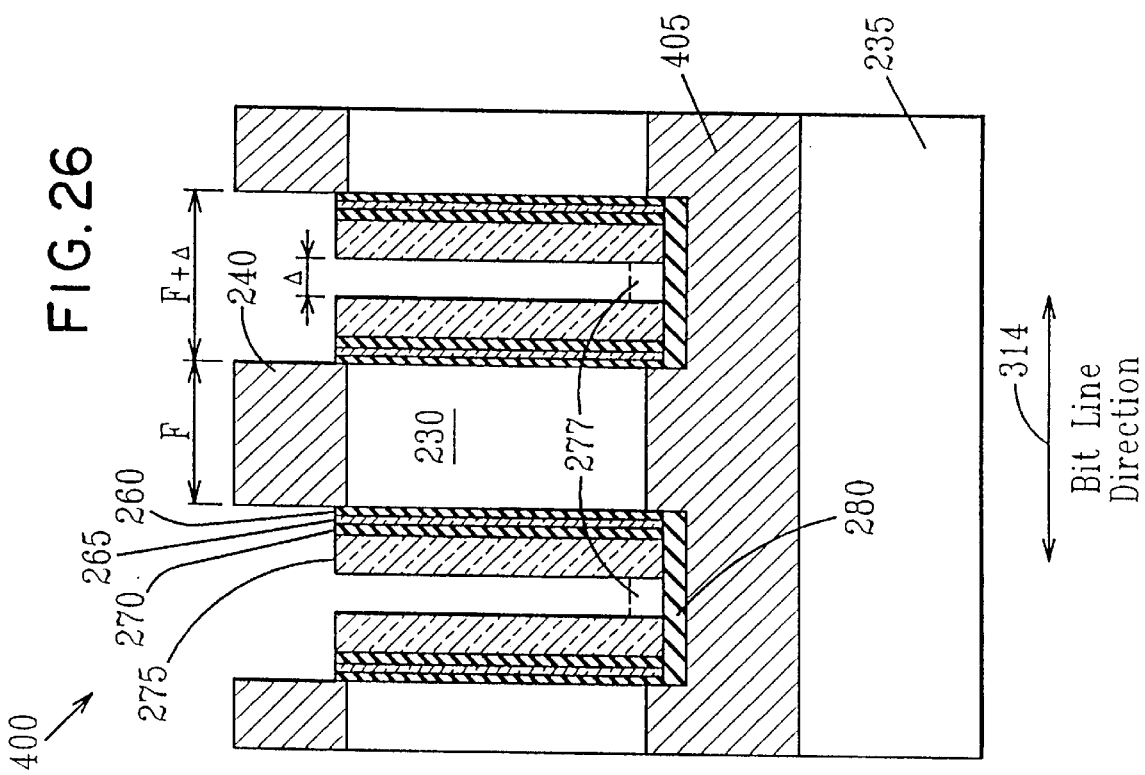
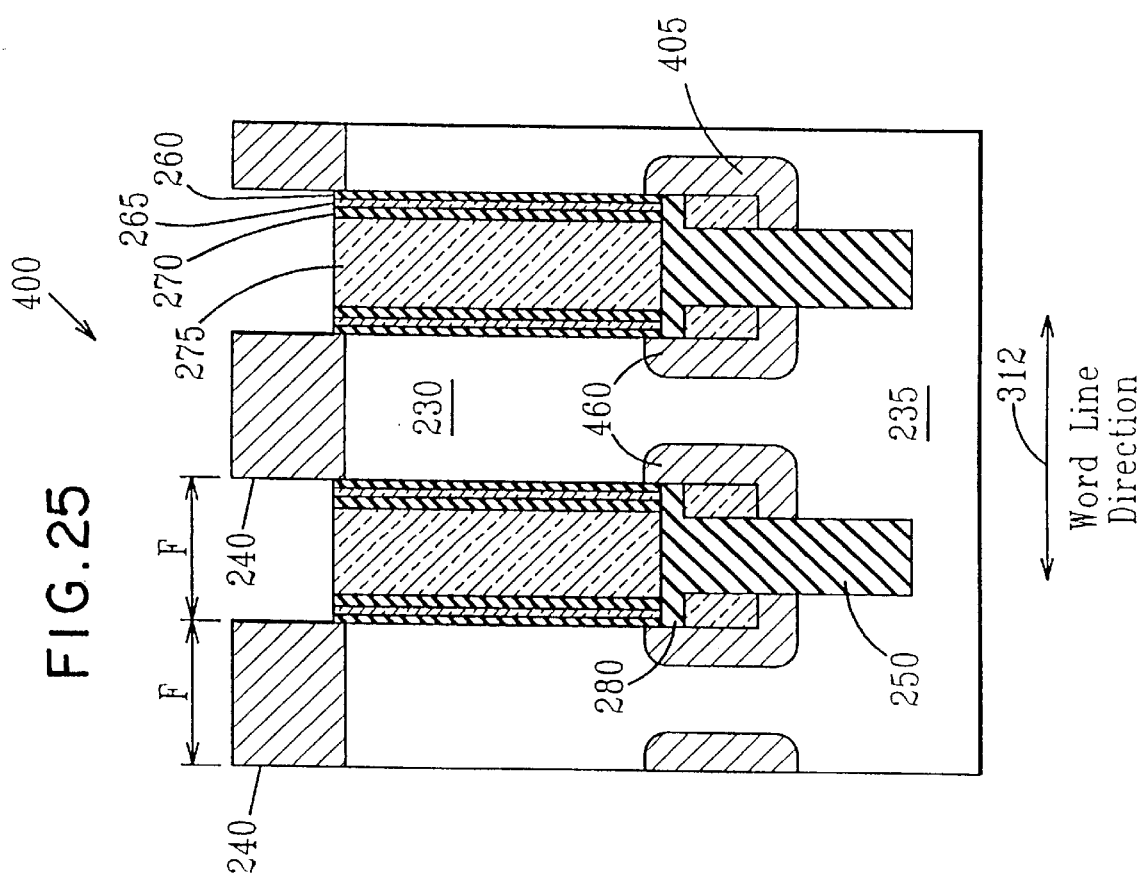

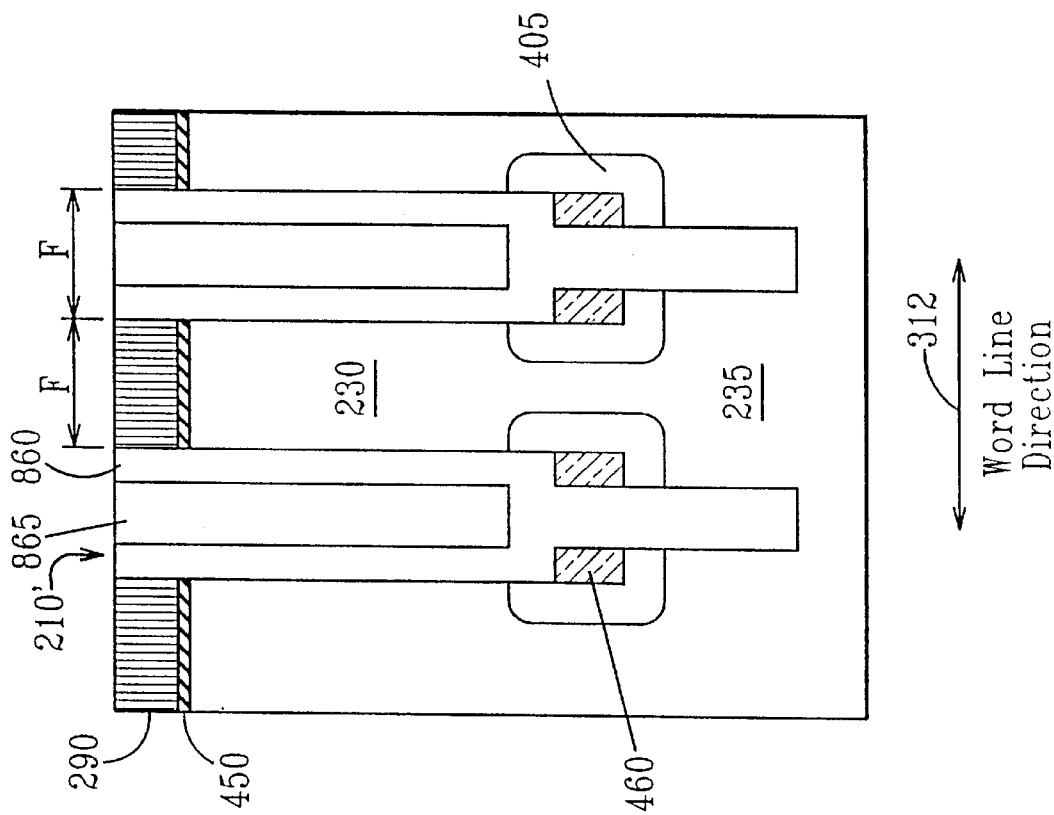
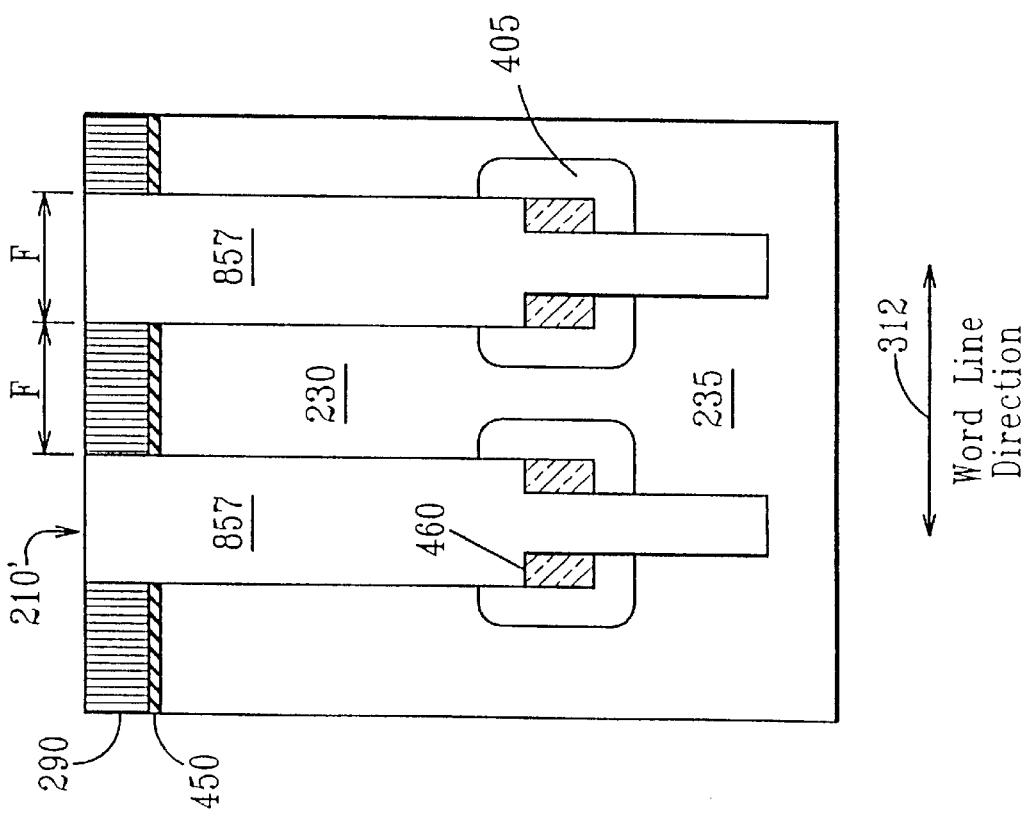

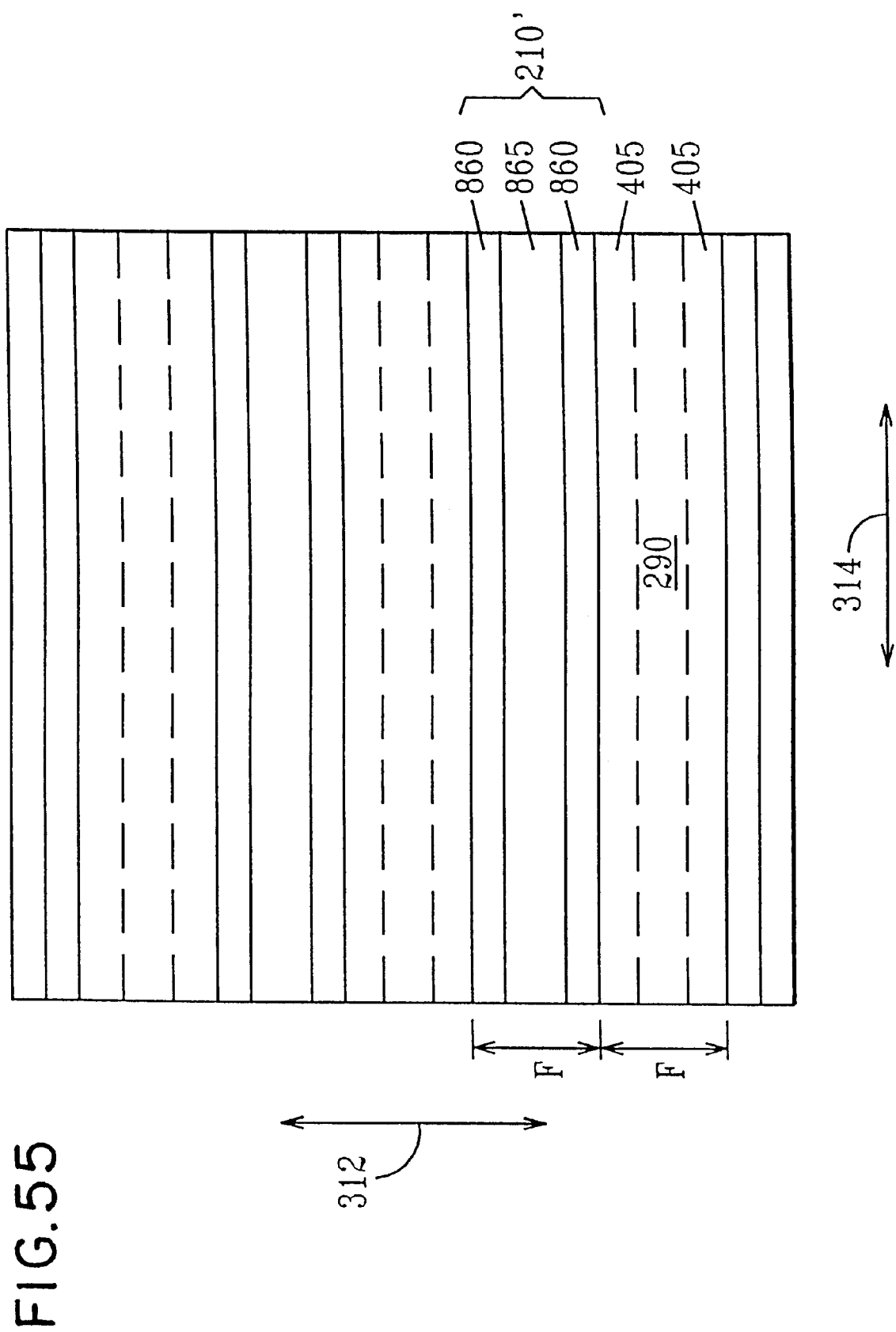

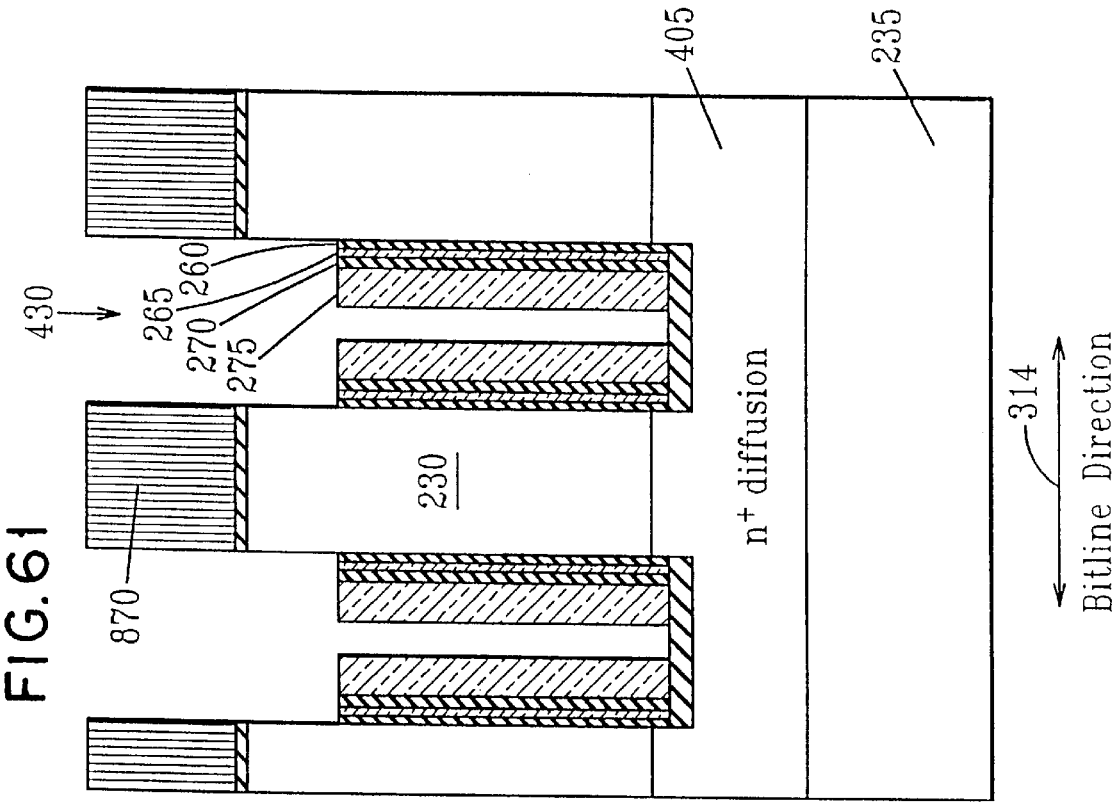
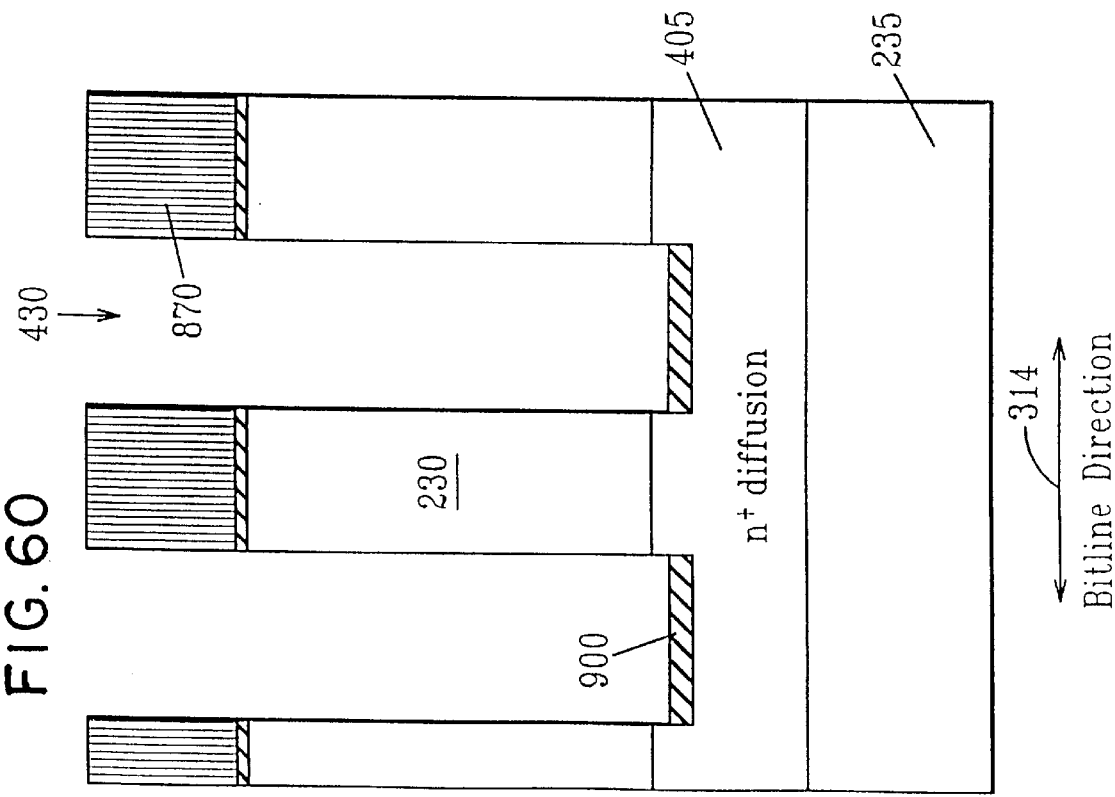

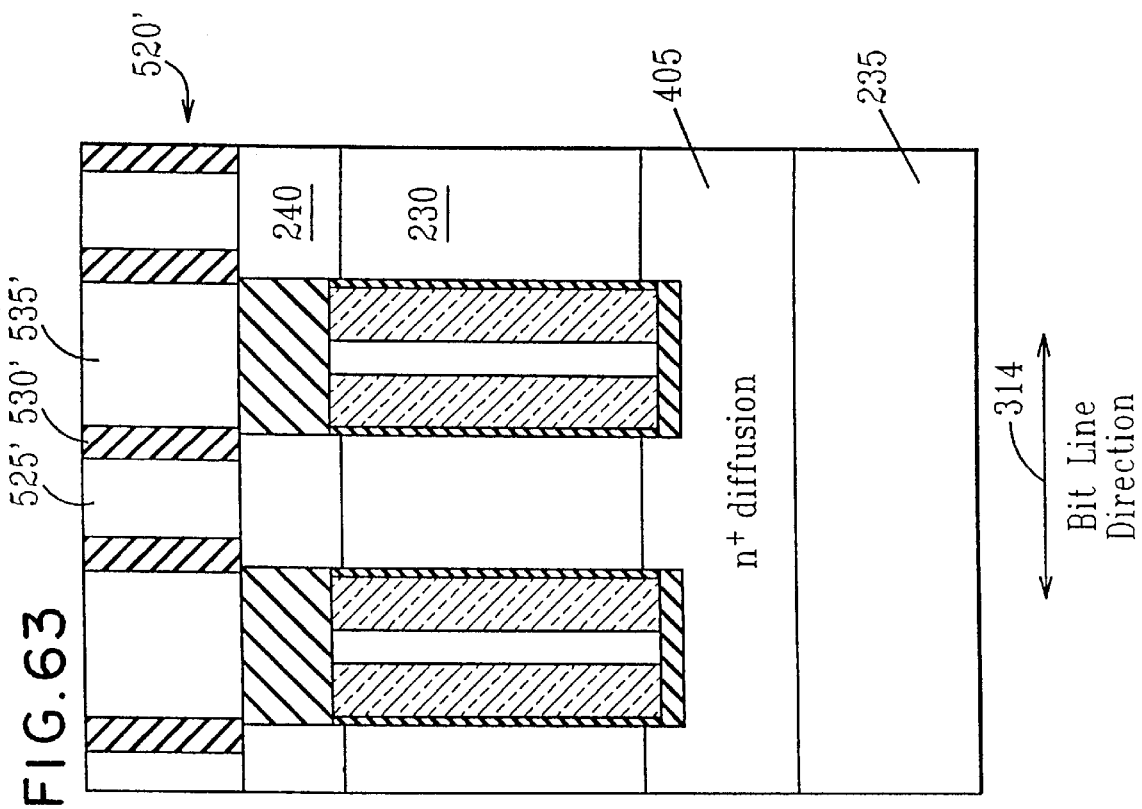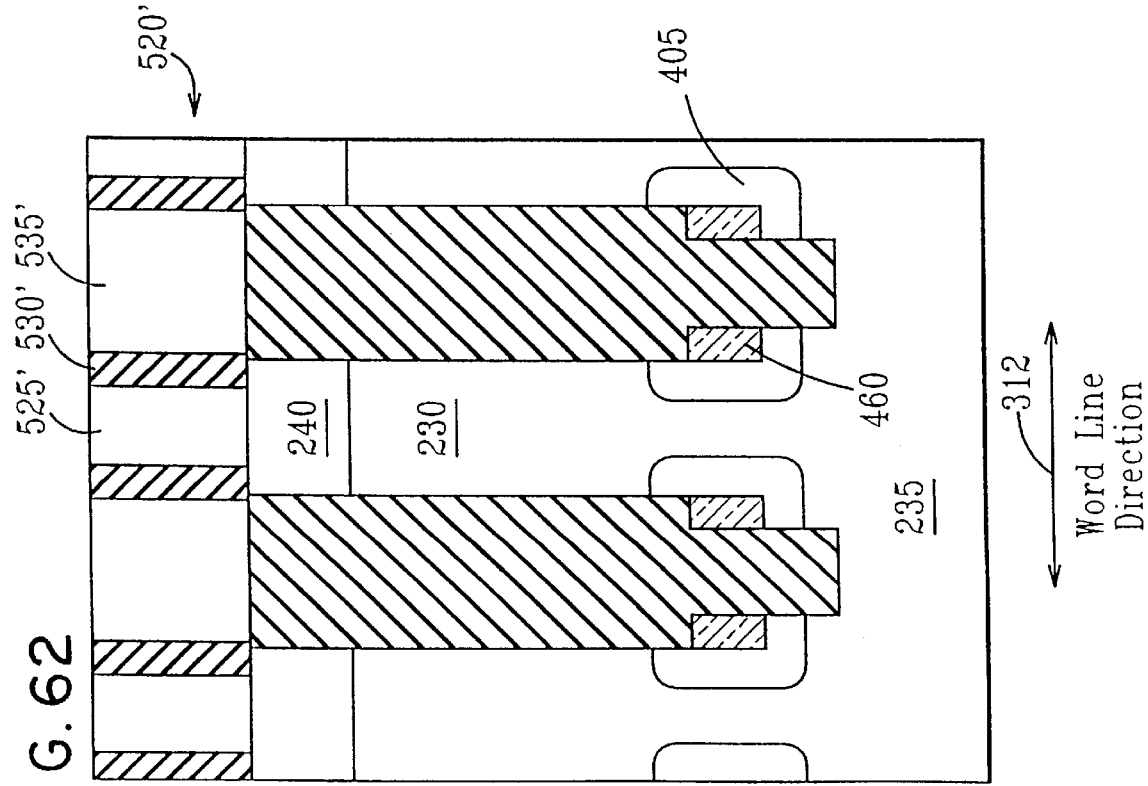

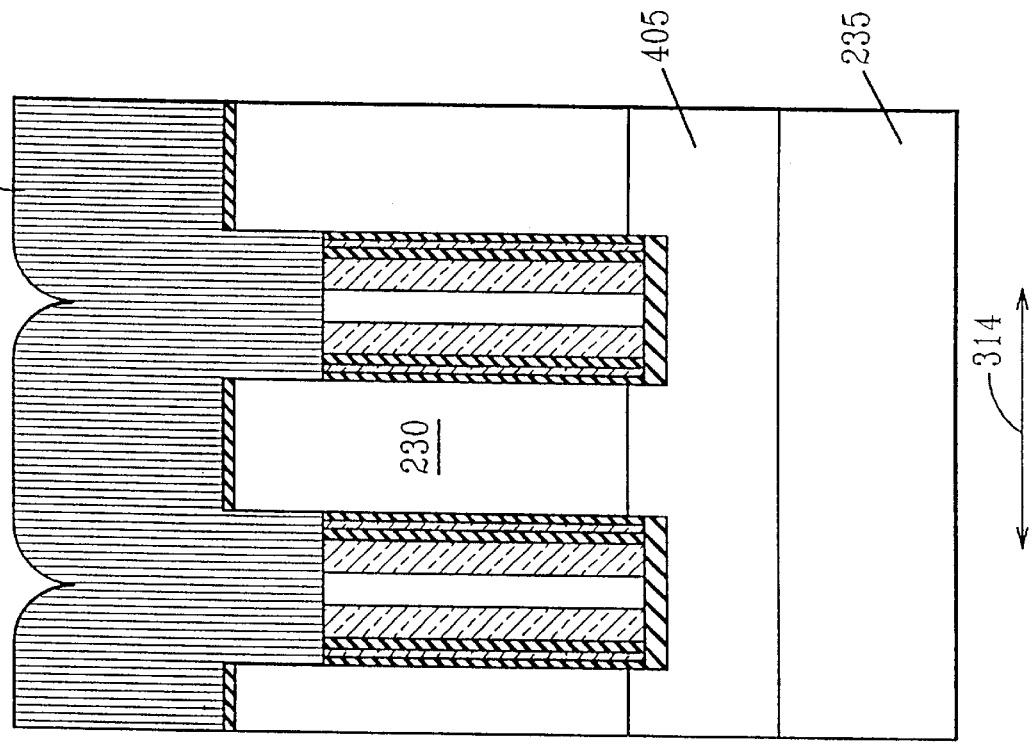
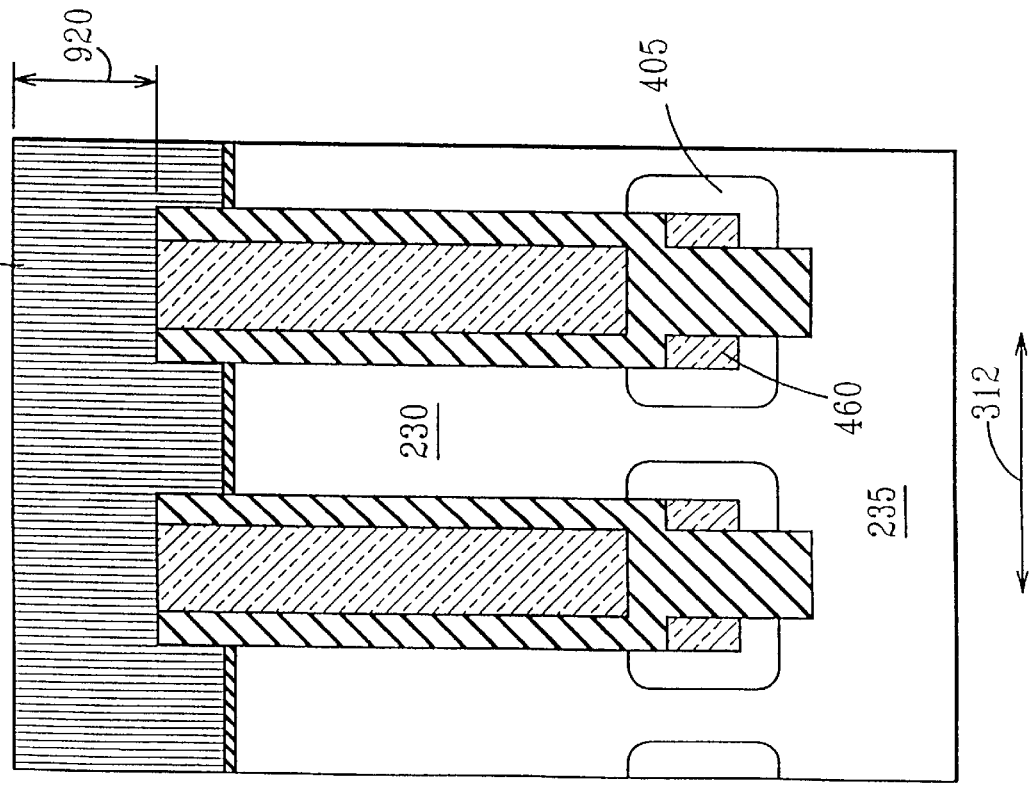

2F-SQUARE MEMORY CELL FOR GIGABIT MEMORY APPLICATIONS

RELATED APPLICATIONS

The following patent applications are assigned to the assignee hereof and contain subject matter related to the subject matter of the present patent application:

1. U.S. Pat. No. 5,874,760, entitled "4F-Square Memory Cell Having Vertical Floating-Gate Transistors with Self-Aligned Shallow Trench Isolation", filed on even date herewith for Jeffrey J. WELSER, Hussein I. HANAFI, Stuart M. BURNS, and Waldemar W. KOCON;

2. U.S. Pat. No. 5,877,631, entitled "Self-Aligned Diffused Source Vertical Transistors with Stack Capacitors in a 4F-Square Memory Cell Array", filed on even date herewith for Jeffrey J. WELSER, Hussein I. HANAFI, Stuart M. BURNS, Waldemar W. KOCON, and Howard L. KALTER; and 3. U.S. Pat. No. 5,794,434, entitled "Self-Aligned Diffused Source Vertical Transistors with Deep Trench Capacitors in a 4F-Square Memory Cell Array", filed on even date herewith for Jeffrey J. WELSER, Hussein I. HANAFI, Stuart M. BURNS, and Howard L. KALTER.

The contents of the above-listed patent applications are incorporated herein by reference.

BACKGROUND OF THE INVENTION

1. Field of the Invention

The present invention is directed to densely packed vertical transistors in a 2F-square memory cell, and methods for making thereof, and more particularly, to non-volatile or volatile memory cells having vertical floating-gate transistors, stack capacitors or deep trench capacitors.

2. Discussion of the Prior Art

There is much interest to scale down densely packed semiconductor devices on an integrated circuit (IC) chip to reduce size and power consumption of the chip, and allow faster operation. In order to achieve the high packing density necessary for Gbit memory applications, it is crucial to shrink the size of an individual memory cell as much as possible. FIG. 1 shows a top view of a conventional array 10 of conventional erasable programmable read only memory (EPROM) devices 15, using vertical transistors, such as metal oxide silicon field effect transistors (MOSFETs) with a floating gate layer. The conventional array 10 is described in the following two references. H. Pein and J. D. Plummer, "A 3-D sidewall flash EPROM call and memory array", Electron Device Letters, Vol. 14 (8) 1993 pp.415–417. H. Pein and J. D. Plummer, "Performance of the 3-D Pencil Flash EPROM Cell and Memory Array", IEEE Translations on Election Devices, Vol. 42, No. 11, 1995, pp. 1982–1991.

The conventional array 10 has rows of wordlines 20 and columns of bitlines 25. The size of a cell 27 of the array 10 is 2F by 2F+$\Delta$, leading to a cell area of 4F$^2$+2F$\Delta$. F is the minimum linewidth of the feature size that can be patterned with lithography. 2F is the cell size along the wordline 20, and 2F+$\Delta$ is the cell size along the bitline 25. Typically, $\Delta$ is approximately 0.2F, resulting in a cell area of approximately 4F$^2$+0.4F area achievable using conventional lithography. The additional length $\Delta$ is necessary to separate adjacent wordlines 20.

FIG. 2 shows a partial perspective view of the array 10 of FIG. 1, and FIG. 3 shows a cross sectional view of the vertical MOSFET 15 along a bitline 25.

As shown in FIG. 3, the MOSFET 15 has an n$^+$ source 30 formed on a P-doped silicon substrate 35. The source 30 is formed after etching the substrate 35 to form a vertical pillar 40, referred to as the body of the MOSFET 15. The pillar 40 acts as the transistor channel and has dimensions of F by F, as shown in FIGS. 1 and 3.

As a result of forming the source 30 after forming the pillars 40, the source 30 is formed around edges of the pillar 40 and is absent from a region 45 located below the pillar 40. Thus, the source 30 does not entirely occupy the footprint of the pillar 40. As shown in FIG. 2, all the MOSFETs 15 of the array 10 have a common source 30, including MOSFETs of different bitlines 25 and different wordlines 20. As shown in FIGS. 2–3, the top of each pillar 40 is doped with N-type material to form n$^+$ drains 50 of the vertical transistors 15.

A tunnel oxide 60 is formed around the pillar 40 and an oxide spacer 65 is formed on the source 30. Next, a polysilicon floating gate 70, gate oxide 75 and polysilicon control gate 20 are formed around the tunnel oxide 60. Note, control gates 20 of individual transistors along the wordline 20 are inter-connected to form the wordline 20.

Because the polysilicon control gate 20 grows uniformly around each vertical MOSFET 15, the spacing between MOSFETs 15 of adjacent rows is slightly larger than the feature size F, e.g., F+$\Delta$, where $\Delta$ is approximately 0.2F. This separates adjacent wordlines by amount $\Delta$, when polysilicon is grown up to a distance of 0.5F. This 0.5F thick polysilicon layer covers the top and sidewalls of the pillars 40, as well as the oxide spacer 65 located on the substrate 35 at the base of the pillars 40.

The 0.5F thick grown polysilicon regions at pillar sidewalls separated by distance F, along each wordline 20, merge with each other. This forms the wordlines 20 around a row of pillars that are separated by F. However, the 0.5F thick formed polysilicon regions at pillar sidewalls separated by distance F+$\Delta$ do not merge. Rather, they remain separated by the distance $\Delta$. At the base of the trenches located between these polysilicon covered pillar sidewalls that are separated by F+$\Delta$, the oxide spacer 65 is covered with the 0.5F thick polysilicon.

To separate adjacent wordlines 20, a reactive ion etch (RIE) is performed that removes polysilicon for a thickness of 0.5F. The RIE exposes the top of the pillars 40, as well as the oxide spacer 65 at the base of the pillars that are separated by F+$\Delta$. The exposed distance of the oxide spacer 65 is $\Delta$. Thus, the $\Delta$ separation between adjacent wordlines 20 ensures that control gates 20 of adjacent wordlines are not shorted along the direction of the bitlines 25.

As shown in FIGS. 1 and 2, a first level metal forms bitlines 25 which are orthogonal to the wordlines 20. The first level metal connects drains 50 of MOSFETs 15 along a common bitline 25. The area of the cell 27 of FIG. 2, is small because the substrate 35 is used as a common source 30 for all the MOSFETs 15 of the array 10. FIG. 4 shows a three dimensional view of another conventional array 90, which is similar to the conventional array 10 of FIG. 2, except for having round pillars 95 instead of square pillars 40 (FIG. 2). As in the array 10 of FIG. 2, the array 90 of FIG. 4 has a common source 30.

The memory function of each cell 27 is achieved by charging or discharging the floating gate region 70. This causes a measurable shift in the threshold voltage of the vertical MOSFET.

In the conventional EPROM cell 27, the tunnel oxide between the floating gate 70 and the transistor channel or pillar 40 is fairly thick, having a thickness of at least 150Å. Therefore charging of the floating gate 70 must be achieved by flowing a large drain current. This generates hot electrons which can tunnel through the tunnel oxide 60, often referred to as hot-electron injection or channel hot electron tunneling. However, channel hot electron tunneling is not suitable for DRAM or "Flash" memory applications, because channel hot electron tunneling requires high power. This is particularly a problem in the high density arrays necessary for Gbit memories. In addition, tunnel oxide degradation caused by hot electron tunneling is not tolerable for applications that require frequent read/write operations. If the tunnel oxide 60 is made thinner, e.g., ≦3 nm, direct tunneling between the channel 40 and floating gate 70 is possible. In contrast to hot electron tunneling, direct tunneling is faster resulting in faster write and erase times, requires much lower power, and minimizes tunnel oxide degradation.

However, because the sources 27 of all the MOSFETs are common, setting the bitline and wordline voltages appropriately to write a single cell 27 can still induce hot electron currents in neighboring cells along a wordline 20. This destroys any information in these cells and damages their tunnel oxides 60.

Hence, to make the conventional MOSFETs 15 useful for DRAM/Flash EEPROM applications, the cell must be modified to isolate the source regions 30 between adjacent bitlines 25. This allows use of direct tunneling read/write operations. Furthermore, to achieve the packing density necessary for Gbit memories, the overall cell area must not be increased by these modifications. The cell area must remain approximately 4F-square.

One method for achieving source isolation between bitlines 25 is to pattern isolation lines lithographically between the bitlines 25. Isolation is then be achieved by either a local oxidation of silicon (LOCOS), recessed-LOCOS, or conventional shallow trench techniques.

However, such an isolation method requires lithography. Therefore inter-device 20 lines must be increased from F to at least 2F to avoid shorting adjacent control gates, or wordlines 20 along the bitlines. This increases the inter-device spacing along the bitlines 25 from 1.2F to 2F. Thus, the overall cell size increases from $4F^2+0.4F$ to at least $6F^2$. Moreover, lithographic misalignments degrades device behavior. Hence, packing density and/or performance is sacrificed in this scheme.

To increase packing density, instead of forming the vertical MOSFET 15 having the pillar 40, an inverted transistor is formed in a trench etched into the substrate. Such transistor structures are shown in U.S. Pat. Nos. 5,386,132; 5,071,782; 5,146,426 and 4,774,556. The transistors formed in such trenches may be combined with additional planar devices, as discussed in U.S. Pat. Nos. 4,964,080; 5,078,498. Other memory cells have transistors with a floating body, as discussed in U.S. Pat. No. 5,382,540. Another conventional memory cell, disclosed in U.S. Pat. No. 5,017,977, does not have separated buried bitlines between transistors. Such conventional cells fail to achieve maximum packing density due to non-self-aligned isolation techniques, or require complex processing methods for fabrication, e.g., selective epitaxial growth, which methods are not suitable for large-scale production. Instead of using the vertical devices of the memory cell 27 as an EPROM, the vertical transistor 15 without a floating gate, in conjunction with a capacitor, can also be used for DRAM applications. FIG. 5 shows a schematic of a typical DRAM cell 100 having a field effect transistor (FET) 105 and a storage capacitor $C_s$. The gate of the FET 105 acts as the wordline W/L. A bitline B/L is connected to one terminal of the FET 105, which terminal is the source or drain of the DRAM, depending on application. The other DRAM terminal is connected to a storage node 110 of the storage capacitor $C_s$. The other terminal of the storage capacitor $C_s$ is referred to as a plate 115.

When the FET 105 is turned on by an appropriate signal on the wordline W/L, data is transferred between the bitline B/L and the storage node 110. The standard one transistor, one capacitor cell 100, shown in FIG. 5, has a theoretical minimum area of $8F^2$ for a folded bitline, or $4F^2$ for an open bitline architecture, shown in FIGS. 6 and 7, respectively.

FIG. 6 shows a top view of a conventional folded bitline DRAM cell 120 having active and passing bitlines B/L, B/L', respectively, and active and passing wordlines W/L, W/L', respectively. The word and bit lines each have a width F. The bit and word lines are separated from adjacent bit and word lines by a width F. Thus the area of the folded bitline DRAM cell 120 is $8F^2$.

FIG. 7 shows a top view of a conventional open bitline DRAM cell 150, having a bitline B/L and a wordline W/L, each having a length F and being separated from adjacent lines of adjacent cells (not shown) by a length F. Thus, the area of the open bitline DRAM cell 150 is $4F^2$.

Due to the need for contact and isolation spacing, in conventional designs that use planar transistors, it is only possible to obtain these minimum cell sizes by creating sub-lithographic features at some level. In addition, if a minimum cell size is to be obtained, it is necessary to reduce the length of the transistor 105 of FIG. 5 as much as possible (down to F). This reduces the gate length. However, shorter gate lengths result in higher leakage currents which cannot be tolerated. Therefore, the voltage on the bitline must be scaled down accordingly. This reduces the charges stored on the storage capacitor $C_s$, thus requiring a larger capacitance to ensure that the stored charge is sensed correctly, for example, to indicate logic 1 or 0.

Increasing the capacitance of the storage capacitor $C_s$ is achieved by either increasing the capacitor area, or decreasing the effective dielectric thickness located between the capacitor plates. Increasing the capacitor area is becoming more difficult to do without also increasing the cell size, and hence defeating the purpose of shortening the gate in the first place.

Further reducing the dielectric thickness is also difficult, since the thickness of many conventional dielectrics has already reached a minimum practical thickness. To further reduce the dielectric thickness, alternative dielectrics with higher dielectric constant have been explored. While such alternate dielectrics contribute to solving the problem of low charge storage resulting from the decreased bitline voltage, further bitline voltage reduction is limited by the maximum achievable dielectric constant. Accordingly, to further reduce the bitline voltage, an alternative to reducing the gate length of the transistor 105 is necessary.

In light of the foregoing, there is a need for high density memory cells having isolated sources between adjacent bitlines, yet continuous source regions for each individual bitline, to allow cell programming by direct electron tunneling, instead of programming by channel hot electron tunneling.

There is also a need for a memory cell having a proper gate length and capacitor, without increasing the lateral area of the cell.

SUMMARY OF THE INVENTION

The object of the present invention is to provide a memory cell array, and a method of making thereof, that eliminate the problems of conventional memory cell arrays.

Another object of the present invention is to provide a memory cell array, and a method of making thereof, that has two cells per each pillar of the array, thus increasing the array density.

Yet another object of the present invention is to provide a memory cell array, and a method of making thereof, that has isolated sources on adjacent bit lines of the array without increasing the cell area.

Another object of the present invention is to provide a memory cell array, and a method of making thereof, that has self-aligned isolation trenches between adjacent bit lines of the array.

A further object of the present invention is to provide a memory cell array that is programmed at high speed using direct tunneling, can withstand a high number of write/erase cycles, consumes low power, has reduced oxide degradation, operates at low voltages, and has a high retention time.

An additional object of the present invention is to provide a memory cell having a proper gate length and capacitor without increasing the cell lateral area.

A further object of the present invention is to provide a memory cell that prevents charge accumulation in the body of the cell.

Another object of the present invention is to provide a memory cell having a self aligned continuous source regions along bit lines of the cell array, without completely isolating the body of the cell from the underlying substrate.

A still further object of the present invention is to provide a memory cell having a proper gate length suitable for obtaining low leakage, without decreasing the bitline voltage or increasing the lateral area of the memory cell.

Another object of the present invention is to provide a memory cell having a stack or trench capacitor such that additional cell area is not consumed by the capacitor, the capacitor contacts, or by the transistor contacts.

These and other objects of the inventions are achieved by a semiconductor device and a method of making thereof. The semiconductor device may be a vertical semiconductor device, such as a MOSFET, which may have a floating gate. An array of these transistors is formed by an array of pillars arranged in rows and columns. The array includes rows of wordlines and columns of bitlines.

To increase array density, two transistors are fabricated on each semiconductor pillar etched from a single crystal substrate, which may be a single crystal substrate, for example. The gates of the two transistors are separated from each other by an isolation material, such as an oxide, located between pillars in the wordline direction.

The array of these pillars is formed with self-aligned isolation. The vertical device comprises a heavily-doped region on the top of the pillar, followed by a body region with the opposite doping type, then followed by the heavily-doped source region formed, for example, by implantation or by outdiffusion from either heavily-doped oxide, polysilicon, or other suitable material deposited between columns (i.e. bitlines) in the memory array. Depending on the amount of source outdiffusion from the material, the body of the pillar transistor may or may not maintain electrical contact with the underlying substrate.

The source outdiffusion material may or may not be removed subsequent to annealing. In the case of polysilicon, or other highly conductive source materials, this material may act as a buried "strap", reducing the resistance of the diffused source region.

The pillars are formed using a two-step etch process which etches column (bitline) and row (wordline) trenches in orthogonal directions. The source regions between columns (bitlines) are separated by etching column trenches, which are parallel to the bitlines and are deeper than the orthogonal row (wordline) trenches. The two step etch thus maintains the continuity of the buried diffused source regions, as well as any additional strapping material still in place, along the array columns for use as a buried bitlines for cell access.

The main body of each pillar is encircled by the gate stack which comprises a dielectric layer, (e.g., thermal grown silicon dioxide, referred to as a tunnel oxide), followed by a floating gate material capable of storing charge, (e.g., amorphous silicon, silicon-rich oxide, nano-crystals of silicon, geranium, or other material, nitride, a metal, etc.), followed by a second dielectric layer, (e.g., deposited silicon dioxide), referred to as a gate oxide. Next, a control gate made of polysilicon, for example, is formed around the gate oxide.

Such a memory device or cell may be used as an EEPROM or Flash Memory cell, usually used for non-volatile storage. The vertical memory cell according to the invention has higher speed and endurance than conventional floating gate transistors. In addition, the vertical memory cell may also be used as a DRAM type cell. That is, for DRAM applications, the vertical memory cell replaces a conventional transistor and capacitor combination cell. Thus, the vertical memory cell may be used for either EEPROM or DRAM applications.

The tunnel oxide and floating gate may be dispensed with to result in a gate stack that includes the gate oxide and the control gate. This results in a vertical transistor that may be used in conjunction with a capacitor to form a memory cell. The capacitor may be a stack or trench capacitor. Such a memory cell is used for DRAM applications, for example, where charges are stored on the capacitor. In this case, the vertical transistor acts as a switch or transfer device to access the charge for writing and reading operations.

The gate stack extends between the two heavily-doped regions at the top and base of each pillar. A conductive gate material, (e.g., in-situ, heavily doped polysilicon, with or without silicidation), is deposited on the array to connect pillars along each row, (i.e., wordline), of the array, orthogonal to the bitline direction. This polysilicon is the control gate.

The control gate or wordline around the pillars in the wordline direction (wordline pillars) is separated to form two wordlines or control gates. This is achieved by etching trenches in one direction (bitline trenches), and filling them with desired (e.g., insulating) material. Next, wordline trenches are ethced which are orthogonal to the bitline trenches, and polyisilcon is deposited on the wafer. An etching step disconnects the polysilicon at the top of the pillars and at the bottom of the wordline trenches. This results in two separate wordline control gates running on opposite sides of each pillar. This forms two transistors per pillar. In the case where floating gates are formed, etching between the pillars is performed to separate the floating gates. This results in two floating gates per pillar.

Having two transistors with floating gate for storage per pillar, increases the array density and forms cells having a size of $2F^2$, where F is the minimum attainable feature size using conventional lithography. In addition to having a pillar size of F by F, the pillars are separated from each other by a distance F. Additional spacing between wordlines are not needed.

For a DRAM cell, where the floating gate is dispensed with and a stack or trench capacitor is formed a true 4F-square cell is achieved, with reduced wordline capacitance and bitline resistance. If two stack or trench capacitors are formed above or around the bottom of each pillar, below the two transistors, then a $2F^2$ cell size is achieved.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which:

FIG. 5 shows a schematic of a conventional DRAM cell;

FIGS. 6 and 7 show top views of conventional folded and open bitline DRAM cells, respectively;

FIGS. 10 and 11 show cross sections of the memory cell of FIG. 9 along the wordline and bitline directions, respectively, according to the present invention;

FIGS. 17–26 show a method of forming the array shown in FIGS. 15–16 according to the present invention;

FIGS. 53–72 show a method of forming the array shown in FIG. 52 according to the present invention.

DETAILED DESCRIPTION OF THE INVENTION

$4F^2$ Memory Cell

Figure 1:
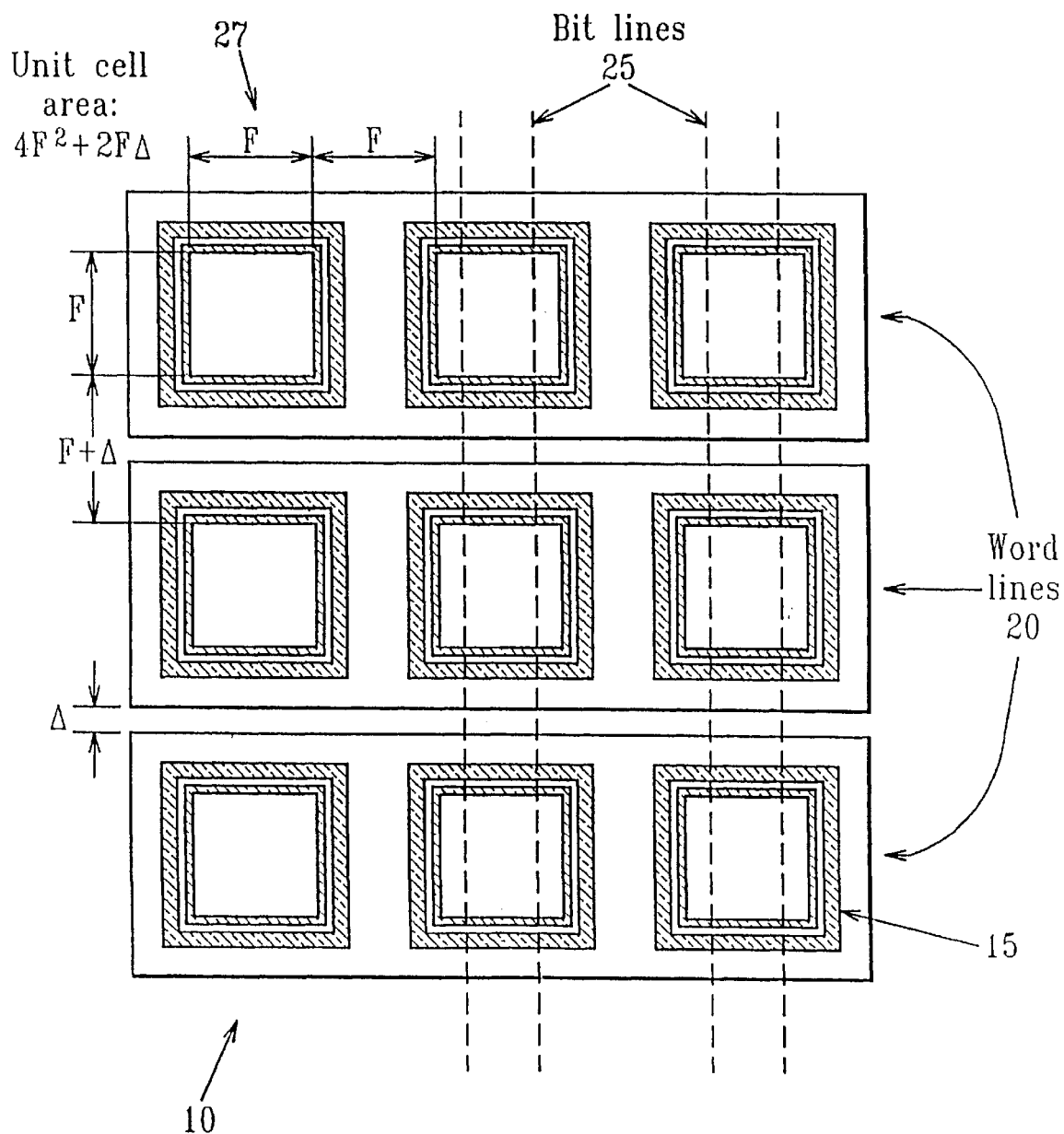
FIGS. 1–2 show top and perspective views of a conventional array of memory cells.
Figure 2:
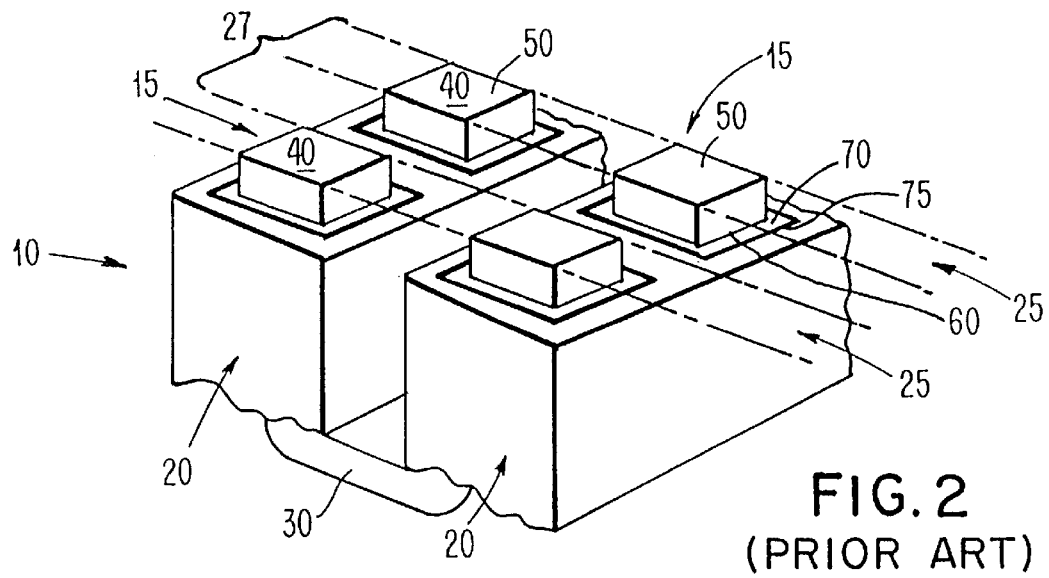
Figure 3:
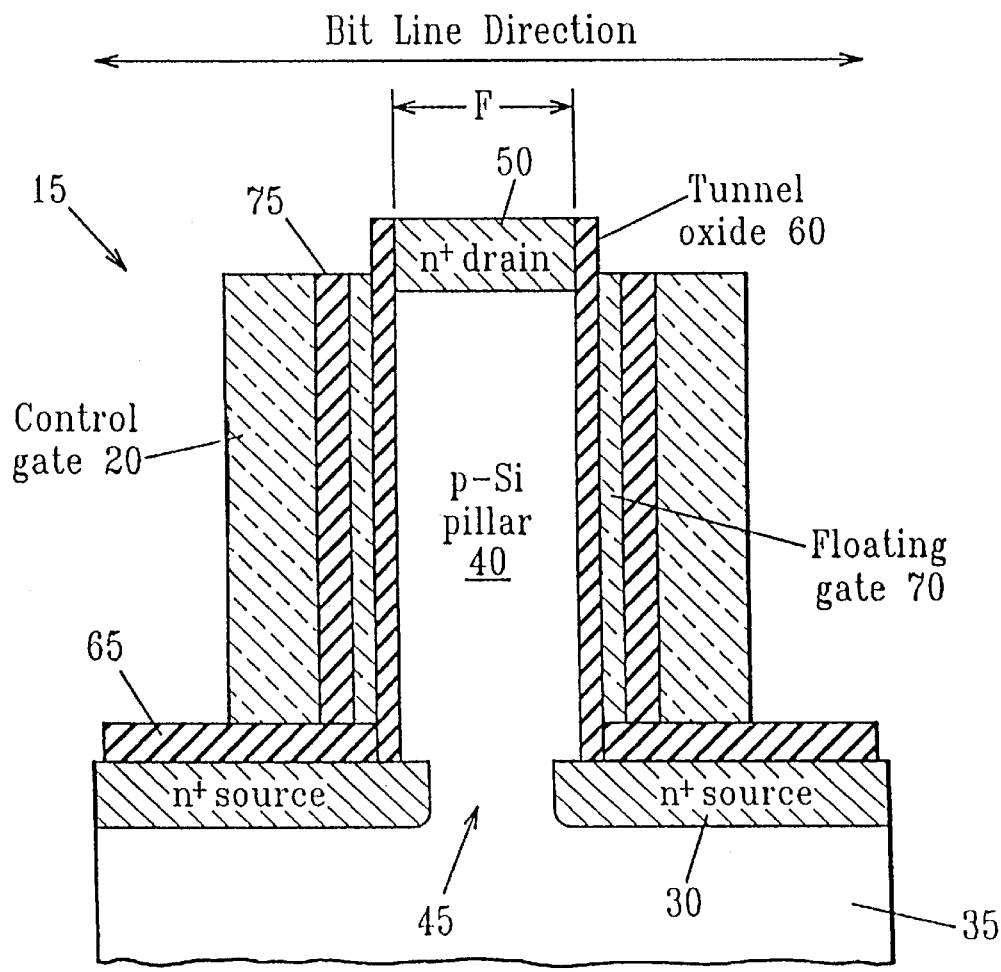
FIG. 3 shows a cross-sectional view of a one of the conventional memory cells shown in the array of FIGS. 1–2 along a bitline.
Figure 4:
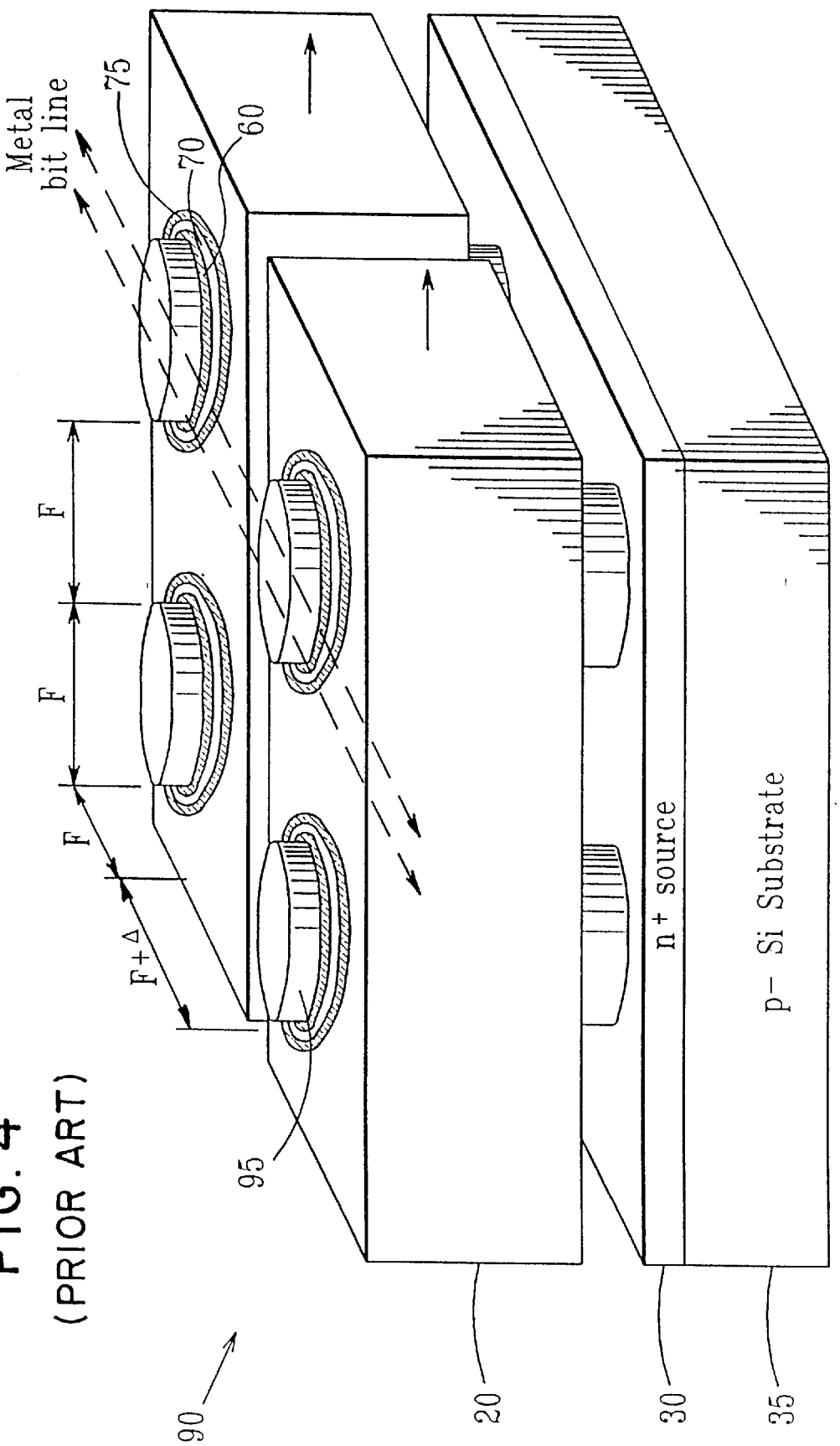
FIG. 4 shows a schematic of another conventional array of memory cells.
Figure 8:
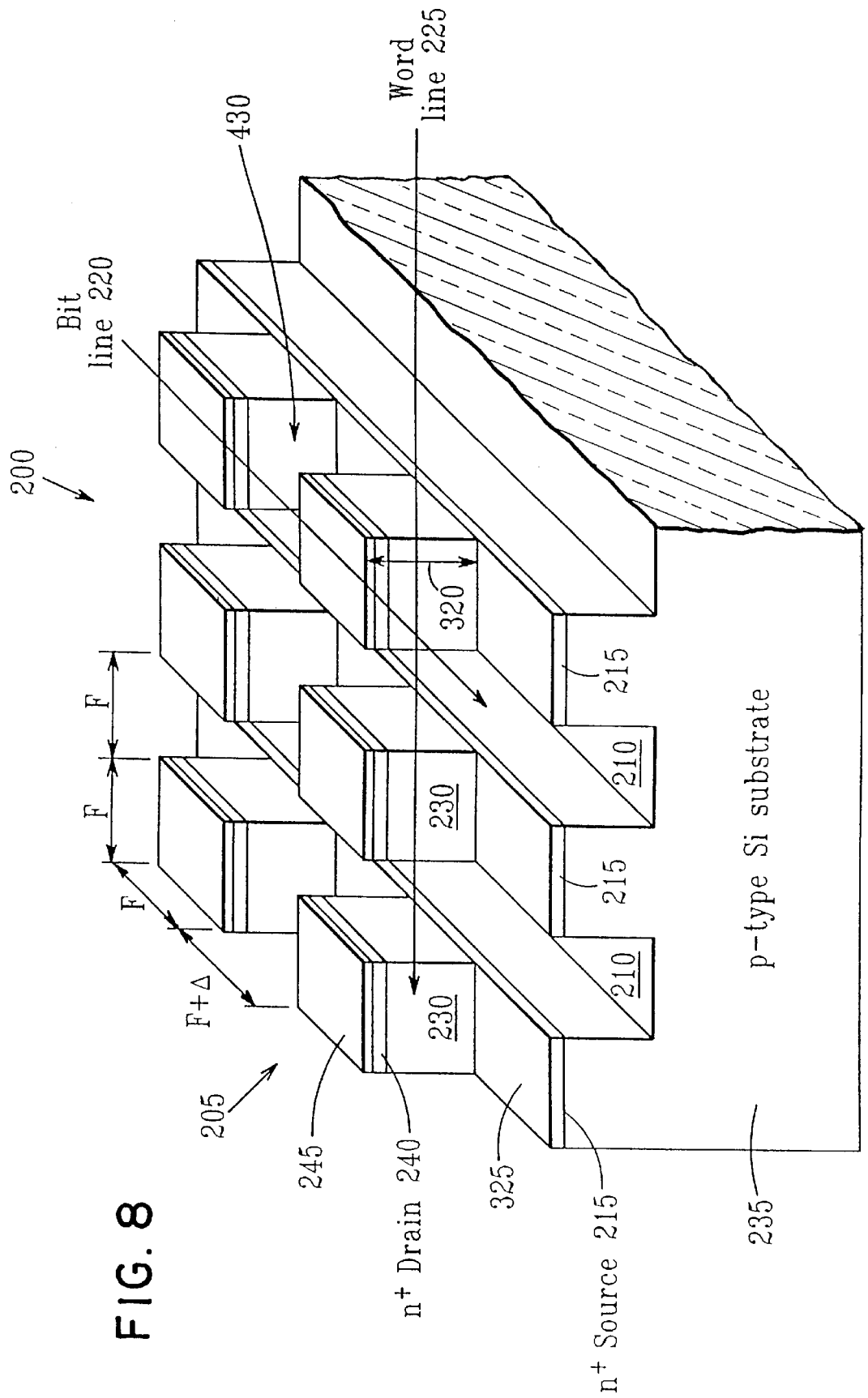
FIG. 8 shows an array of memory cells according to one embodiment of the present invention.

FIG. 8 shows an array 200 of memory cells 205 according to one embodiment of the present invention. Illustratively, the memory cell 205 is based on a MOSFET. The array 200 has self-aligned shallow trenches 210 that isolate and separate self-aligned sources 215 of different bitlines 220. The array 200, and a method of making thereof, circumvent the difficulties with lithographic source isolation without increasing cell area. The isolated trenches 210, which may be referred to as bitline trenches, are parallel to the bitlines 220, and orthogonal to the wordline 225.

The array structure 200 maintains a common source 215 along a given bitline 220, while having separate sources 215 on adjacent bitlines 220. The source 215 of each cell 205 is self-aligned. Therefore, additional masking steps are not necessary and there is no possibility of misalignment that degrades device behavior. Moreover, any planar support device along the edge of the array 200 can be isolated using the same shallow trench etch step, simplifying the overall process.

Each memory cell 205 is a vertical transistor having a pillar 230 extending upward above the substrate 235. The substrate is a single crystal semiconductor substrate, such as silicon (Si), which may be doped with P-type material, for example. Upper and lower regions of each pillar 230 are doped, e.g., with N-type material, to form drain and source regions 240, 215, respectively. The middle region of each pillar 230, between the drain 240 and source 215, is lightly doped, usually with P-type material, to act as the MOSFET channel between the N-type source and drain regions.

FIG. 8 also shows a top mask layer 245, such as an SiN layer 245 formed over the drain 240. The top mask layer 245 is used for forming the pillar 230. Each pillar 230 has a dimension of F by F along the wordline 225. Adjacent pillars are separated by a distant F along the wordline 225, and a distance F+Δ along the bitline 220, where Δ is approximately 0.2F.

Figure 9:
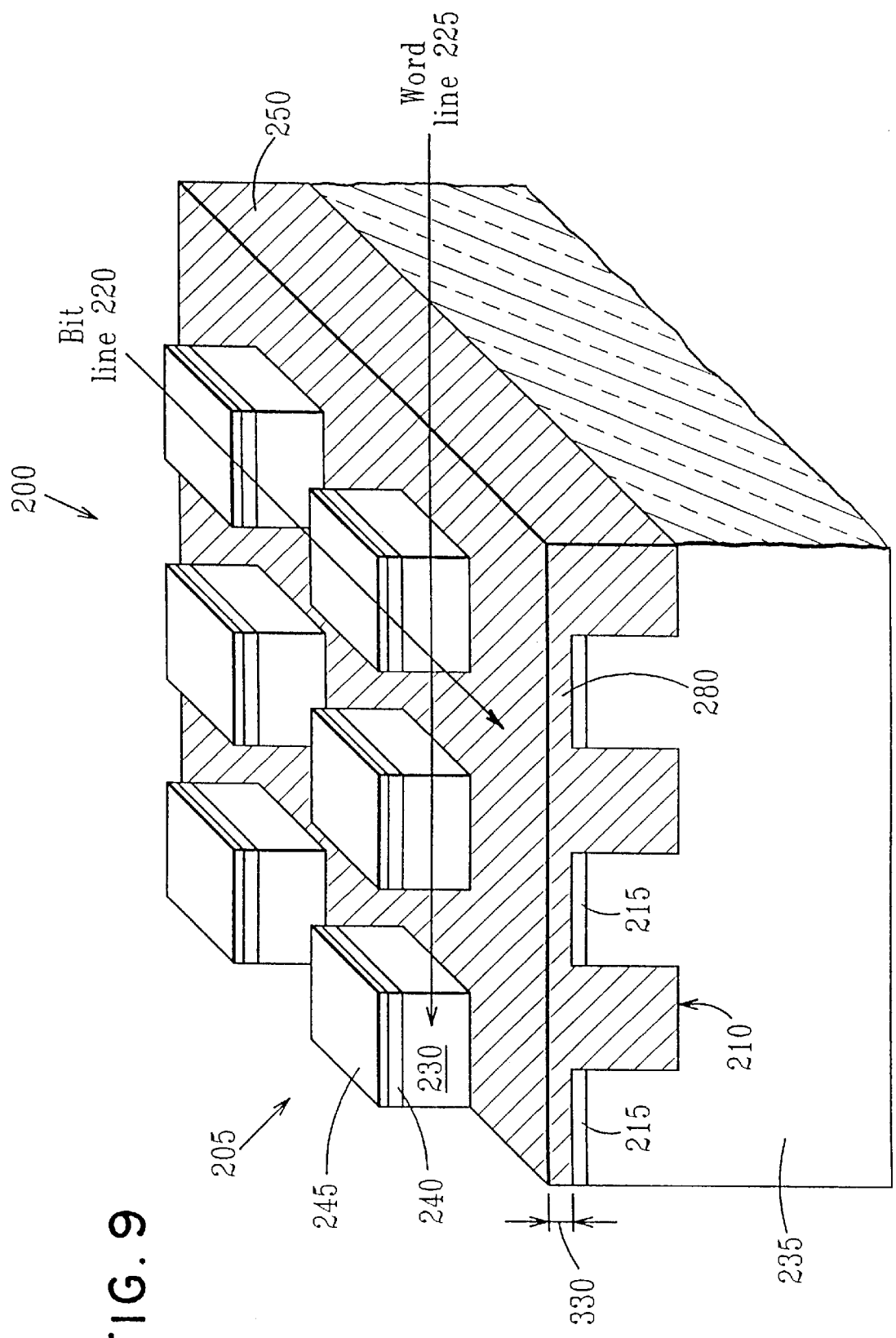
FIG. 9 shows the array of FIG. 8 after dielectric fill, chemical polish and etchback according to the present invention.

FIG. 9 shows the array 200 after dielectric fill 250, chemical polish and etchback. Illustratively, the dielectric 250 used to fill the trenches 210 is an oxide, such as oxides of silicon. The outer surface of each pillar 230 has a control gate 275, omitted from FIG. 9 for clarity and shown in FIG. 15. The control gate 275 acts as the wordline 225, shown in FIG. 9. The drains 240 act as the bitlines 220 and the sources 215 act as buried bitlines.

FIGS. 10 and 11 show cross sections of the memory cell 205 along the wordline and bitline directions 312, 314, respectively. As shown in FIG. 10, the source 215 is completely self-aligned and completely fills the region below the pillar 230. In addition, the source 215 is separated from sources of MOSFETs of different bitlines by the shallow trenches 210.

Since the source 215 is completely self-aligned below the device pillar, there is less source/gate overlap between bitlines 220 (FIG. 9). This reduces the overall capacitance of the array 200.

A gate region is formed on a sidewall of the pillar 230 over the pillar's middle region, which is between the source 215 and drain 240. The gate region controls the resistance between the source and drain regions 215, 240. The gate region may also be formed on at least one sidewall of the pillar 230 over the pillars middle region. Alternately, the gate region is a wrap-around gate formed on all the pillar sidewalls, over the pillar's middle region.

Illustratively, the gate region comprises a tunnel oxide 260 formed around the pillar 230, followed by a first gate electrode, which may be isolated on all sides to form a floating gate 265. The vertical MOSFET 205 with a floating gate may be used for memory applications. A gate oxide 270 separates the floating gate from a control gate 275. The control gate 275 acts as the wordline 225. Illustratively, the floating and control gates 265, 275 are polysilicon.

As shown in FIG. 11, the source 215 is continuous along a given bitline. The oxide 250 used to fill the trenches 210 (FIGS. 8–10), also forms the necessary spacer 280 between the poly gates 265, 275 and the source region 215 along the bitline direction 314 without any additional processing steps. In addition to preventing source/gate shorting, the spacer 280 also reduces the source/gate overlap capacitance.

Placing the source below the pillar 230 also produces a floating body MOSFET with a wrap-around gate. This is similar to the dual-gate MOSFET structure simulated by D. J. Frank, S. E. Laux, and M. V. Fischetti, "Monte Carlo simulation of a 30 nm dual gate MOSFET: How short can Si go?" Inter. Electron. Devices Meeting, 1992, p.553. In these simulations, it is shown that the dual-gate MOSFET offers greater scalability to short gate lengths than MOSFET designs. Devices with effective gate lengths as short as 30 nm were simulated and shown to have well-behaved characteristics. The improved gate control offered by a dual (or wrap-around) gate structure inhibits the onset of deleterious short-channel effects, including threshold roll-off and drain induced barrier lowering.

Figure 12:
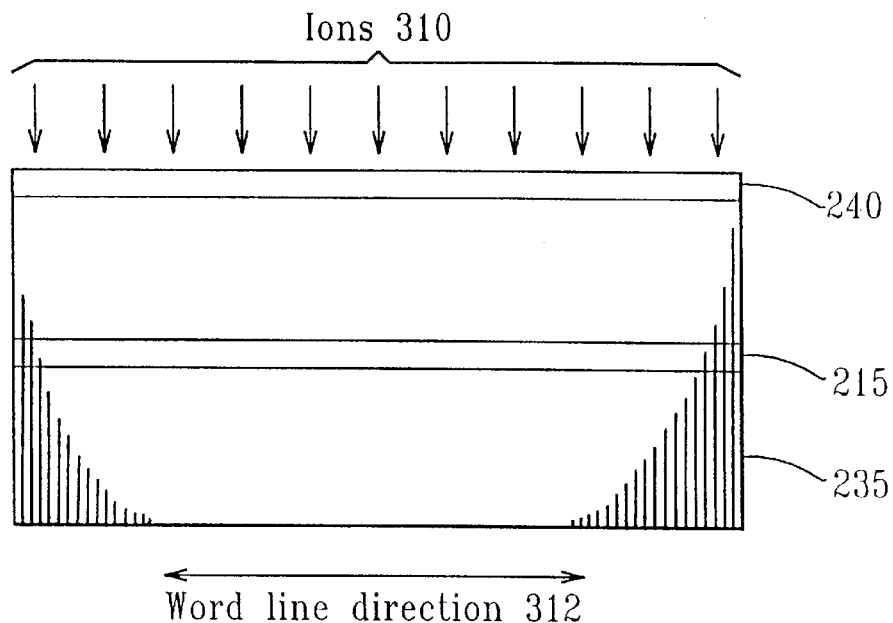
FIGS. 12–14 show a method of forming the array shown in FIG. 8 according to the present invention.

A method to form the array 200, with the self aligned trench isolation, comprises the following steps:

I. As shown in FIG. 12, which is a cross sectional view along the wordline direction 312, source and drain regions 215, 240 are formed by subjecting the substrate 235 to blanket implants of ions 310. Note, the source implant 215 is a deep implant at a depth of approximately 350 nm. If necessary, a photoresist mask is used during this step to protect the edge areas where planar support devices may be fabricated. Alternatively, epitaxial growth may be used to form the source and drain regions 215, 240.

Figure 13:
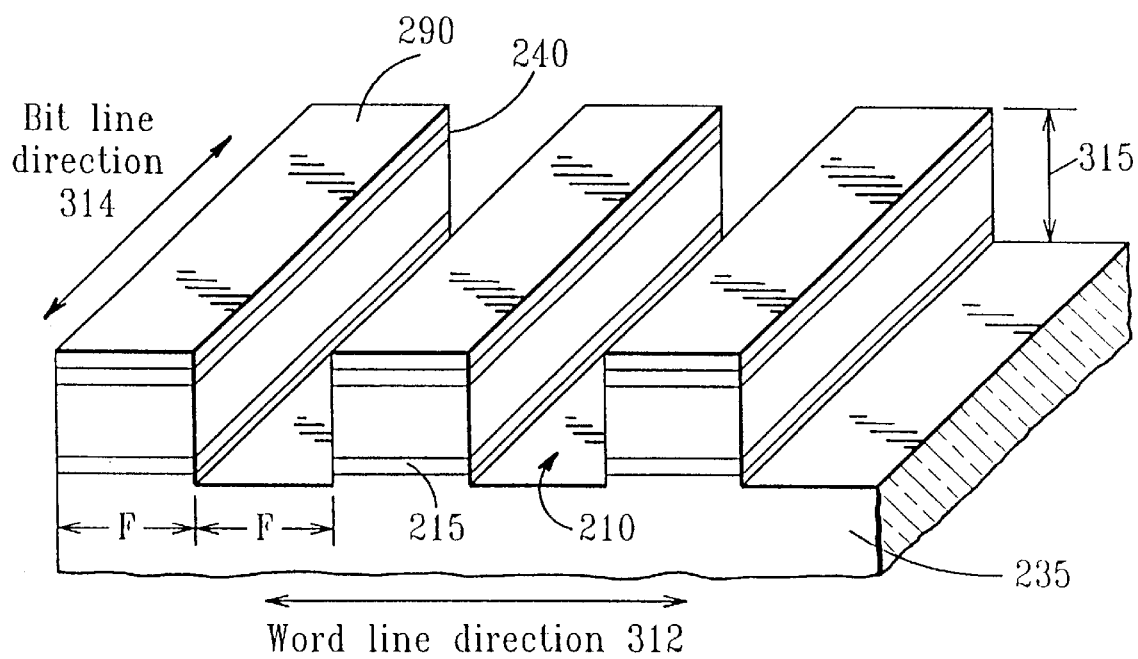

II. As shown in FIG. 13, a mask 290, such as a nitride mask, is deposited across the implanted wafer or substrate 235, and patterned in parallel lines across the array region in a direction parallel to the bitline direction 314. These nitride lines 290 have a width F, and are separated from each other by a spacing F. The nitride lines 290 define the pillars for the vertical MOS devices along the bitlines.

III. Shallow trenches 210 having a depth 315 of approximately 300 nm to 500 nm are formed by etching, e.g., reactive ion etching (RIE), the substrate 235 located between the nitride lines 290. The etch depth 315 is just greater than the total spread of the deep source implant 215, as this topography will be translated down in a subsequent etching step to separate the sources 215 between adjacent bitlines.

Figure 14:
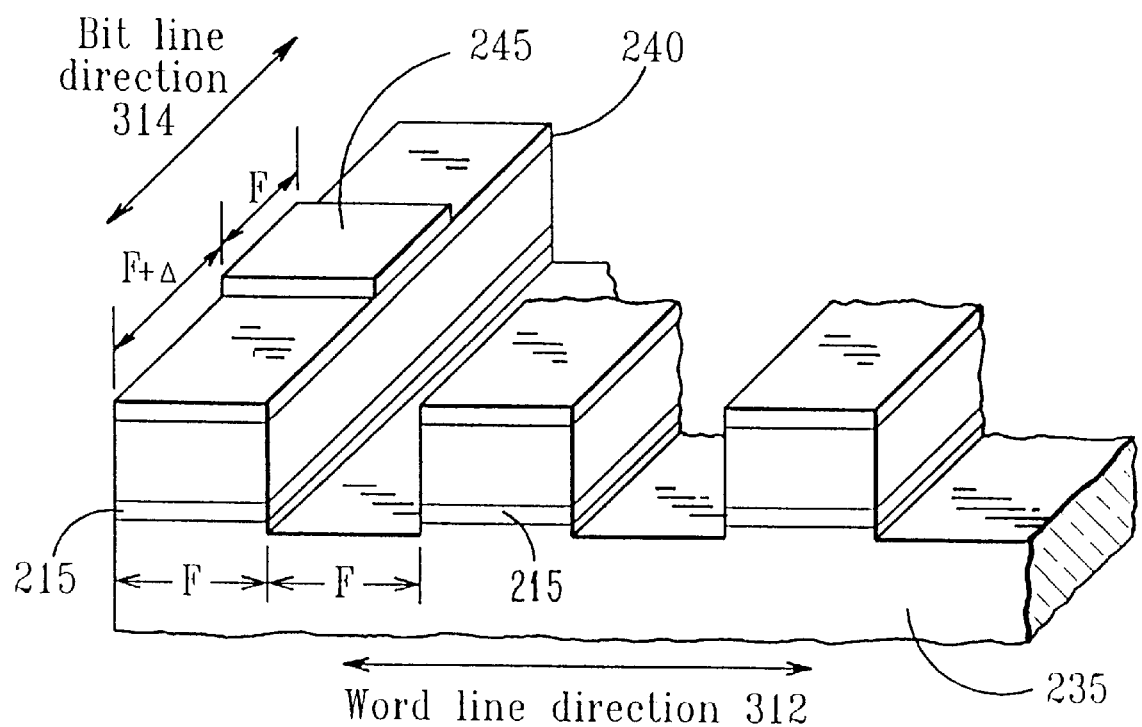

IV. As shown in FIG. 14, the nitride lines or strips 290 are patterned to form nitride regions 245 along the bitlines. Each nitride region 245 is square having an F by F dimension, and is separate by length F+Δ from adjacent nitride regions 245 along the bitline direction 314. For clarity, only one nitride region 245 is shown in FIG. 14. The spacing F+Δ between nitride regions 245 along the bitline direction 314 is larger than the spacing F along the wordline direction 312 to prevent the gates from shorting between wordlines. This is also shown in FIG. 8.

V. Returning to FIG. 8, another etching step in performed, e.g., RIE, to form the final pillar shape. The depth 320 of this etch, which is approximately 350 nm to 500 nm, is set to just reach the deep implanted source regions 215, on the plateaus 325 between pillars 230 along each bitline 220. This second etch translates the trenches 210, which are located between the bitlines 220, down to a total depth of about 700 nm to 1 μm. The deep bitline trenches 210 disconnect the sources 215 in the wordline direction 312.

This two step etch process of steps III and V forms square pillars, which are advantageous compared to circular pillars that may be formed by a single etch process. In addition, the two etch process allows the height of the pillars to vary on different sides due to the different depths of the column or bitline trenches 210, located between the bitlines 220, and the row or wordline trenches 430 located between the wordlines 225.

The two etch process maintains the continuity, along the array columns (or bitline direction), of the buried source regions 215, as well as the continuity of any additional strapping material 460 to be described in connection with FIG. 16. This allows use of the source regions 215 as buried bitlines for cell access.

Figure 20:
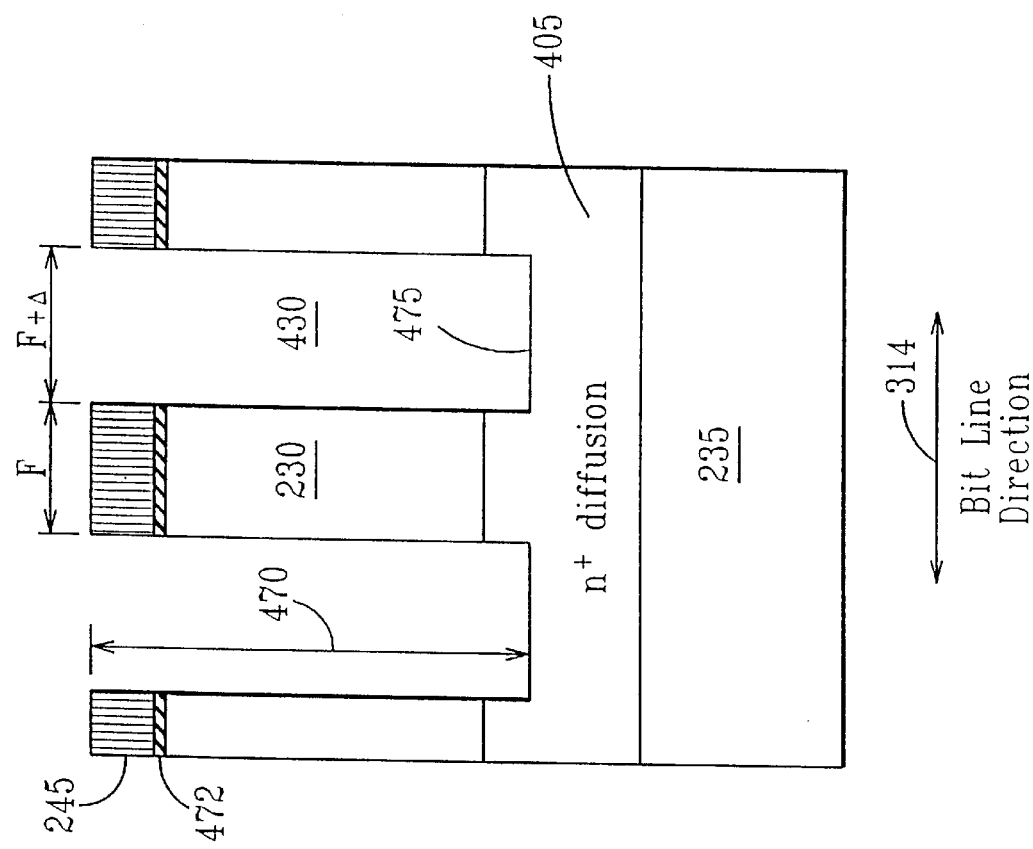

Since the source regions are implanted prior to formation of the pillars, the source regions occupy the entire footprint of the pillars. This isolates the pillar body from the underlying substrate 235 resulting in a floating body transistor. In other embodiments to be described hereinbelow, where the pillar body remains in contact with the underlying substrate 235, as shown in FIG. 20, the source regions 405 are formed by outdiffusion of dopants from a material 460 lining sidewall portions of the column trenches 210. Alternatively, the source regions 405 are formed after pillar formation.

VI. Returning to FIG. 9, all the trenches are filled with an insulating or dielectric material 250, such as an oxide for example. Next, the wafer is planarized to achieve a planar surface, using chemical polishing for example. At this point, the surface of the wafer comprises islands of nitride 245 on top of each pilar 230 surrounded by oxide 250.

VII. A final etch stop, e.g., RIE, is performed to expose the pillar walls prior to gate stack formation. Note, this step only etches oxide, not silicon. The etch is timed to stop approximately 30–40 nm above the Si plateau 325 (FIG. 8) between the pillars 230 along the bitlines 220. As shown in FIGS. 9–11, the oxide layer 250 acts as a spacer 280 having a thickness 330 of approximately 30–40 nm.

The spacer 280 separates the gates (both the floating and control gates 265, 275, shown in FIGS. 10–11) from the source implant 215. This prevents the gates 265, 275 from shorting to the source 215. The thickness 330 of this spacer 280 is chosen to minimize gate/source overlap capacitance, while not allowing any underlap to occur.

VIII. Any remaining oxide on the pillar sidewalls is removed, to result in the array 200 shown in FIG. 9. At this point, the pillars 230 and source/drain regions 215, 240 may be annealed, and a conventional floating gate process performed to finish the device. As described below, the final device cross sections are shown in FIGS. 10 and 11.

Next, a gate structure is formed around the pillars 230. Forming the gate structure includes the steps of forming a gate region on one sidewall, at least two sidewalls, or on all the sidewalls of the pillar, over the pillar's middle region, between the source and drain regions, 215, 240.

As shown in FIGS. 10–11, forming the gate region includes the steps of forming a tunnel oxide 260 over sidewall(s) of the pillar's middle region; forming a first gate 265 over the tunnel oxide, which first gate 265 may be insulated to form a floating gate; forming a gate oxide 270 over the floating gate 265; and forming a control gate 275 over the gate oxide 270. Illustratively, the tunnel and gate oxides 260, 270 are silicon dioxide which may be thermally grown; and the floating and control gates 265, 275 are conductive material, such as in-situ, heavily doped polysilicon, with or without silicidation.

FIGS. 25, 26 show cross-sections of a memory cell 400, such as a floating gate vertical MOSFET used as an EEPROM, along the word and bit line directions 312, 314, respectively, according to another embodiment of the present invention. The EEPROM 400 is similar to the EPROM 205 shown in FIGS. 10, 11 except the source 405 does not isolate the body of the pillar 230 from the underlying substrate 235. The body of the pillar 230 is the middle portion of the pillar 230, between the source and drain regions 405, 240. Continuity between the pillar body and underlying substrate prevents charge buildup in the pillar body. Of course, source outdiffusion may be continued until the source is formed completely below the pillar 230, separating the pillar body from the underlying substrate 235 to form a floating pillar body.

The source 405 is formed by outdiffusion from a source material 460. The source material 460 may be polysilicon or another highly conductive material, and acts as a buried strap to reduce the resistance of the diffused source region 405. Alternatively, the source material 460 may be heavily doped oxide, arsenic glass (ASG), or other suitable material, and may be removed after forming the source region 405.

Figure 15:
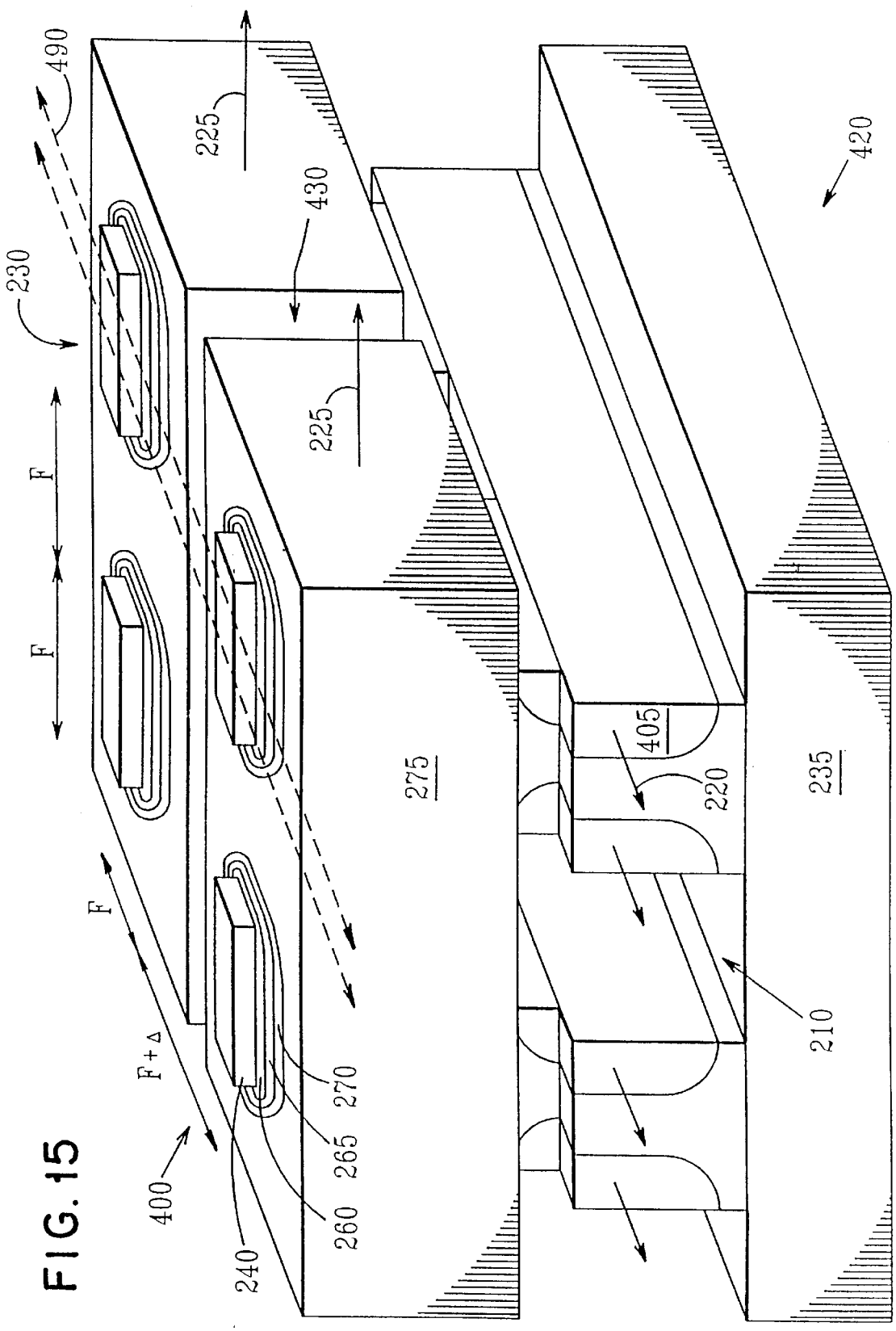
FIGS. 15–16 show an array of memory cells with and without strap lines according to another embodiment of the present invention.
Figure 16:
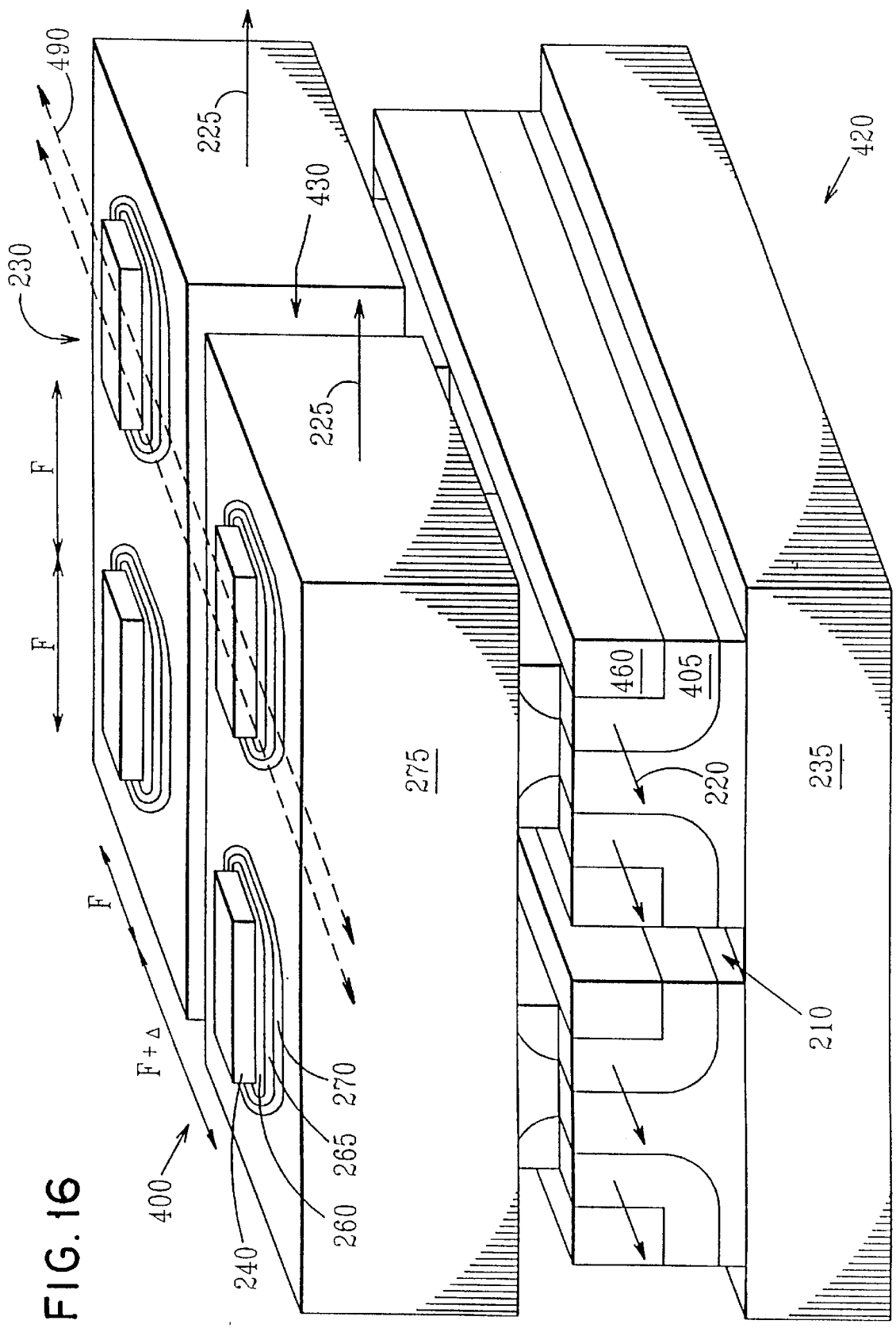

FIGS. 15–16 show an array 420 of vertical memory devices 400, such as floating-gate MOSFETs, formed by a self-aligned source diffusion and isolation process. The isolation oxide 250, shown in FIGS. 9 and 23, has been omitted from FIGS. 15–16 for clarity, but would normally fill the open area between all of the pillars and trenches.

FIG. 15 shows the array 420, where each array column or bitline 220 has a common self-aligned diffused source region 405. The buried bitlines 220 are formed solely by outdiffusion from a source material 460 (FIG. 16), which may be removed after forming the sources 405. FIG. 16 shows the source material buried "strap" 460, e.g., heavily doped polysilicon, which way be left in place after source outdiffusion to reduce the resistance of the buried bitlines 220 (or source 405).

In FIGS. 15 and 16, the square shape of the pillars 230 is due to the two-step etch process previously described. The body of the transistor pillars is still in contact with the substrate 235, since source outdiffusion 405 has been limited to prevent joinder of source regions 405 from opposite sides of each pillar 230. If a floating body transistor is desired, where the body of the pillar is isolated from the underlying substrate 235, annealing is performed for a longer time for further outdiffusion from the source material 460 (FIG. 16), so that the source regions 405 from opposite sides of the pillars meet. Alternatively, as describe in connection with FIG. 12, source implantation may be performed prior to array fabrication that forms the pillars.

Note, that while a floating pillar body is undesirable for many applications due to the accumulation of charge in the transistor, it has advantages such as decreased drain-induced barrier lowering (DIBL), which may offset the disadvantages in some applications.

In FIGS. 15–16, source diffusion regions 405 between neighboring bitlines 220 are isolated from each other by further etching to form deep trenches 210, which are between the bitlines 220 and referred to as bitline or column trenches. The column trenches 210 are etched deeper than trenches 430 located between the wordlines 225, which trenches are referred to as wordline or row trenches 430. If desired, a common source (i.e., a source common to all the word and bitlines), may be achieved by etching both trenches 210, 430 to the same depth prior to source formation.

Figure 23:
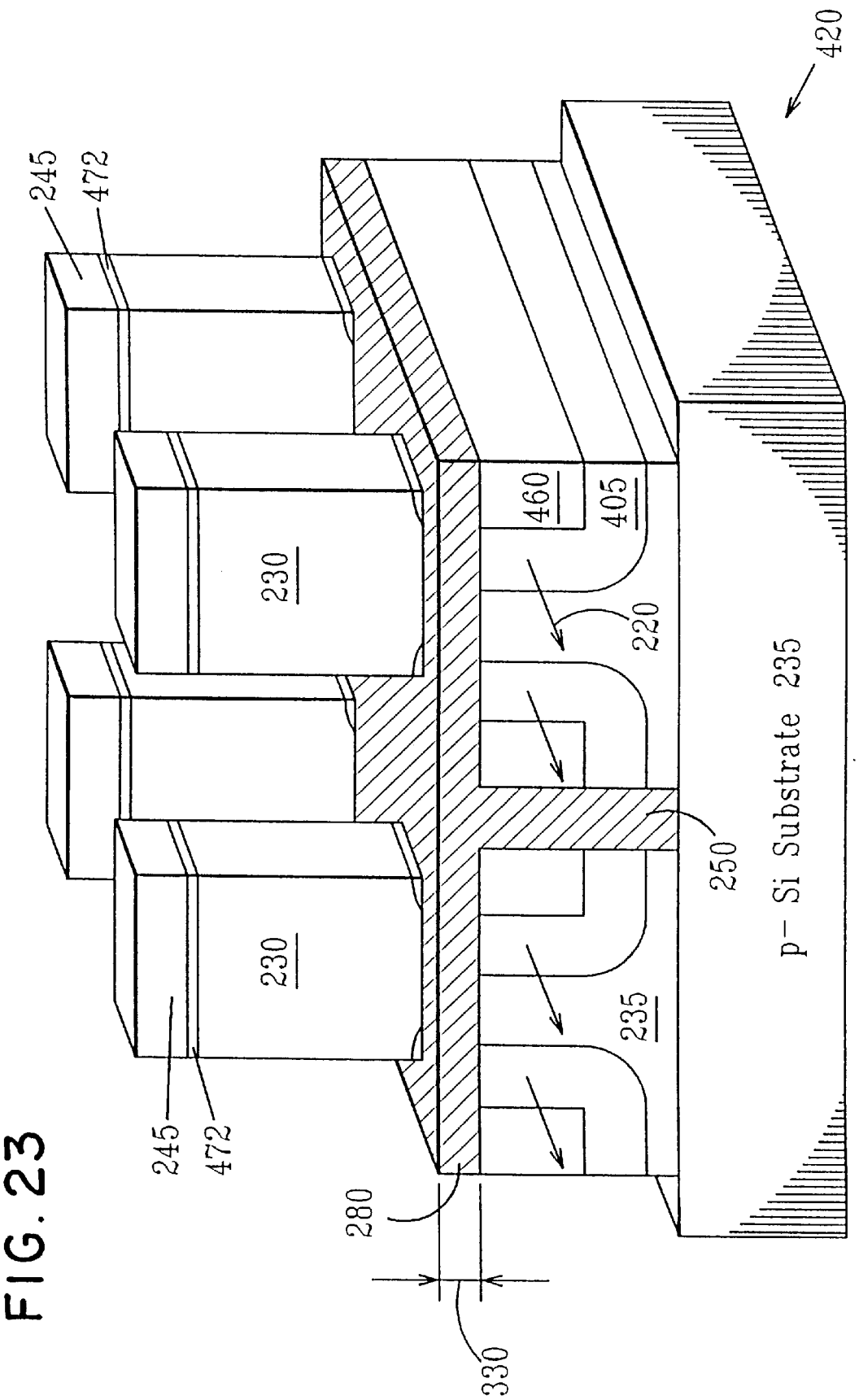

Similar to FIGS. 9–11, an insulator 250 is deposited and etched to form a spacer 280 that separates the buried bitlines 220 from the wordline 225. The spacer 280 is shown in FIG. 23. As described earlier, a drain 240 is formed on top of each pillar 230. In addition, as described in connection with FIGS. 10–11, a gate structure is formed around each pillar 230, where the control gate 275 acts as the wordline 225. The gate structure may include a tunnel oxide 260, a floating gate 265, a gate oxide 270 and the control gate 275.

As described earlier in connection with FIG. 8, no lithography is necessary to separate adjacent array rows or wordlines 225. This is because the spacing F+Δ between wordlines 225, is greater than the spacing F between array columns or bitlines 220.

Figure 18:
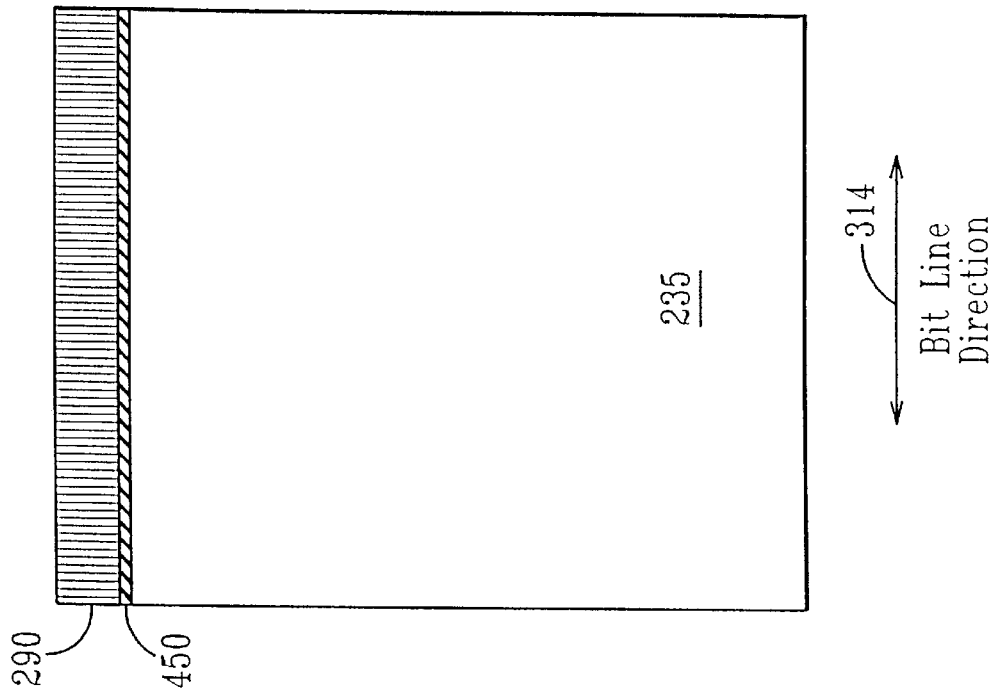
Figure 17:
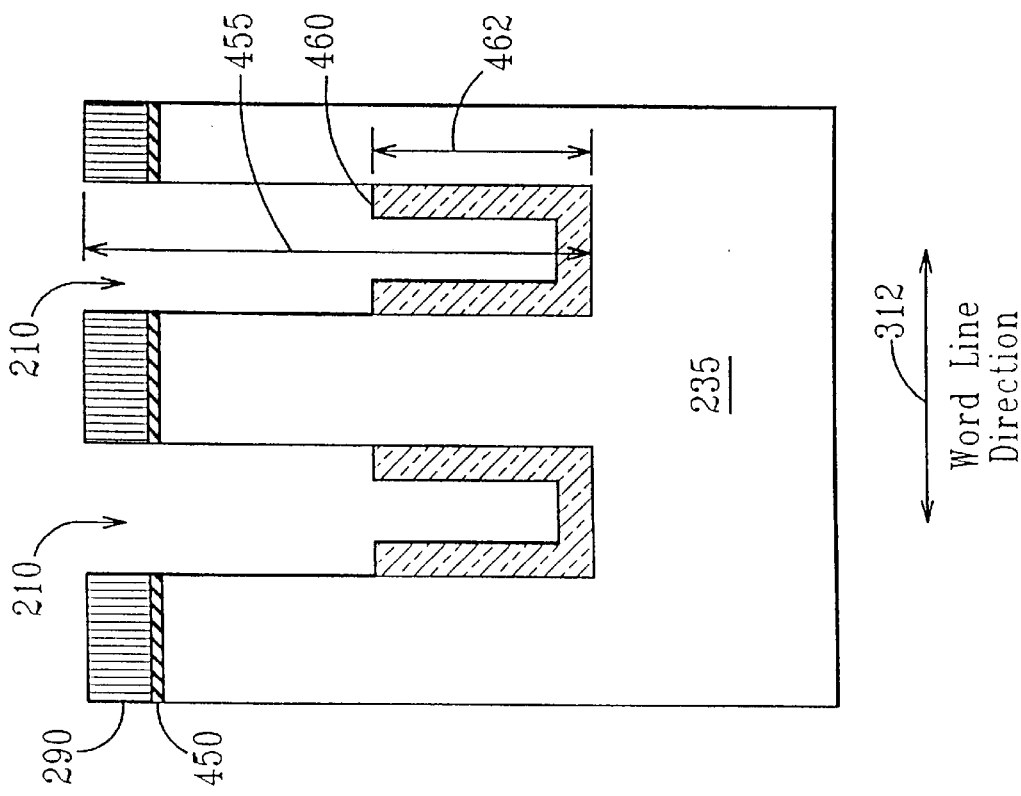

The process steps that form the array 420 of FIGS. 15–16 are similar to those described in connection with the array 200 of FIGS. 8–9. These process steps include the following steps:

(a) As shown in FIG. 13 and described in Step II of the previous process, nitride 290 is deposited on the substrate 235 and patterned to form parallel lines along the bitlines. The nitride strips 290 each have a width F, and are separated from each other by a distance F. As shown in FIGS. 17–18, a thin pad oxide layer 450 may be formed on the substrate 235 prior to forming the nitride layer 290. Illustratively, the nitride layer has a thickness of approximately 500 nm, and the pad oxide layer 450 has a thickness of approximately 25 nm.

(b) Similar to Step III of the prior process, the exposed substrate 235 located between the nitride strips 290 is etched, e.g., using RIE, to form shallow bitline trenches 210 between the nitride lines 290. This is shown in FIGS. 13 and 17. The etch depth 455 is deep enough to contain the expected drain implantation depth, the desired gate length, and the buried bitline diffusion depth. Illustratively, the depth 455 of the trench 210 is approximately 700 nm.

(c) As shown in FIG. 17, source outdiffusion material 460 is deposited on the wafer, lining the sidewalls of the trenches 210. FIGS. 17–18 are the cross-sections along the wordline and bitline directions 312, 314, respectively, of a structure similar to that shown in FIG. 13, after forming and recessing the source outdiffusion material 460 in the shallow bitline trenches 210. FIGS. 17–18 also show the pad oxide and nitride layers 450, 290 that are formed over the substrate 235.

For the illustrative example where the substrate is P-type, the source and drain are doped with N-type material. Illustratively, the source outdiffusion material 460 is arsenic glass (ASG) in the case where the source outdiffusion material 460 is removed after the outdiffusion that forms the source.

In the case where the source outdiffusion material 460 is not removed and left to act as a buried strap line, the source outdiffusion material 460 is heavily doped N-type polysilicon, for example. This poly layer 460 is then etched back to recess it into the trenches 210, leaving sidewall formations having a height 462 that extend approximately 250 nm up the sidewalls of the trenches. If this etchback is done by using photoresist to protect the remaining polysilicon from etch damage, some poly is also left on the bottom of each trench 210.

(d) After the polysilicon 460 etchback, the wafers may be annealed to begin outdiffusing the source regions. Note, this is necessary if the polysilicon 460 or other source material will be removed prior to source isolation. However, annealing is not necessary if the polysilicon 460 is left in place, since subsequent hot processes cause the outdiffusions. The outdiffused source regions 405 are shown in the top array view of FIG. 19, and the cross-sectional view along the wordline direction 312 of FIG. 20.

Figure 19:
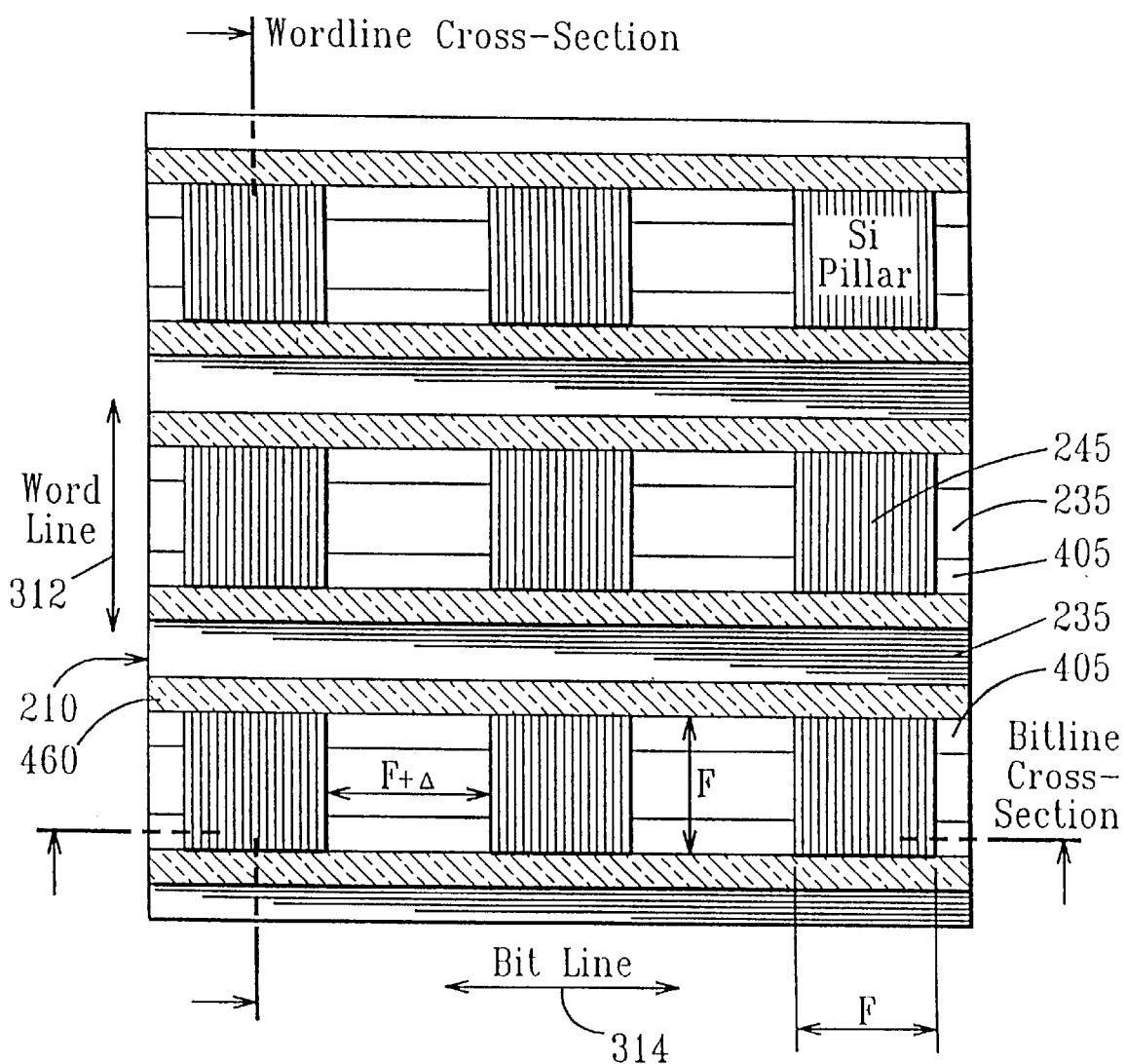

(e) As shown in FIG. 19, pillar definition is completed and wordlines formed by patterning the nitride lines 290 to form nitride islands 245, which are formed using mask lines having a width F that are perpendicular to the trenches 210. This results in square nitride islands 245 having a dimension of F by F. Note, the inter wordline spacing is F+Δ, where Δ is on the order of approximately of 0.2F. The additional spacing Δ keeps the gates from shorting between wordlines without further lithography.

Figure 21:
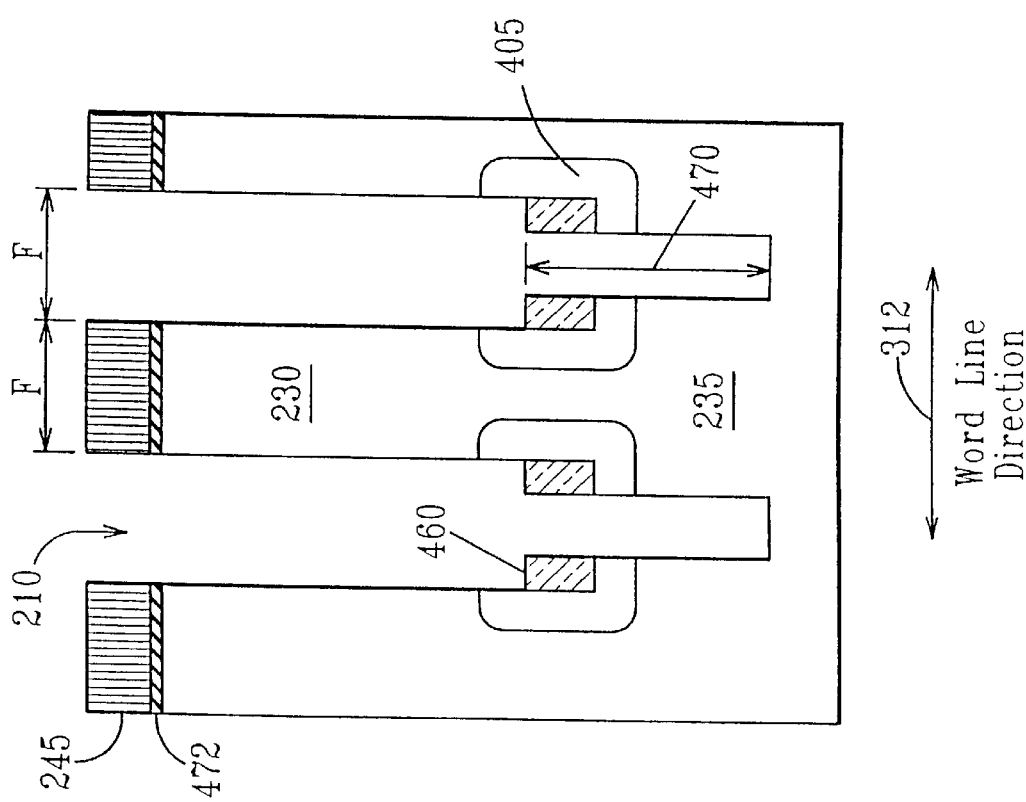

(f) As shown in FIGS. 19–22, a second RIE step is performed to etch the final pillar shape, using the square nitride islands 245 as a mask. The depth 470 of this etch, shown in FIGS. 20–21, is set to just reach the diffused source regions on the plateaus 475 (FIG. 21) between pillars 230 along each bitline. Illustratively, the depth 470 of this etch is approximately 600 nm.

As shown in FIG. 20, this etch forms pad oxide and nitride islands 472, 245 from the pad oxide and nitride strips 450, 290 (FIGS. 17–18). In addition, the etch further recesses the polysilicon 460 and remove polysilicon 460 from the bottom of the bitline trenches 210. The depth of the bitline trenches 210 increases by the additional depth 470 resulting from this second etching step. This disconnects the sources 405 between bitlines (along the wordline direction 312).

Figure 22:
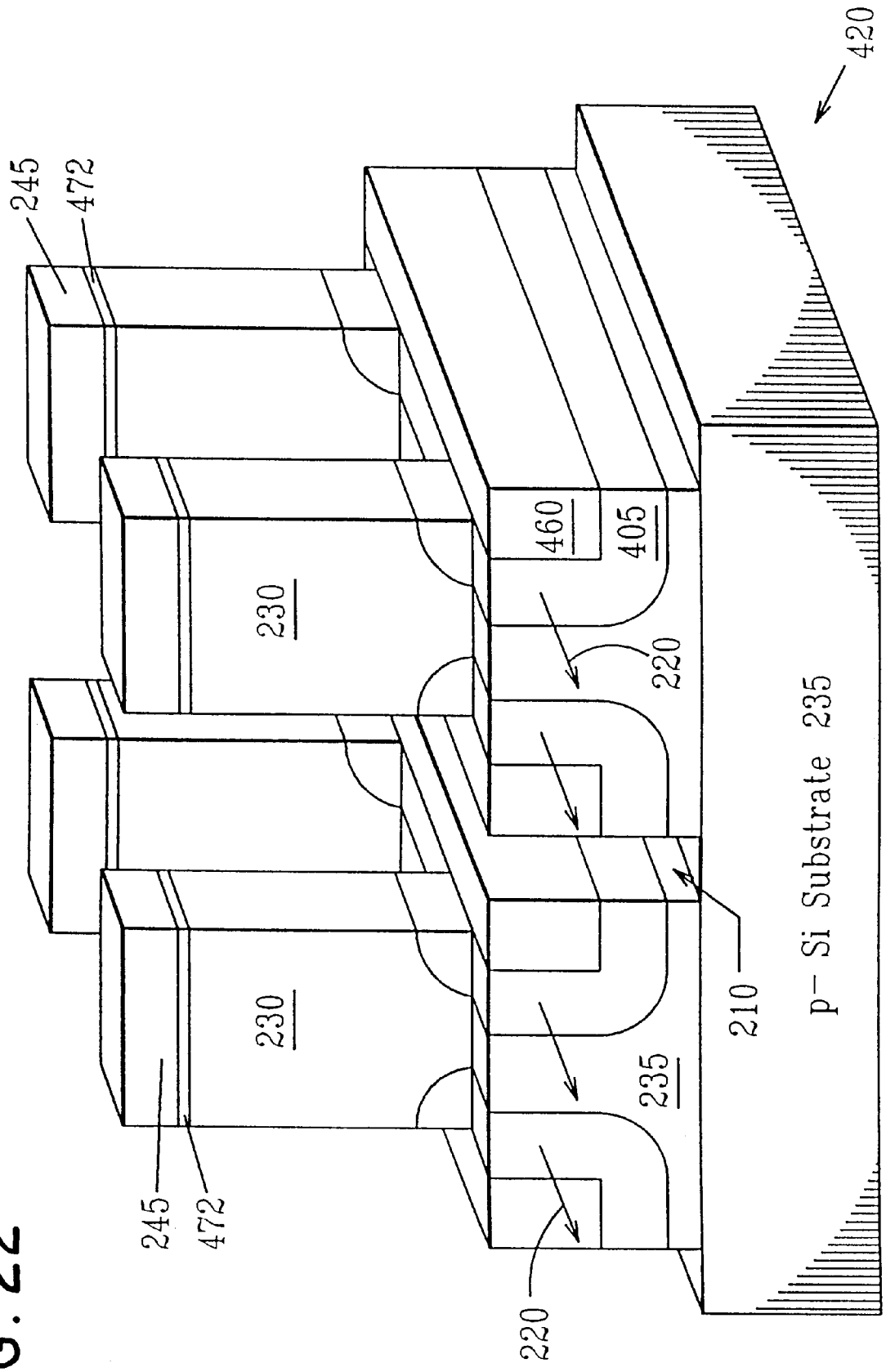

The two etch steps (b) and (f), form pillars that have square edges, as opposed to more rounded edges formed by a single etch pillar forming step. In addition, the two etch pillar forming process allows different heights for adjacent pillar sidewalls due to the different depths of the orthogonal trenches 210, 430 (FIG. 15). FIG. 22 shows a three dimensional view of the array 420 at this stage of processing, associated with FIGS. 20, 21.

(g) Referring to FIG. 23, all the trenches are filled with oxide 250, or other suitable isolation material, and the wafer is chem-polished back to achieve a planar surface. At this point, the surface of the wafer comprises islands of nitride 245 on top of each pillar surrounded by oxide 250.

(h) As shown in FIG. 23, another RIE is performed to expose the pillar walls prior to gate stack formation. Note, this step only etches oxide, not silicon. The etch is timed to stop at a desired distance 330 above the Si plateau located between the pillars along the bitlines 220. The oxide layer 250 acts as a spacer 280 to separate the poly gates or wordlines, which are formed subsequently, from the source regions 405. This prevents the gates from shorting to the sources 405.

The thickness 330 of this layer is chosen to minimize gate/source overlap capacitance, while not allowing any underlap to occur, and is determined by the amount of source outdiffusion in a given device design. Illustratively, the thickness 330 is approximately 30–40 nm. Steps (e)–(h) are similar to steps IV–VII of the process described in connection with FIGS. 8, 9, 14.

As described earlier beginning with step VIII, the gate stack is formed after removal of any remaining oxides on the pillar sidewalls. In particular, the following steps form the gate stack and complete the formation of the array 420 shown in FIGS. 15 and 16.

Figure 24:
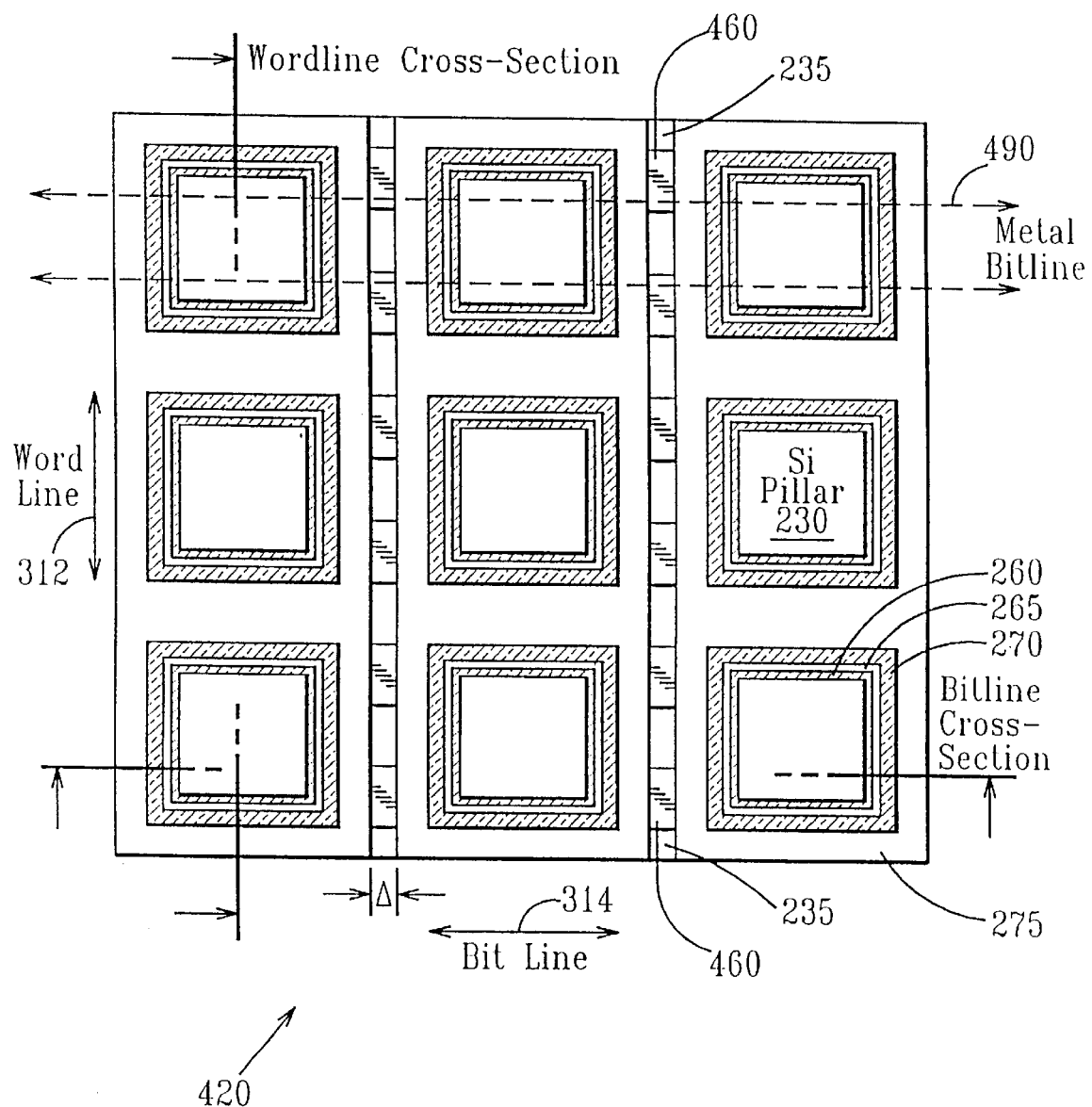

(I) As shown in FIGS. 24–26, the gate stack is formed on the exposed pillars, above the isolation oxide 250. An initial dielectric layer 260, e.g., thermally grown silicon dioxide, referred to as the tunnel oxide is grown, followed by formation of the floating gate material 265, which is capable of storing charges. Illustratively, the floating gate material 265 is amorphous silicon, silicon rich oxide, nano crystals of silicon, germanium, nitride, metal or other suitable material. For isolation, the floating gate 265 may be RIE etched into a sidewall formation around each pillar prior to deposition of a second dielectric layer. Illustratively, the second dielectric layer is a deposited silicon dioxide, referred to as the control or gate oxide 270.

(j) Next, the control gate 275 is formed using a conductive gate material, e.g., in-situ heavily doped N-type polysilicon, with or without silicidation. The conductive gate material is deposited with a thickness of just over 0.5F, minus the thickness of the previously deposited floating gate stack layers 260, 265, 270. This ensures that the polysilicon control gates 275 are shorted between devices along a wordline (to form a continuous electrical connection), while allowing them to be separated along a bitline.

Due to the additional width Δ of the wordline trenches, having a width of F+Δ between pillars along the bitline direction, a width Δ of the polysilicon (poly) 275 formed at the bottom of the wordline trenches remains exposed. This is because the approximately 0.5F thick poly 275 formed on the wordline trench sidewall remain separated by the distance Δ.

Etching a thickness of 0.5F of the poly 275, removes the 0.5F thick poly 275 from the top of the pillars. In addition, this etching removes the Δ wide exposed poly at the bottom of the wordline trenches. The removed poly at the bottom of the wordline trench is shown in FIG. 26 as region 277 having dashed lines. Thus, the bottom connection of adjacent wordlines is removed, resulting in isolated adjacent wordlines.

Due to the additional spacing Δ, adjacent wordlines 275 are separated or isolated from each other by this RIE step without requiring lithography.

FIG. 24 shows a top view of the array 420. Between the polysilicon control gates 275 that form the wordlines, which are separated by distance Δ, alternating strap and substrate regions 460, 235 are shown. In FIG. 24, the oxide layer 250, or spacer 280 (shown in FIG. 23), is omitted for clarity, which layer/spacer normally covers the alternating strap and substrate regions 460, 235 located between the wordlines or control gates 275.

(k) As shown in FIGS. 25, 26 all layers of the gate stack are then RIE etched. This separates or isolates adjacent wordlines by distance Δ (FIG. 26). If the pillars are equi-spaced in both directions, an additional mask is used to separate the control gate material 275 in the desired directions.

(l) As shown in FIGS. 24–26, to complete the device fabrication, the nitride islands 245 (FIG. 23), located on top of the pillars 230, are removed and drain implant 240 is performed. In FIG. 24, the dotted lines 490, which are parallel to the source or buried diffused bitlines 405, represent metal bitlines formed during back-end-of-line processing for connecting the tops of the pillars 230. The metal bitlines 490 are also shown in FIGS. 15, 16.

The source isolation and general memory cell structure discussed above are applicable for both volatile and non-volatile memory devices. The structure of the floating gate stack largely determines the memory device function. In addition, a large number of different gate structures can easily be integrated with the basic vertical cell for many different uses.

The memory cells described above having continuous-film floating gates 265, e.g. amorphous Si, with thin tunnel oxides 260 allow faster write/erase times, but with shorter retention times. Such memory cells are useful for volatile memory applications. The thin tunnel oxide 260 allows direct tunneling of electrons there through.

Increasing the thickness of the tunnel oxides 260 increases the retention time, but at the cost of higher power consumption and/or slower write/erase times, and a decrease in cyclability. Such memory cells are useful for non-volatile, read-only memory. The retention time can also be increased, even with thin tunnel oxides 260, by forming a discontinuous floating gate film, e.g., silicon nano-crystals embedded in the gate oxide 270. In this case, low power consumption and high cyclability are maintained, with an increase in the erase time. Such cells are useful for non-volatile memories that require frequent re-writing.

The relative thickness of the tunnel and gate oxides 160, 270 may be changed. For example, the tunnel oxide 260 may be made thicker than the gate oxide 270. This would allow tunneling for write/erase operations to occur between the floating gate and the control gate, rather than between the floating gate and the semiconductor pillar. Alternatively, both oxides 260, 270 may have similar thicknesses.

The above described memory devices, such as the cells formed with the described source diffusion and self-aligned isolation techniques, enable very dense packing of the vertical floating-gate MOS devices in a square array suitable for Gbit memory applications. Cell (or source) isolation between adjacent bitlines is achieved with the two-step, self-aligned isolation process described above.

In contrast to conventional vertical memories and method of forming thereof, the inventive method isolates the source regions between bitlines without increasing the cell size. This results in an array having isolated 4F-square cells. Isolating the source regions enables individual cells to be addressed and written via direct tunneling.

The additional flexibility allowed by isolating the source regions enables the cells to be used not only as typical non-volatile memory devices (EPROM, EEPROM, or Flash EEPROM), but also in volatile (DRAM) applications. In addition, by controlling the source diffusion depth, it is possible to fabricate either a floating body vertical transistor on each pillar, or to maintain contact between the transistor body and the substrate. Moreover, the self-aligned nature of the inventive method results in a robust, simplified process flow for a wrap-around gate vertical MOSFET, and relatively easy integration with planar support devices. The inventive memory device has superior resistance to short-channel effects down to gate lengths of 30 nm.

Conventional isolation techniques which rely on lithographic alignments result in a larger memory cell size. However, the inventive memory devices and processes nearly maintain the $4F^2$ cell size, thus achieving the highest density memory cells possible using lithography. Complex sub-lithographic steps are avoided. The inventive memory device and self-aligned isolation technique are also used in any application that requires large arrays of vertical devices, particularly if the sources of the devices are common along each row or column.

Note, that in order to contact the gates, drains, or even sources of devices individually for special applications, it may be necessary to increase the inter-device spacing in one direction or the other. However, at least a commensurate increase in size also occurs with conventional cells due to contact formation. Since the inventive cells and methods of forming thereof do not require additional space or alignment for the individual contacts, the resulting cell always consumes the minimum possible area, thus allowing for maximum packing density.

In addition to the advantages in packing density, the inventive process also provides a simple method of fabricating a vertical MOSFET having a floating-body and a wrap around gate. Since these devices are suitable for scaling down to very short channel lengths, the inventive memory cell design and process is useful for high performance MOS applications.

Memory Device with Stack Capacitor

Figure 27:
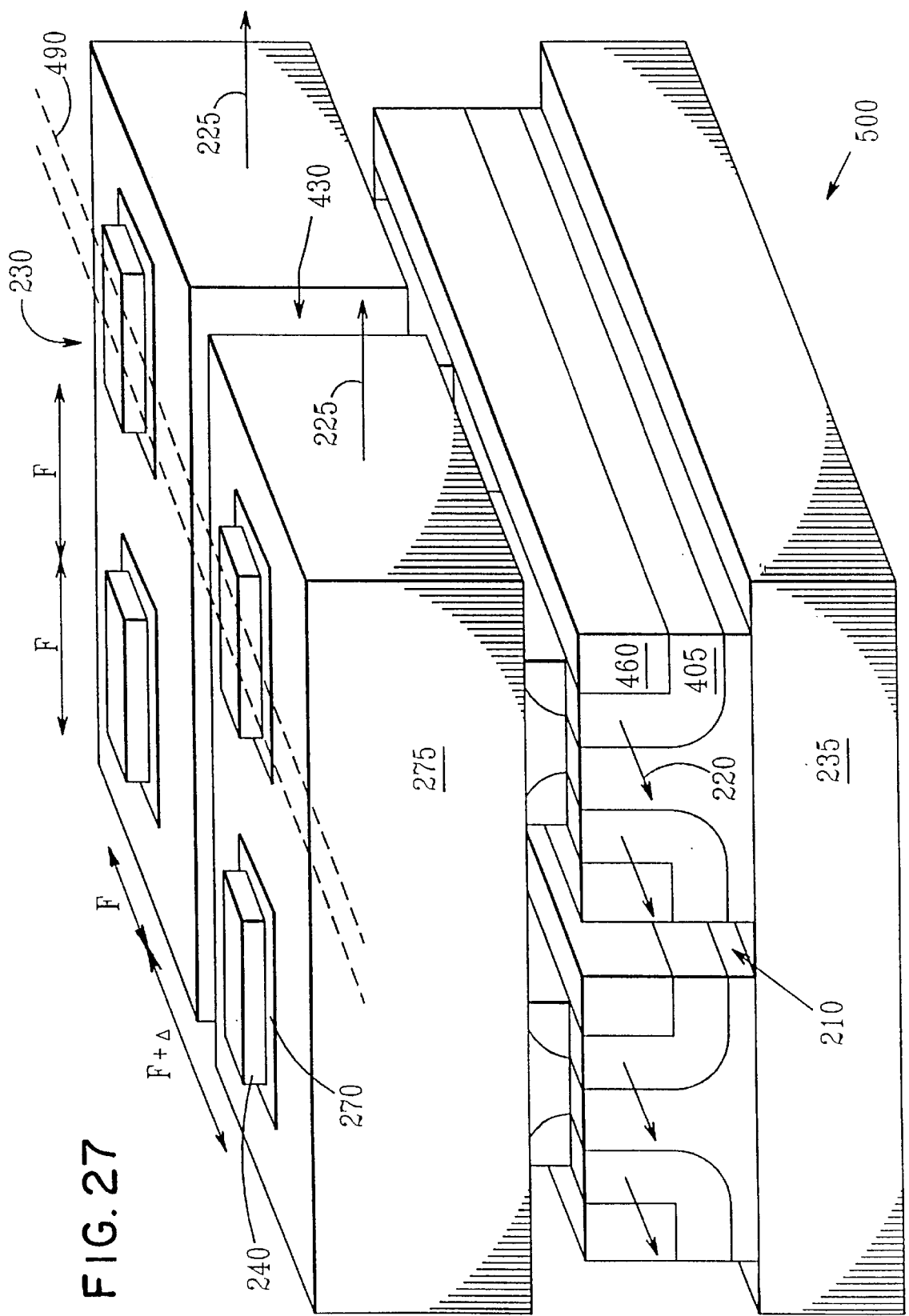
FIGS. 27–28 show an array of memory cells with and without strap lines according to a further embodiment of the present invention.

FIG. 27 shows an array 500 according to another embodiment of the present invention. For use as a one transistor, one capacitor DRAM cell 100, shown in FIG. 5, a stack capacitor is added on top of each pillar 230 shown in the array 500 of FIG. 27. The array 500 is formed using the same steps previously discussed in connection with FIGS. 15–23. Alternatively, the array 500 may be formed using steps described in connection with FIGS. 8–14. The array 500 differs from the previous embodiments since the tunnel oxide and floating gate (260, 265 of FIGS. 25–26) are not needed. Thus, only the gate oxide 270 is formed around the pillars followed by formation of the gate 275.

As previously described, the polysilicon straps 460 may be retained, or may be removed either prior or after the second etch step that forms the wordline trenches 430 between the wordlines 225, and deepens the bitline trenches 210 formed by the first etch which are located between the bitlines 220.

Figure 28:
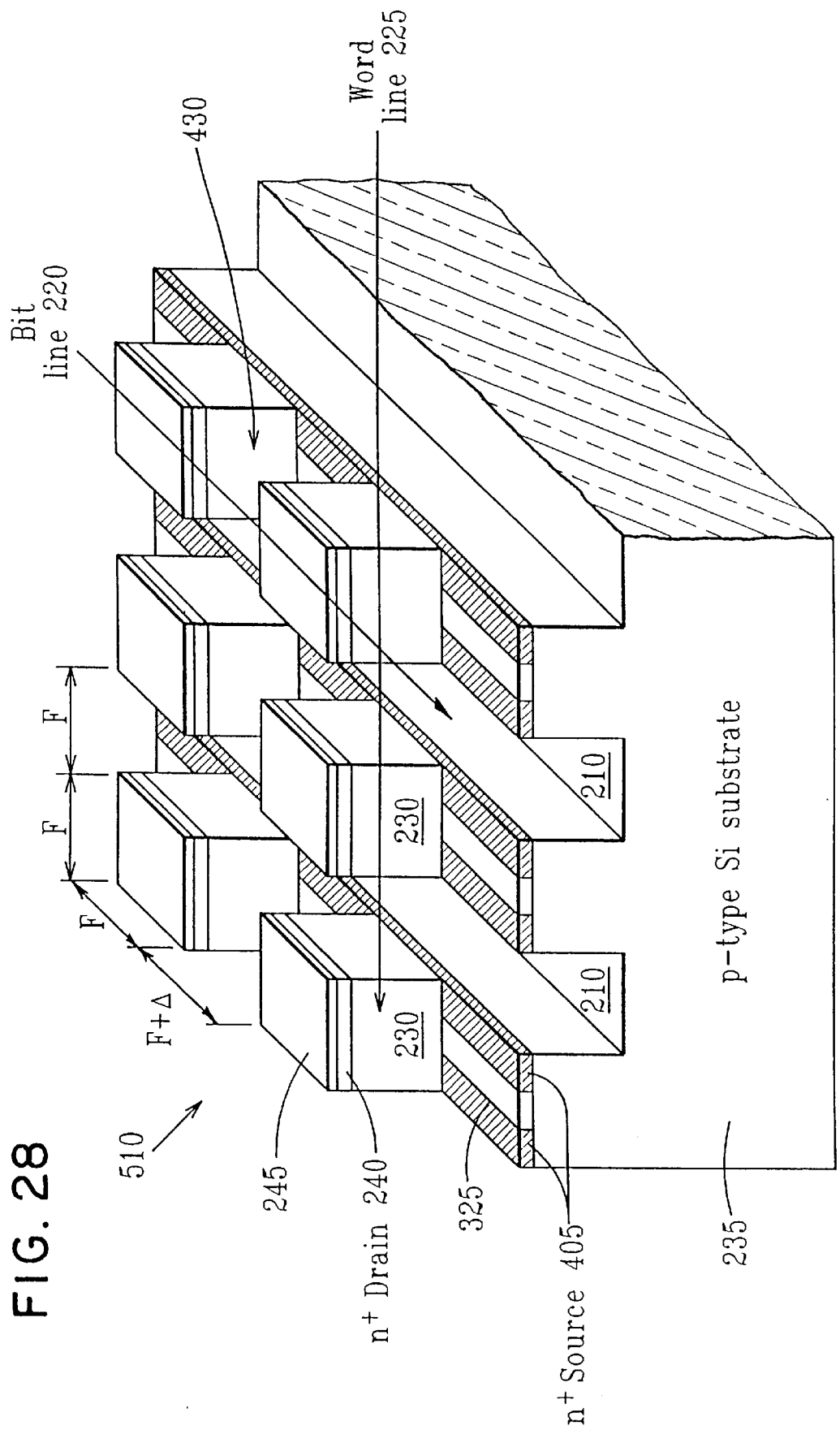

FIG. 28 shows an array 510 where the straps 460 are removed prior to the second etch. The array 510 is formed by etching column or bit trenches 210 as described in connection with FIG. 8. The drain 240 may be implanted prior to patterning the SiN islands 245 to form the pillar 230. Alternately, the drain 240 may be formed at a later stage as discussed in connection with FIGS. 25–26.

Note, for DRAM applications, the source and drain of the FET 105 shown in FIG. 5 are interchangeable, depending on use, e.g., depending on read or write operations. For simplicity, in the following discussion of the vertical transistors having integrated capacitors, the upper doped regions of the pillars are referred to as the drains, and the lower doped regions are referred to as the sources. However, it is understood by those skilled in the art that the source and drain of each pillar may be interchanged.

Figure 29:
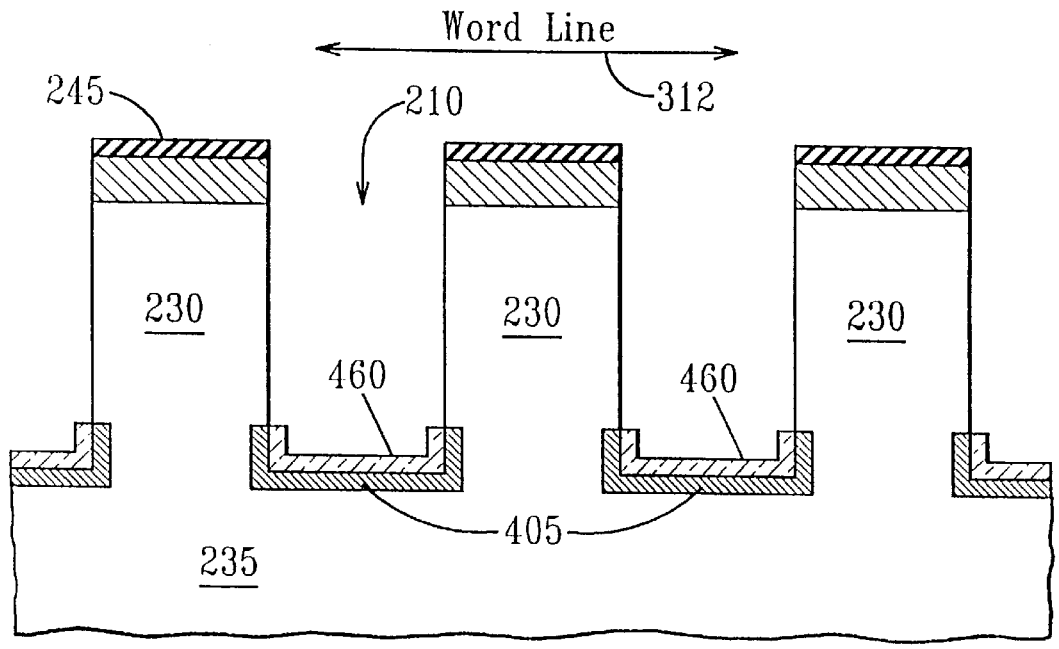
FIGS. 29–32 show a method of forming the array shown in FIGS. 27–28 according to the present invention.

As shown in FIG. 29, source outdiffusion material 460 is formed in the bitline trenches 210. Illustratively, the source outdiffusion material 460 is arsenic glass (ASG), heavily doped oxide, polysilicon, or other suitable material. Next, the ASG is etched back to leave ASG at the lower sidewalls and bottom of the bitline trenches 210. The sources 405 are formed by outdiffusing material, e.g., arsenic, from the ASG 460. The outdiffusion may be performed by annealing. Source outdiffusion is stopped before the sources 405, located below each pillar, isolate the pillars 230 from the underlying substrate 235.

Figure 30:
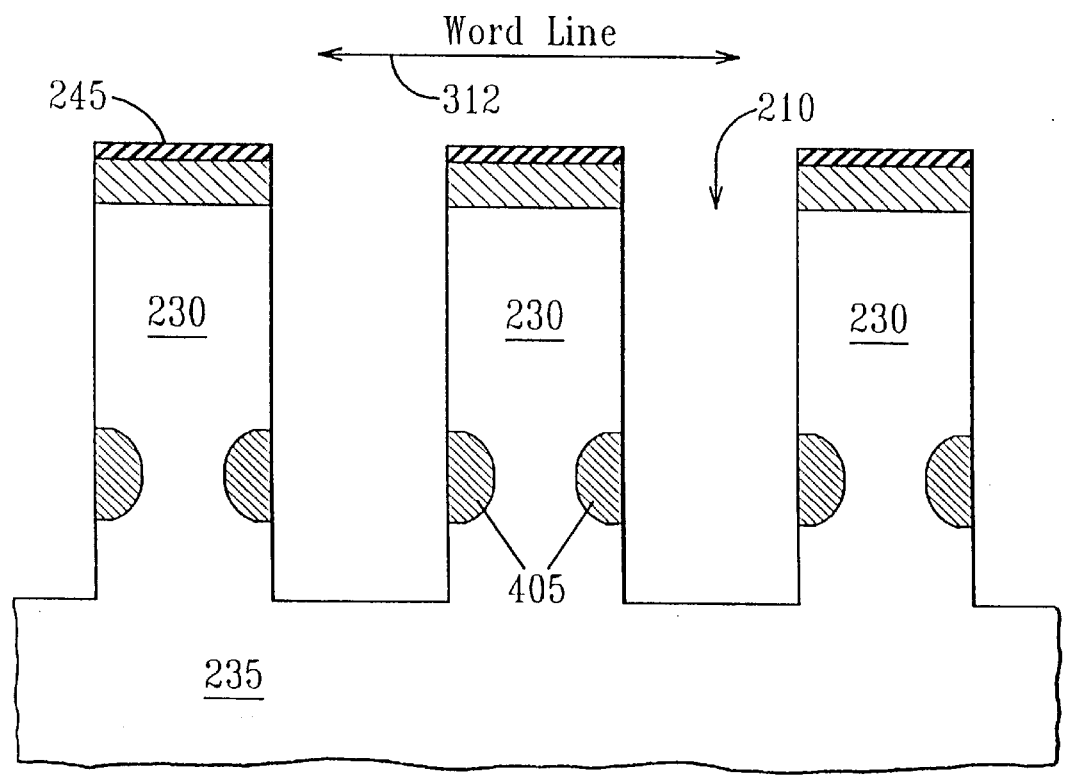
Figure 31:
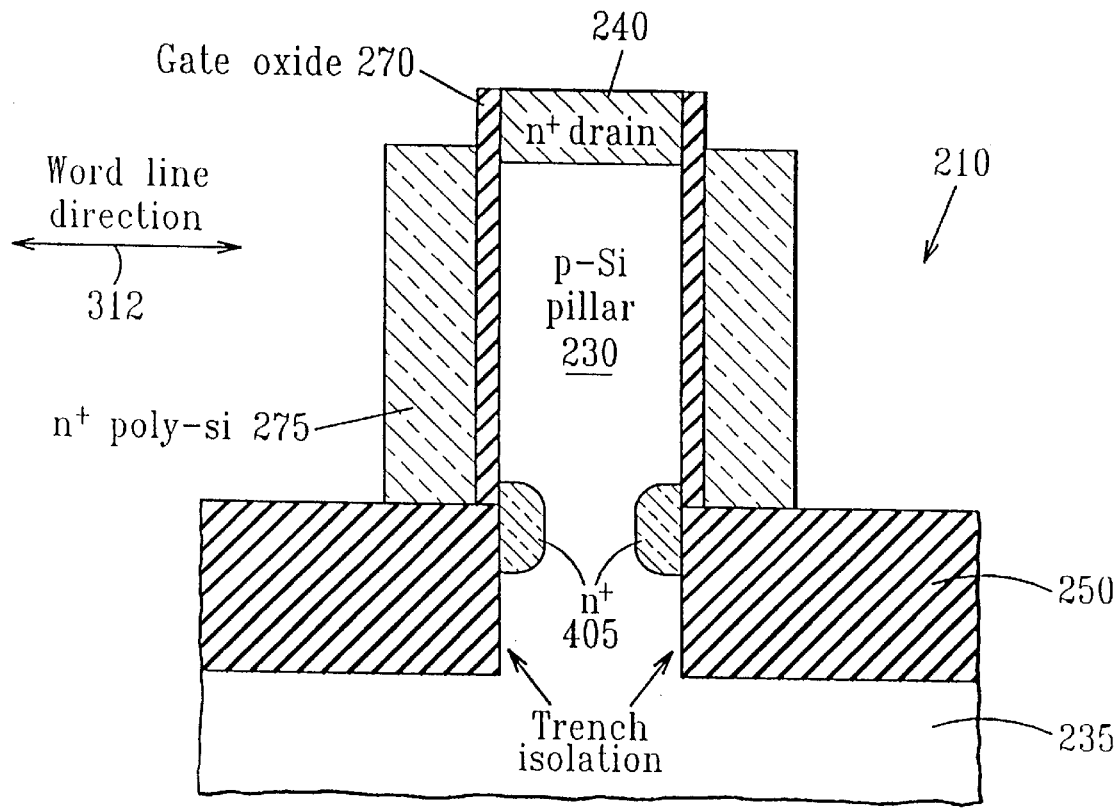
Figure 32:
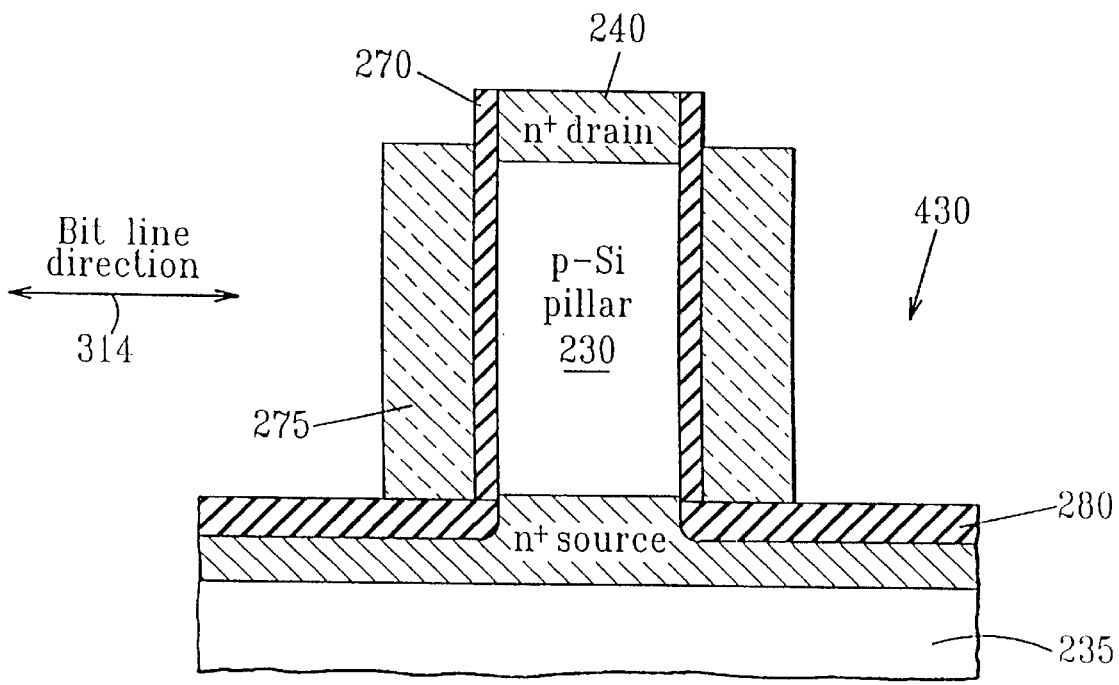

As shown in FIG. 30, after removing the ASG 460, a second etch is performed. The second etch forms the wordline or row trenches 430 (FIG. 32) and deepens the bitline or column trenches 210. As shown in FIGS. 31–32, an insulator layer, such as an oxide layer 250, is formed to fill the trenches 210, 430. As previously described, the oxide fill 250 is planarized and etched to recess it in the trenches 210, 430. The upper portion of the oxide layer 250 forms an oxide spacer 280. A gate oxide 270 is formed around each pillar followed by formation of a gate 275, which may be heavily doped n⁺ polysilicon, for example.

If desired, a floating gate and tunnel oxide may be formed around the pillars prior to the gate oxide 270 and gate 275 formation. If the drains 240 were not initially formed prior to forming the nitride islands 245, then after removing the nitride islands 245 located above the pillars, the drains 240 are formed therein, e.g., by implanting N-type material.

Figure 33:
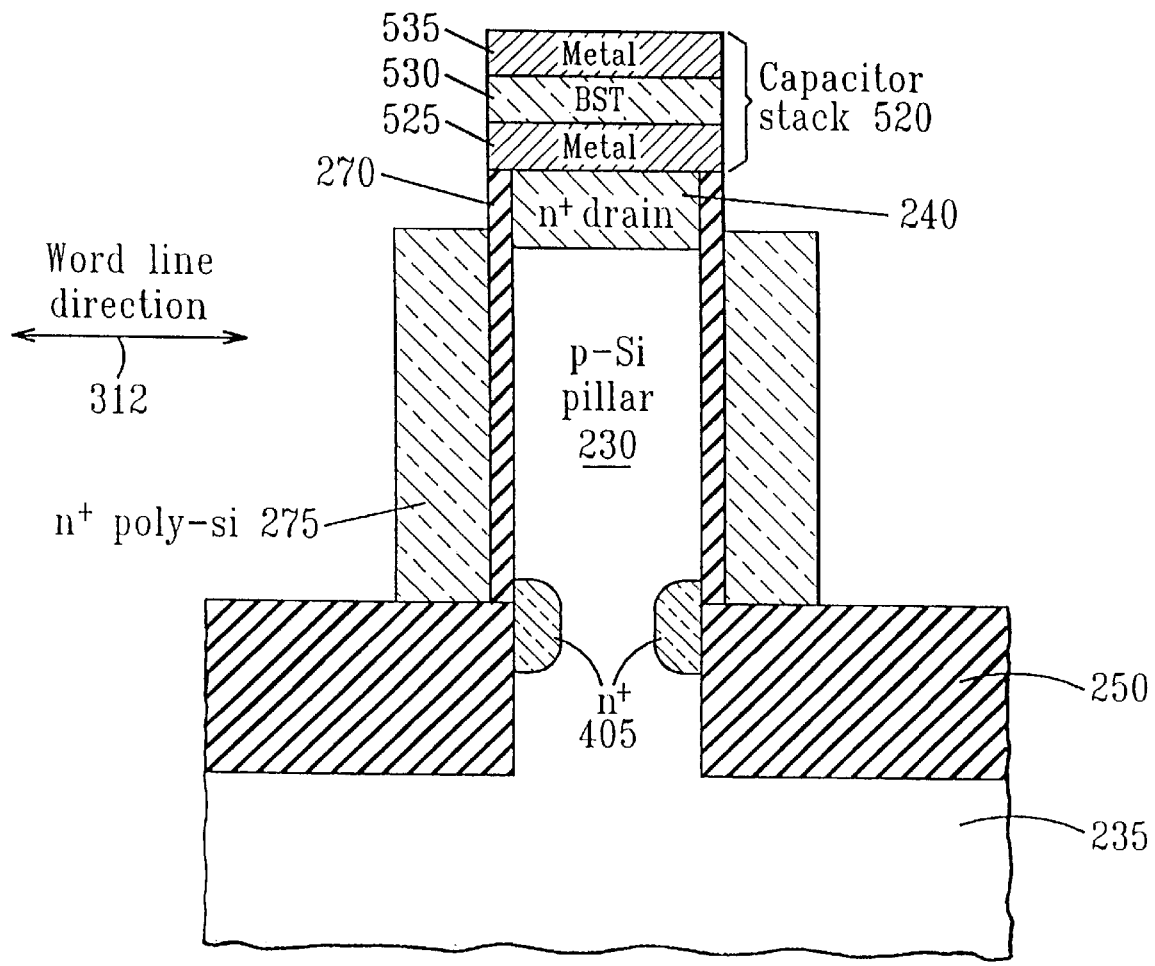
FIG. 33 shows a memory cell having a stack capacitor according to another embodiment of the present invention.

As shown in FIG. 33, a stack capacitor 520 is formed over the drain 240 of each pillar 230 in the array. The stack capacitor is formed by forming a first electrode 525 over the drain 240. The first electrode 525 acts as the storage electrode or node 110 shown in FIG. 5. A dielectric 530, such as barium strontium platinum (BST) for example, is formed over the storage electrode 525, followed by formation of a second electrode 535 thereon.

The second electrode 535 acts as the common electrode or plate 115 shown in FIG. 5. The first and second electrodes 525, 535 are formed from conductive material, such as metal for example. The stack capacitor 520 is formed directly on top the vertical transistor or FET itself. This prevents enlargement of the memory cell lateral area.

Figure 34:
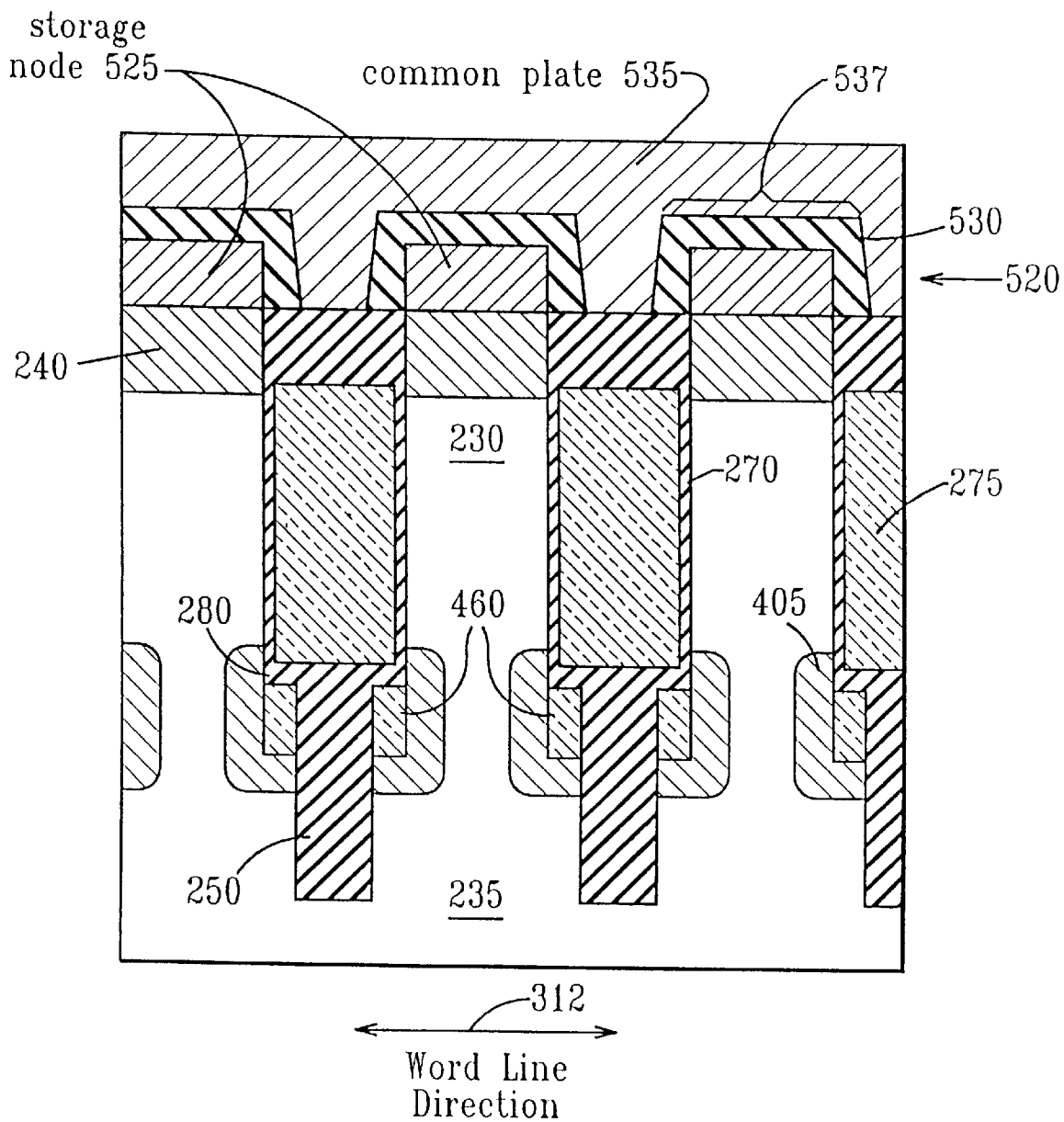
FIG. 34–35 show different embodiments of the stack capacitor shown in FIG. 33 according to the present invention.
Figure 35:
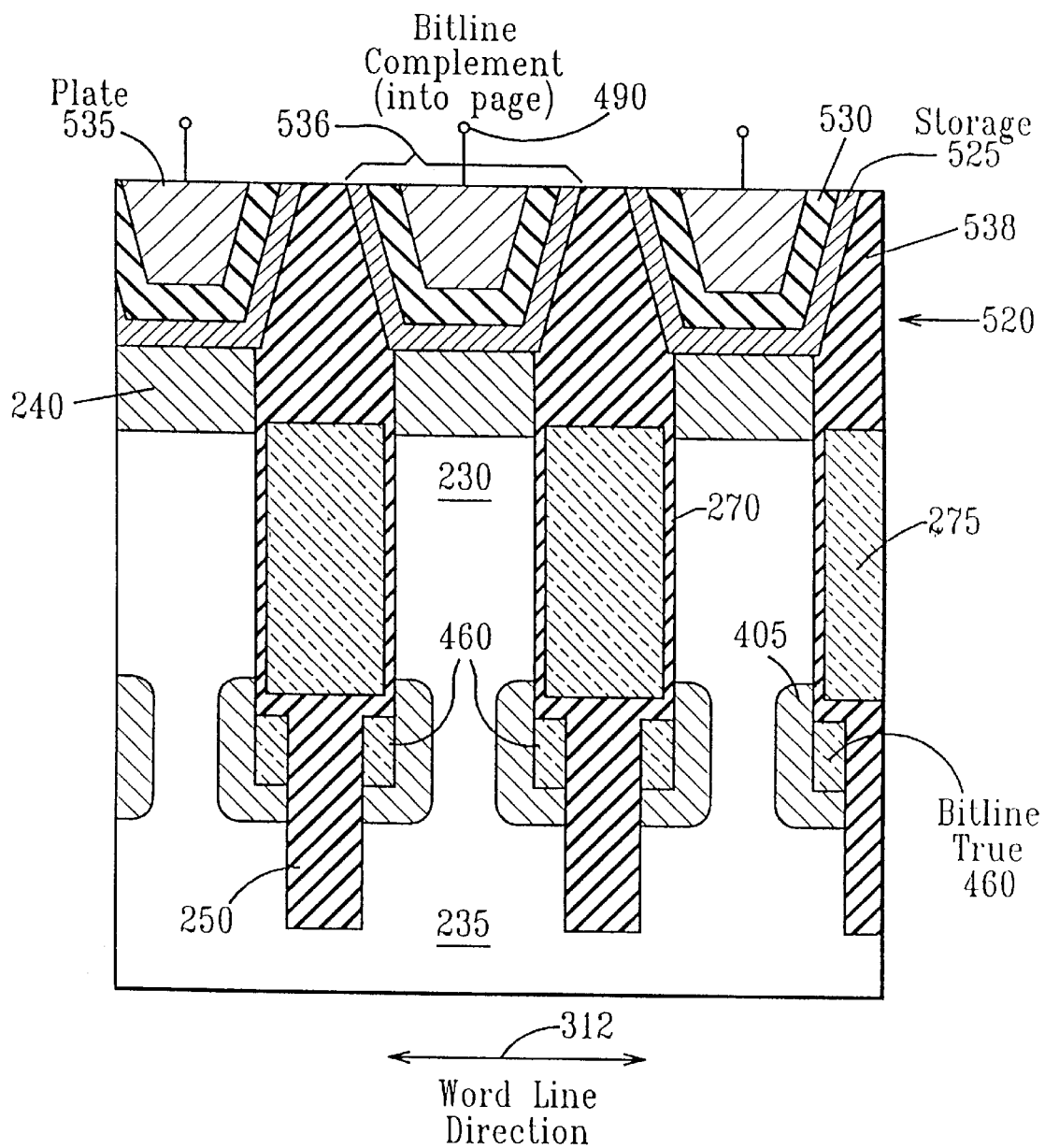

As shown in FIGS. 34, 35, the storage electrode 525 is exclusive to each pillar and is used for storing charge in the DRAM cell. The second electrode 535 serves as the capacitor plate, and may either by common to all the pillars (FIG. 34), or connected exclusive to each pillar (FIG. 35). In the latter case shown in FIG. 35, the exclusive capacitor plates 535 may be connected as desired, e.g., along a common buried bitline, by a first metal 490. The first metal 490 acts as a bitline compliment while the corresponding buried bitline 460 acts as a bitline true.

As discussed above, in DRAM applications, the source and drain of the FET are interchangeable, depending on use. For example, in the configuration shown in FIG. 33, where the body of the pillar 230 is continuous with the underlying substrate 235, the buried diffused line 405 actually acts as the "drain" or bitline for the memory cell, while the implanted contact 240 on top of the pillar acts as the "source" for charging the storage capacitor 520. For this implementation having the storage capacitor 520, the floating body design, where the body or middle region of the pillar is isolated from the underlying substrate 235, would not be desirable. This is due to the body-charging effect resulting from charge accumulation in the isolated body of the pillar. Having a pillar body which is continuous with the underlying substrate prevents charge accumulation in the pillar body, so that charges are only stored in the storage capacitor 520.

In order to get the high-capacitance necessary to store adequate charge, a high-dielectric material is used in the capacitor stack, e.g., BST. To further increase the area of the capacitor, and hence increase the storage capacitance, the capacitor structure could also be deposited into a via hole 536 (FIG. 35), or on a crown 537 (FIG. 34), to take advantage of the sidewall capacitance. This structure would implement the one transistor/one capacitor DRAM cell 100 of FIG. 5 in a minimum area, without the use of any floating-gate structures.

Returning to FIG. 27, the basic array 500 of vertical MOSFET devices is formed by the self-aligned source diffusion and isolation techniques previously described. In this three dimensional representation of FIG. 27, the isolation oxide 250 (FIG. 31) has been omitted for clarity, but would normally fill the open area between all of the pillars and trenches. The array 500 has the additional polysilicon strap 460 on the diffused lower bitline 405. The strap 460 reduces the resistance of the bitline 405.

The body of the transistor pillars is still in contact with the underlying substrate 235. This is because the source outdiffusion 405 has been limited so that the regions from opposite sides of the pillars 230 do not meet. If desired, a floating body transistor is formed by longer annealing, or by implantation prior to array fabrication. In addition, all other previously described variations of the isolation and source formation steps are also applicable here.

The area taken up by each pillar 230 and the spacing between pillars is slightly over 4F-square. The additional area is due to the delta (Δ) necessary for separating the array wordlines from each other (along the bitline direction). Delta can be made as small as the lithographic tolerance allows. It is also possible to obtain a truly 4F-square cell, or smaller, if sub-lithographic techniques are used. However, using sub-lithographic techniques are complex and costly. One of the major advantages of the vertical design is that a nearly 4F-square cell size is obtained without using sub-lithographic techniques.

Another advantage is that the gate length is completely independent of the cell area. Hence, a long channel transistor can be maintained by simply increasing the pillar height, without taking up any additional lateral area on the wafer. This is especially crucial for the one transistor/one capacitor DRAM cell. Such a design is amenable to being scaled down and yet maintain desired cell characteristics.

FIGS. 34, 35 show two different designs for the capacitor 520. Note, that since the capacitor 520 is wholly-contained within the nearly 4F-square area of each pillar and the adjacent inter-pillar spacing, the minimum area cell size is automatically maintained, and no sub-lithographic steps are necessary. Several other designs are possible for the capacitor structure. The two designs of FIGS. 34, 35 are shown to illustrate two functional differences.

In the capacitor design shown in FIG. 34, the capacitor plate 535 is common to all the cells in the array. Illustratively, the capacitor plate 535 is held at a constant voltage, e.g., ground. This creates the open bitline architecture 150, as described in connection with FIG. 7, with the buried diffused source 405 and/or polysilicon strap 460 acting as the bitline, and the polysilicon gate 275 acting as the wordline. Note, the charge is stored on the storage electrode or node 525, which is still exclusive to each pillar 230. By way of analogy, the storage electrode or node 525 is the storage node 110 shown in FIG. 5.

In the embodiments shown in FIG. 34, the dielectric layers 530 are isolated from the gates 275 by an insulating layer 537, which may be oxides of silicon, for example. The insulating layer 537 is formed over each gate 275, between the upper doped regions 240 of the pillars 230. The insulating layer 537 may be formed prior to forming the storage nodes 525.

Instead of having individual storage nodes 525 for each memory device or pillar, and a common plate 535, each memory device may have its own plate 535 and storage nodes 525. FIG. 35 shows an array of cells, where each has both individual storage and opposing common plates 525, 535, which are exclusive to each pillar 230. The plates 535 can then be connected together in any desired configuration by a first level of metal similar to the dotted lines 490 of FIG. 27.

Illustratively, all of the plates 535 for the capacitors 520, which are on pillars along a common diffused buried bitline, are connected together. That is, the metal line 490 runs parallel to the bitline 220 shown in FIG. 27, or into the page in the cross-section shown in FIG. 35. The buried source 405 or buried strap 460 acts as the buried bitline.

In the embodiment shown in FIG. 35, prior to forming the storage nodes 525, an insulating layer 538 is formed between the upper doped regions 240. The insulating layer 538 extends over the gates 275 and is shaped to provide a supporting layer for forming the via holes 536, in which the storage nodes 525 are subsequently formed.

The insulating layer 538 isolates the storage nodes 525 from each other and from the gates 275. Illustratively, the insulating layer 538 is an oxide of silicon. Next, the dielectric layers 530 are formed over the storage nodes 525, followed by formation of the individual plates 535. The plates 535 are isolated from each other and are confined within their respective dielectric layers 530.

In the configuration shown in FIG. 35, the buried bitline 460 is a "bitline true", while the metal bitline 490 located on top of the capacitors 520 is the "bitline complement". The structure shown in FIG. 35 yields an open/folded architecture, where the voltages on both the true and complement bitlines are varied.

In contrast to the open architecture of FIG. 34, where the capacitor plate 535 is common to all the cells, each cell has a separate capacitor plate 535 in the open/folded architecture of FIG. 35. In the open/folded architecture, the separate capacitor plates 535 are connected together. The interconnected capacitor plates 535 of the open/folded architecture of FIG. 35 are parallel to the bitlines and form a bitline compliment. A third architecture, described in connection with FIG. 51, referred to as a folded architecture, has two wordlines that pass through each cell, located on top of each other around each pillar, where one wordline is active and the other is passing for each cell.

The open/folded architecture gives twice the sense voltage for the same amount of charge stored on the capacitor. This is advantageous for sensing smaller voltages, particularly as capacitance values continue to drop with increased scaling. The open/folded architecture 120 (FIG. 6) also gives an increased tolerance to noise, which is often a drawback to the purely open bitline design 150 of FIG. 7. Open/folded architecture is discussed in T. Hamamoto, Y. Morooka, M. Asakura, and H. ASIC, "Cell-plate-line and bit-line complementarily-sensed (CBCS) architecture for ultra low-power non-destructive DRAMs," 1995, Symposium on VLSI Circuits Digest of Technical Papers, p. 79, hereinafter referred to as Hamamoto.

In conventional folded or open/folded architecture using planar technology, cell area is increased due to the additional wordline (passing wordline in the folded architecture), or due to connection between the separate capacitor plates (in the open/folded architecture). In the vertical cells of the present invention, the passing wordlines or the separate capacitor plates are easily accessible and do not increase the cell area.

MEMORY DEVICE WITH TRENCH CAPACITOR

In another embodiment of the present invention, a deep trench capacitor is provided below the memory cell pillars of an array 540, shown in FIG. 36. This array 540 is similar to arrays previously described herein. Using vertical transistors as the transfer devices prevent an increase in the lateral area of the cells 545.

By using vertical transistors, the gate length of each transistor is maintained at a suitable value for obtaining low leakage, without decreasing the bitline voltage or increasing the memory cell lateral area. In addition, because the deep trench capacitor is placed directly below the vertical transistor, no additional area is consumed.

Each memory cell 545, with its trench capacitor, is used as the one transistor, one capacitor DRAM cell 100 of FIG. 5. The pillars of the memory cell array are formed using previously described steps that form cells each having a size of $4F^2$ in either the open bitline architecture, or the open/folded architecture using dual bitlines. Cells between wordlines are separated by a length $\Delta$, which may be approximately 0.1F to 0.2F, for example.

Each trench capacitor wraps around the bottom of each pillar of the memory cell array. Similar to the array 500 of FIG. 27, each cell 545 of the array 540 has buried doped region, which may act as either the source or drain of the vertical transistor. For convenience, the lower doped region is referred to as the buried source region 405. The buried source region 405 serves as the charge storage node for the trench capacitors. The source of each transistor is isolated from sources of other transistors.

Details of forming the vertical transistors are previously described. In addition, the previously described variations are also applicable. For example, the pillar body may or may not be in electrical contact with the underlying substrate 235. The transistor or pillar body isolation, resulting in a floating transistor body may be achieved by not diffusing the source to completely form below the entire pillar footprint.

Alternatively, for a floating transistor body, the source may be formed prior to all etching steps by implantation into a suitable-doped substrate, which may include epitaxial layers, as long as the dual trench etch depth is sufficient to separate the heavily doped source regions 405 at the base of each pillar 230 between wordlines 225.

The trench capacitor comprises of a dielectric material, e.g., an oxynitride film, deposited around the base of each pillar. A plate electrode material, e.g., heavily doped polysilicon, is deposited into the matrix between the pillars, and recessed to just below the top of the source region. This plate electrode may be common to all pillars in the array (open architecture). Alternatively, the plate electrode is isolated by etching to just serve the pillars along a common bitline (open/folded architecture). The plate electrode material may also be silicided to reduce resistance.

The middle section of each pillar, where the transfer device (or vertical transistor) is fabricated, is encircled by the gate dielectric 270, e.g., thermally-grown silicon dioxide. As in FIG. 27, this gate dielectric 270 extends between two heavily-doped regions at the top and base of each pillar. A conductive gate material 275, e.g., in-situ, heavily doped polysilicon, with or without silicidation, is deposited on the array to connect pillars along each row or wordline 225 of the array. The wordlines 225 are orthogonal to the bitlines 220.

The pillars in the array may be separated by slightly different amounts $\Delta$ in the bitline versus the wordline directions. This allows the gate material 275 to be separated between wordlines 225 by RIE etching alone, e.g., by forming a polysilicon spacer along the edges of the pillars, and encircling them, without lithography. If the pillars are equi-spaced in both directions, an additional mask can be used to separate the gate material in the desired directions.

To illustrate the basic cell design, an annotated process flow is described below for the open bitline architecture case. Changes necessary for the open/folded design are mentioned in the process flow, where appropriate. Note that specific materials listed in this process flow may be substituted with equivalent material, as previously indicated. For example, other dielectrics and conductive materials may be substituted for the gate oxide 270 or oxide fill 250, and for the polysilicon gate 275 or strap 460.

Figure 36:
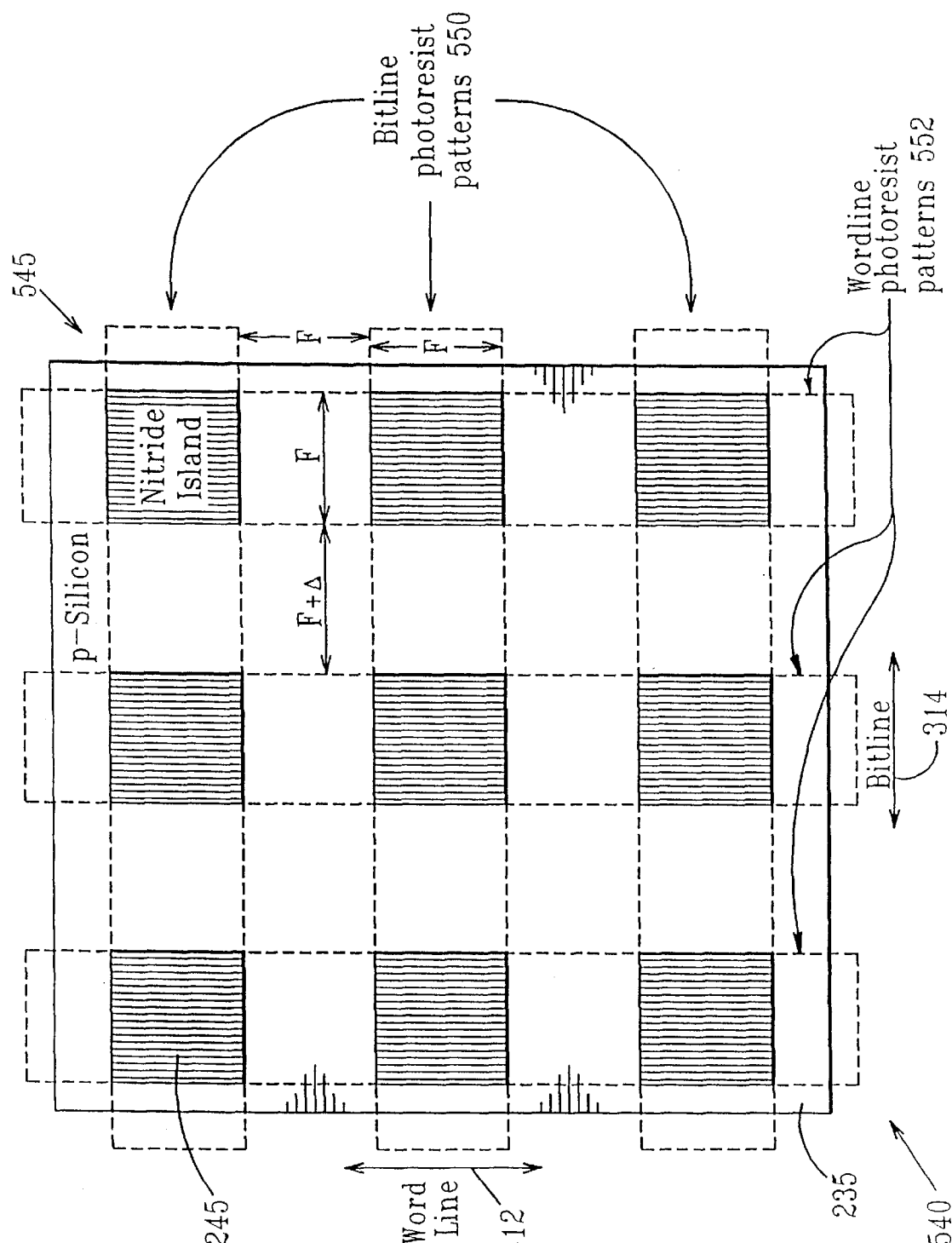
FIG. 36–44 show a method of forming an array of memory cells each having a trench capacitor for open bitline and open/folded architectures according to another embodiment of the present invention.
Figure 37:
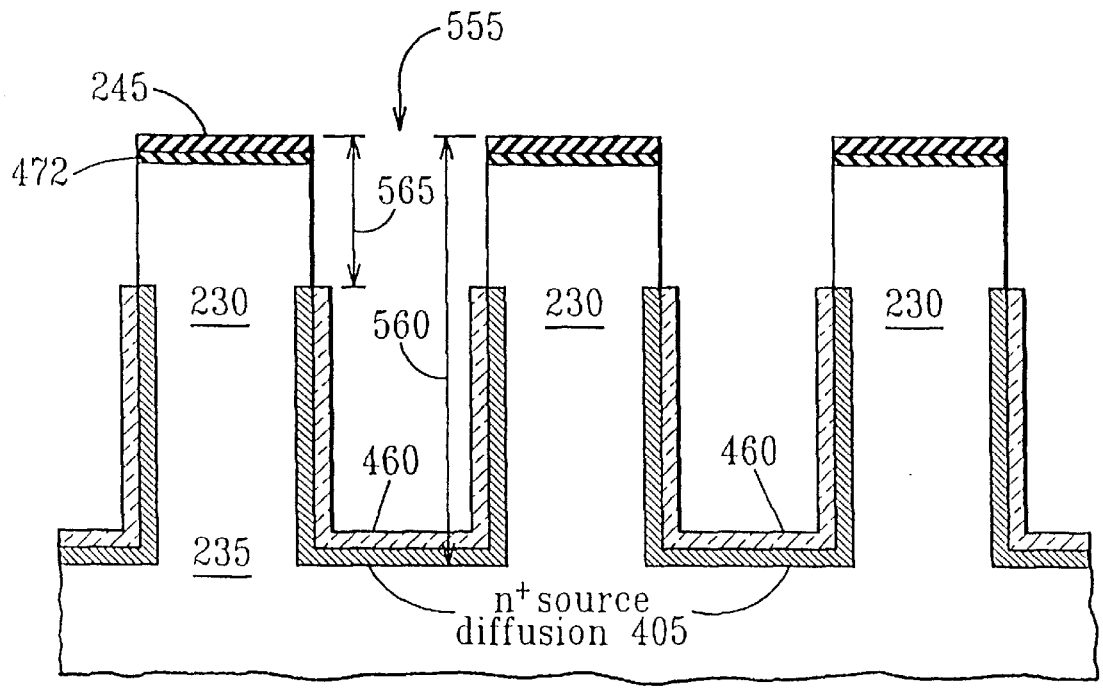

1) As shown in FIGS. 36–37, steps which are similar to steps previously described in connection with FIGS. 17–18 are performed. In particular, a thin pad oxide layer and a thicker nitride layer are deposited across the wafer. Photoresist is patterned in parallel lines 550 across the array region. These lines 550 have a width F and an inter-spacing F, and define the pillars along the bitlines direction 314.

With the photoresist lines 550 in place, the nitride and pad oxide layers are etched through to form nitride and pad oxide strips 290, 450 (FIGS. 17–18). This etch forms parallel nitride lines or strips 290 along the bitline direction 314, each having a width F and separated from each other by a distance F. The nitride strips 290 serve as a mask for the deep Si substrate 235 etch to follow.

If the open/folded design is desired, the Si itself, between the photoresist lines 550, is also etched approximately 0.5 μm. This biases the final pillar height in the bitline direction 314 to be deeper than in the wordline direction 312.

2) The pillar definition is completed by etching and patterning the nitride strips 290 with photoresist lines 552 that are perpendicular to the previous photoresist lines 550. The width of the photoresist lines 552 is F and the inter-line 555 spacing is F+delta, where delta is on the order of approximately 0.2F. This additional distance delta prevents the gates 275, which are formed around the pillars 230, from shorting between wordlines 225 without the need for lithography. The resulting mask pattern after the photoresist 552 is removed is an array of nearly-square islands of nitride 245 on the Si substrate 235, as shown in FIG. 36.

3) As shown in FIG. 37, RIE is used to etch a deep trench 555, using the nitride squares or islands 245 as a masking material. This step is similar to that described in connection with FIG. 17, where nitride strips 290 were used as a mask instead of the nitride islands 245 of FIG. 37. In this case, where nitride islands 245 are used as a mask, the etch forms pad oxide and nitride islands 472, 245, and etches the substrate 235 to form the pillars 230. The etch depth 560 is approximately 9 μm in order to allow both the vertical FETs and the trench capacitors to be fabricated along the height of each pillar 230. The exact depth needed is determined by the amount of capacitance necessary for reliable memory functions.

In contrast to the bitline trenches 210 of FIG. 17, which are trench lines along only the bitline direction 314, the deeper trenches 555 are formed between both the bitlines and wordlines. Therefore, the cross sections along both the bit and word lines are identical, as shown in FIG. 37.

For the open/folded architecture, where the Si substrate 235 along the bitlines is etched in step 1, (similar to FIG. 17), the final depth on the bitline sides of the pillars is deeper than on the wordline side, as this bias is translated down during the deep trench etch. For example, the final depth of the deeper bitline trenches, i.e., trenches parallel to the bitline direction 314, is approximately 0.5 μm more than the depth of the wordline trenches.

4) Source outdiffusion material 460, such as heavily-doped oxide, e.g., ASG, is deposited on the wafer, lining the sidewalls of the trenches 555. The ASG layer 460 is then etched back so that ASG material 460 is left only on the lower portion of the sidewalls, and possibly on the bottom, of the trenches 555. Illustratively, ASG 460 is removed from the top sidewalls of the trenches 555, so that ASG is left only up to the top of the desired source region of the vertical FET, a depth 565 of approximately 0.5 μm from the top of each pillar 230.

5) The wafer is annealed briefly at a high temperature to drive some of the As from the ASG 460 into the pillar sidewalls. The penetration of this n+ layer can be controlled so that it does not extend completely across the pillars. This allows the transistor body to remain in contact with the underlying substrate 235. The n$^+$ diffused regions 405 forms both the source (or drain, depending on application) of the vertical FET, as well as the charge storage node 110, shown in FIG. 5, for the trench capacitor that is subsequently formed.

Figure 38:
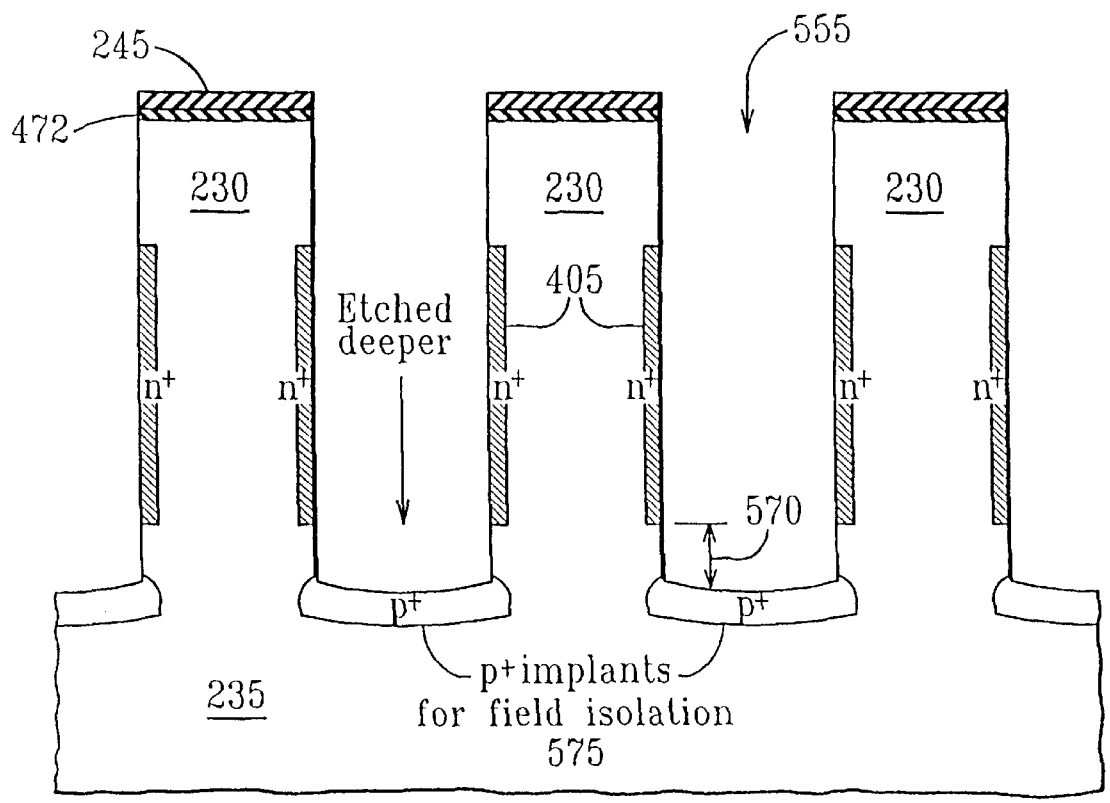

6) As shown in FIG. 38, the ASG 460 is removed, and the trenches are etched slightly deeper for an additional depth 570 of about 0.25 μm. This separates the n$^+$ regions 405 of each pillar 230. That is, each pillar 230 has its own isolated n$^+$ region 405 diffused therein from all sides.

To further ensure proper isolation between the storage nodes 405 of different pillars 230, a high dose P-type implant may be performed to form a field isolation region 575 at the bottom of the trenches 555. Alternatively, this isolation could be formed by outdiffusion from another deposited material, or by using a p$^-$/p$^+$ epitaxial substrate wafer.

Figure 39:
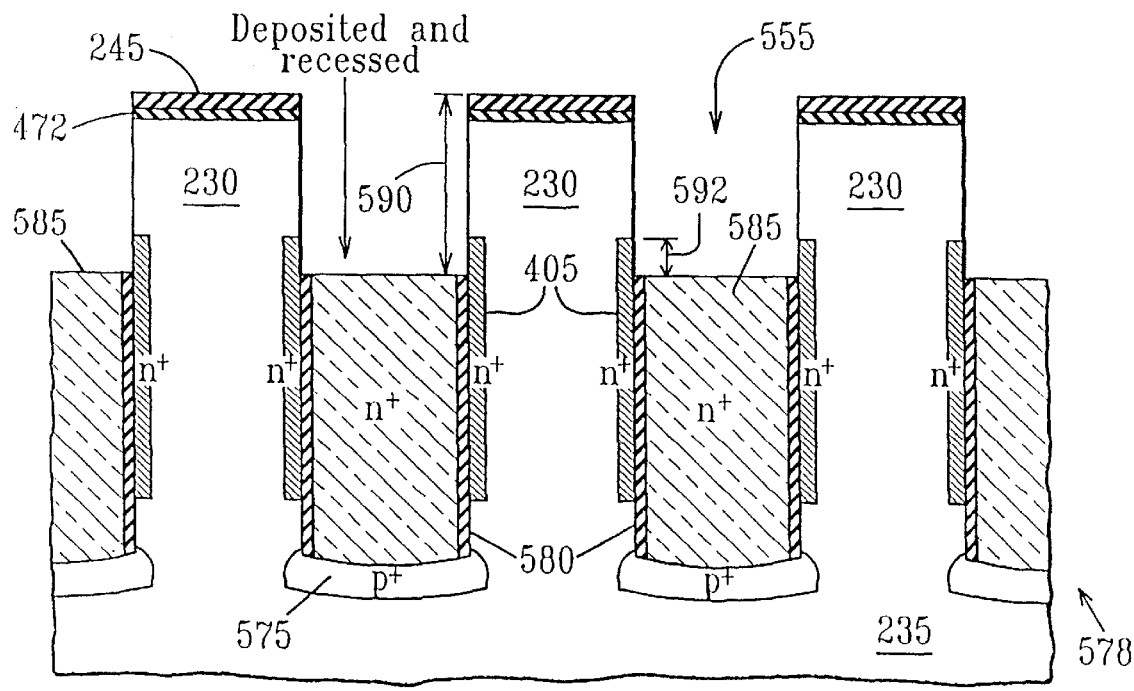

7) As shown in FIG. 39, the trench capacitor 578 is now formed by growing an ONO film 580 in the trenches 555. Next, n$^+$ polysilicon 585 is deposited in the trenches 555. The ONO 580 and n$^+$ polysilicon 585 layers form the capacitor dielectric and plate material, respectively. These layers 580, 585 are recessed, by RIE for example, to a depth 590 which is a distance 592 of approximately 0.1 μm below the top of the n$^+$ diffusion region 405.

For the open bitline case, this polysilicon 585 fills the whole trench lattice between the pillars 230, and extends out beyond the memory array in order to be contacted.

The polysilicon fill 585 is held at a fixed potential, e.g., ground, to form the plate of all the trench capacitors 578. Since the substrate 235 is also held at ground, there is no appreciable bias across the p$^+$ field isolation regions 575. Thus, the leakage between adjacent pillar capacitors is small.

Figure 40:
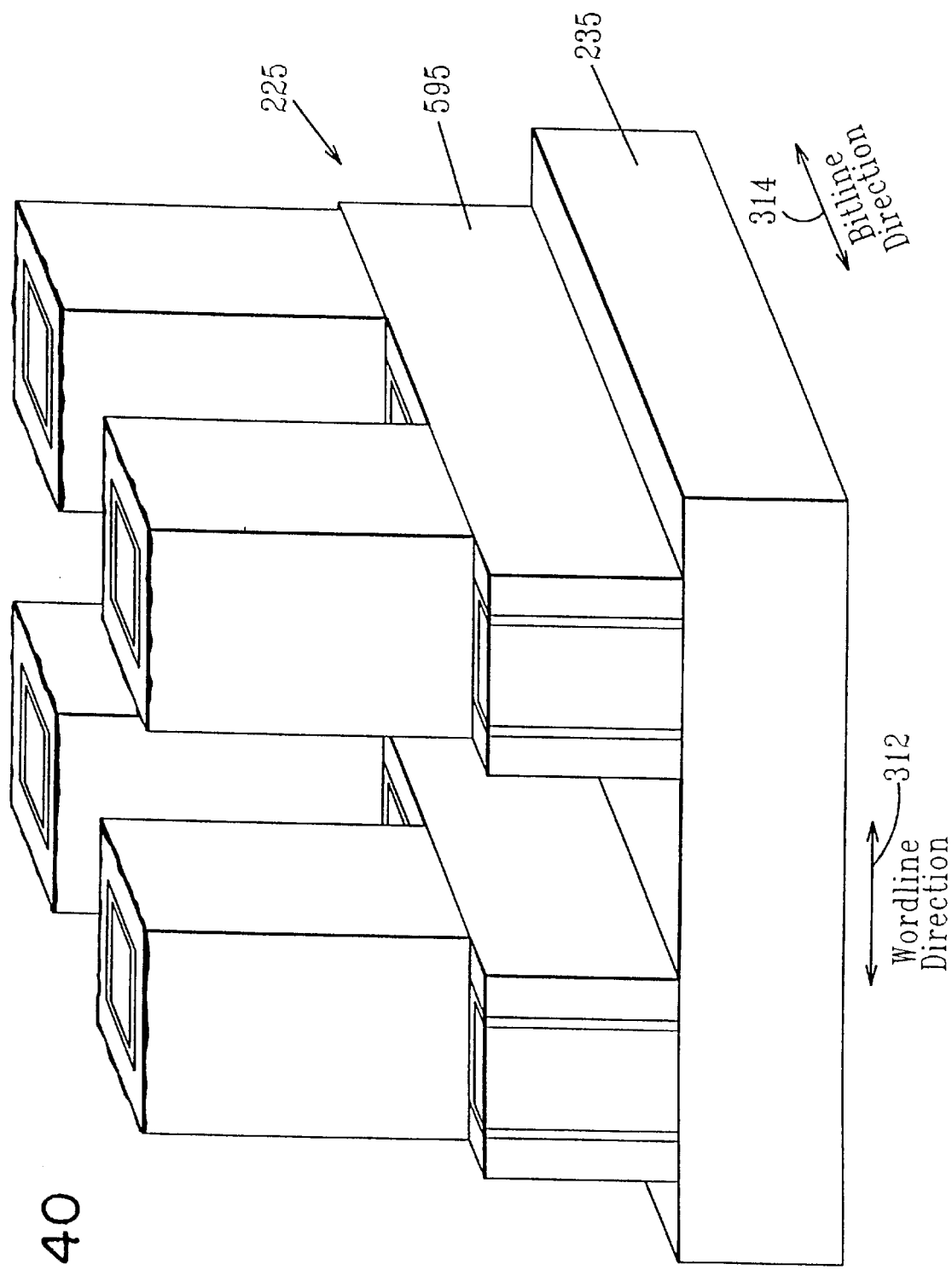

FIG. 40 shows the open/folded case, having different depth trenches in the bitline and wordline directions 312, 314. The polysilicon fill 585 (FIG. 39) only lines sidewalls of these trenches. This is achieved by removing the polysilicon that deposits on the bottom of the trenches by the RIE recess step. This disconnects the polysilicon (poly) between the bitlines 225.

Due to the different depths of the trenches in orthogonal directions, a sidewall of poly remains along each bitline 225. This forms the bitline complement 595, and is contacted at the edge of the array. The height of this bitline compliment 595 is determined by the amount of bias etch in step 1, e.g., 0.5 μm, and can be varied from 0.5 μm to change the resistance of the bitline 595. In addition, the poly 595 may be silicided, or an alternate conductive material, such as tungsten, may be used instead of poly to lower the resistance of bitline complement line 595.

All subsequent array processing steps are identical for the open and open/folded cases. Therefore, only the open case will be shown in the figures.

Figure 41:
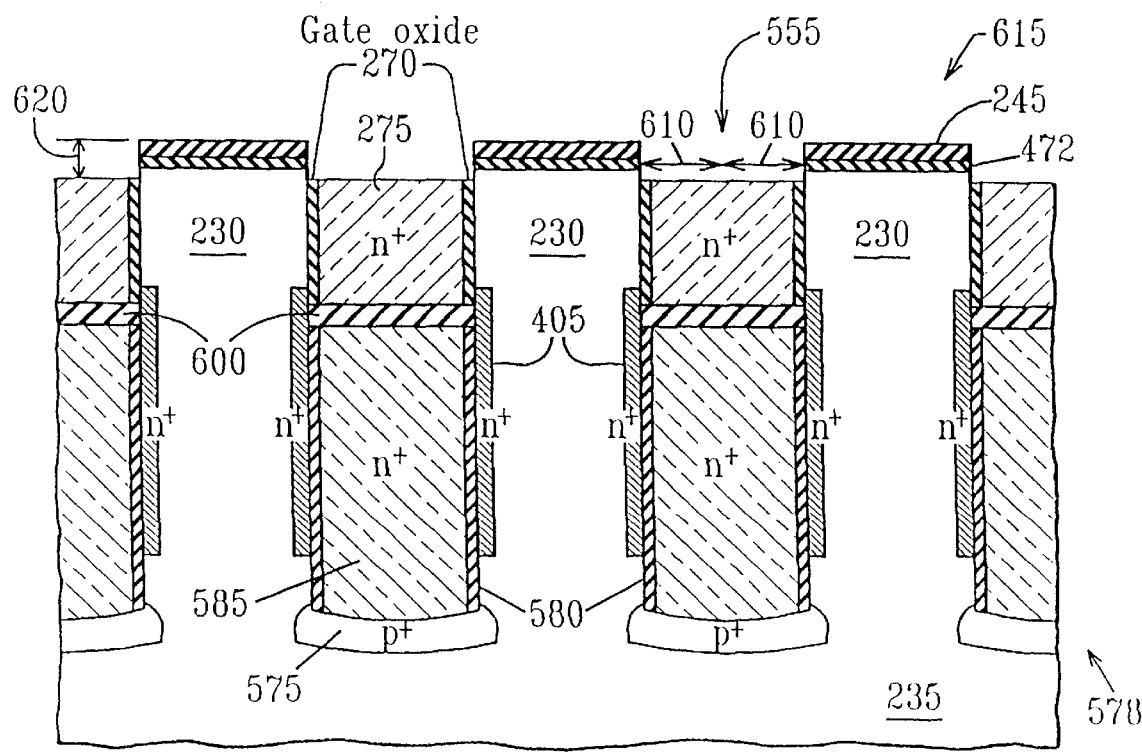

8) As shown in FIG. 41, a barrier oxide 600, having a thickness of approximately 50 nm for example, is deposited on the wafer and recessed into the trenches 555. This oxide 600 covers the n+ polysilicon capacitor plate 585 to isolate it from the vertical FET gate polysilicon 275 which is formed subsequently. Note that the n+ diffusion region 405 extends beyond the barrier oxide 600 to ensure that no underlap occurs for the vertical FET. The recessing step may include a chem-polish or resist deposition step to achieve a more planar barrier oxide 600. However, lithography is not needed.

9) The gate oxide 270 for the vertical FET is grown around the exposed pillars' sidewalls located above the barrier oxide 600.

10) the actual control gate material 275, (e.g., in-situ doped N-type polysilicon, in the case where the substrate 235 and pillars 230 are P-type), is deposited with a thickness 610 of just over 0.5F extending away from the pillars 230. This ensures that the polysilicon gates 275 are shorted between devices along a wordline (to form a continuous electrical connection), while allowing them to be separated by subsequent RIE etching between parallel wordlines (in the bitline direction) due to the greater spacing in the wordline direction.

11) All layers of the gate stack 615 (i.e., the gate oxide and gate layers 270, 275) are then RIE etched to separate the wordlines, and to recess the whole gate stack 615 slightly below the top of the pillars. The etch depth 620 of the gate stack recess is slightly larger than the combined thickness of the nitride and pad oxide islands 245, 472.

Figure 42:
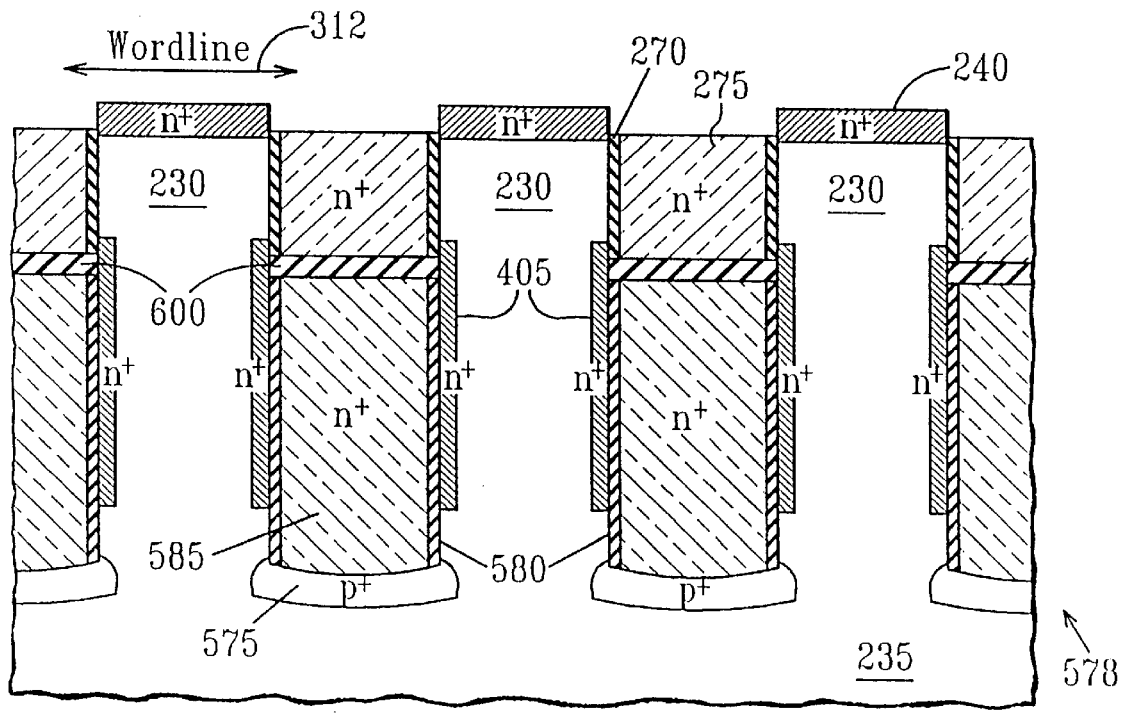
Figure 43:
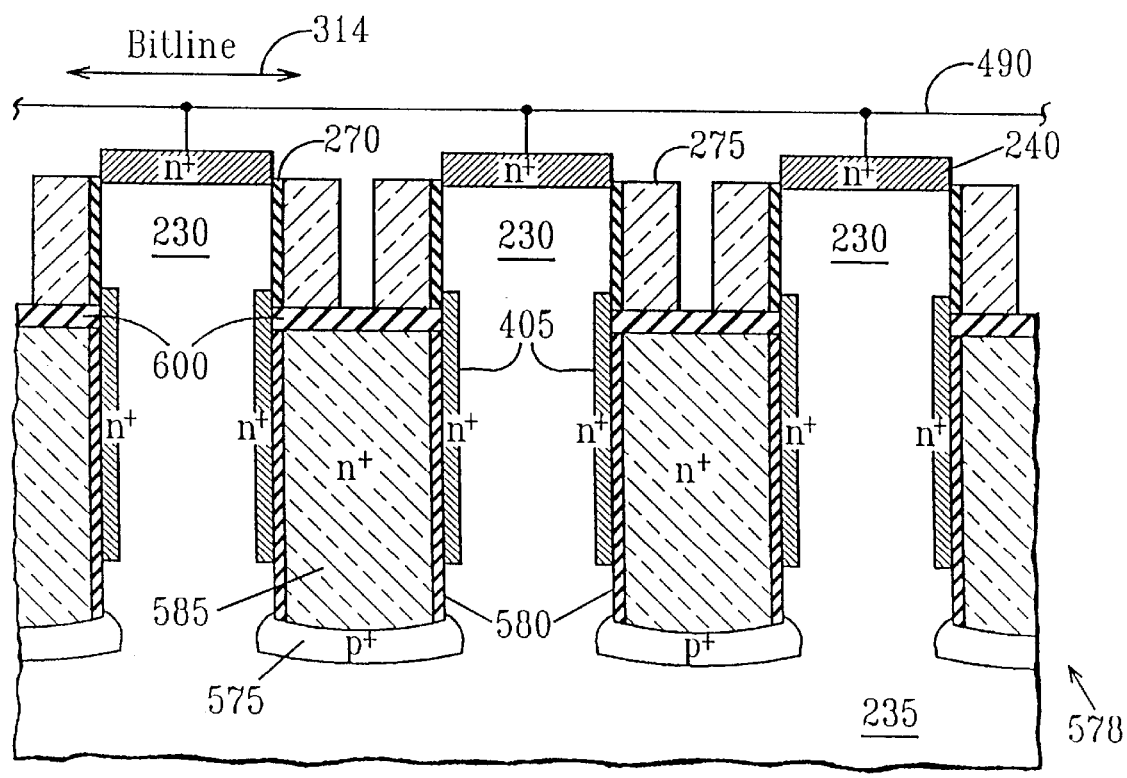

As shown in FIGS. 42–43, final processing steps, which are integrated with the processing steps of support structures outside the memory array, are completed by removing the nitride islands 245 located on top of the pillars 230; implanting n+ drain regions 240 on each pillar 230; and connecting bitline metal 490 along each bitline. The bitline metals 490 are perpendicular to the wordlines. Note that, in the open/folded case shown in FIG. 40, the bitline metals 490, which act as bitline "trues", are parallel to the poly spacer bitline "complements" 595, which are buried at the lower sidewalls of each pillar.

Figure 44:
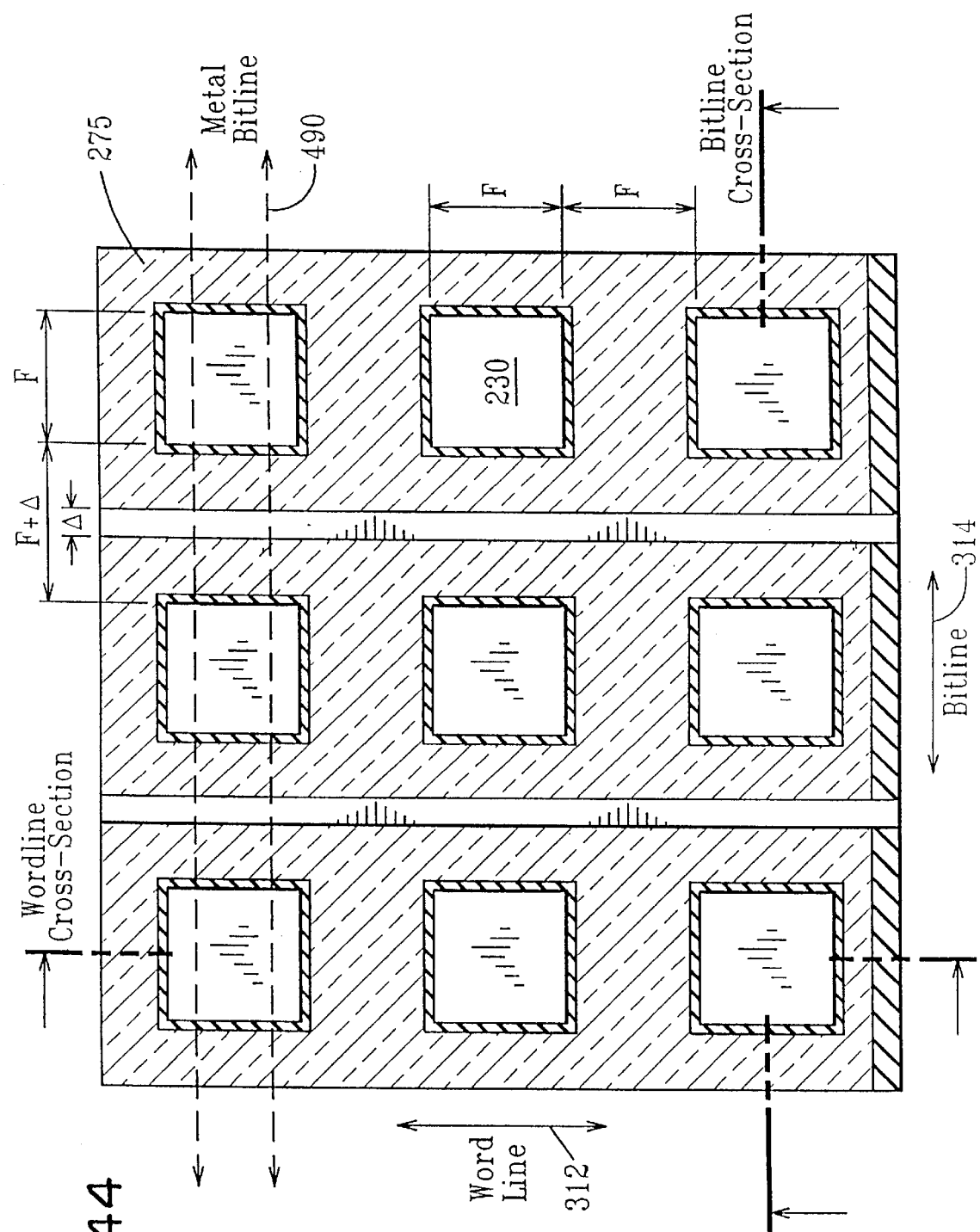

As shown in FIG. 44, the area taken up by each cell, which includes the area of the pillar 230 and the spacing between the pillars 230, is slightly over $4F^2$. The additional area is due to the delta ($\Delta$) necessary for separating the wordlines 275. This delta ($\Delta$) is as small as lithographic tolerance allows. It is also possible to obtain a truly $4F^2$ cell, or smaller, if sub-lithographic techniques are used.

In the open bitline case just described, where a general overview is shown in FIG. 7, the polysilicon capacitor plate 585 of the trench capacitor 578 is common to all the cells in the array. Illustratively, the common capacitor plate 585 is held at a constant voltage, such as ground. With the metal 490, this creates a standard open bitline architecture, where the metal 490 connects the tops of the pillars and acts as the bitline, and the polysilicon gate 275 acts as the wordline. Note that the charge is stored on the n+ diffusion 405 within each pillar, and that n+ diffusion regions 405 are separated from each other. Thus, each pillar 230 has its own n+ diffusion region 405, which is isolated from n+ diffusion regions 405 of all adjacent pillars.

Alternatively, the roles of the n+ diffusion 405 and the n+ polysilicon 585 which form the trench capacitors at the base of the pillars may be reversed. In this case, the n+ diffusion 405 may be interconnected to serve as the capacitor plate, and the charge is then stored on the individual n+ polysilicon sidewalls 585 surrounding each pillar. In this case, the n+ polysilicon 585 of each pillar is isolated from that of the other pillars in the array.

In the open/folded case shown in FIG. 40, the polysilicon capacitor plate 595 is not common to all the cells of the entire array. Rather the polysilicon capacitor plate 595 is only common along each bitline column. In the open/folded case, the buried poly spacer 595 serves as a "bitline complement", while the metal bitline 490 (FIG. 43) on top of the pillars is the "bitline true".

As discussed in Hamamoto, the open/folded architecture, where the voltage on both the true and complement bitlines are varied, gives twice the sense voltage for the same amount of charge stored on the capacitor. This is advantageous and increases sensitivity. As capacitance values continue to drop with scaling down to smaller sizes, the charges stored on the scaled down capacitors are reduced. The open/folded architecture allows proper sensing of these smaller gates charges stored in the capacitor. The open/folded architecture also gives an increased tolerance to noise, which is often cited as a drawback to the purely open bitline design.

Figure 45:
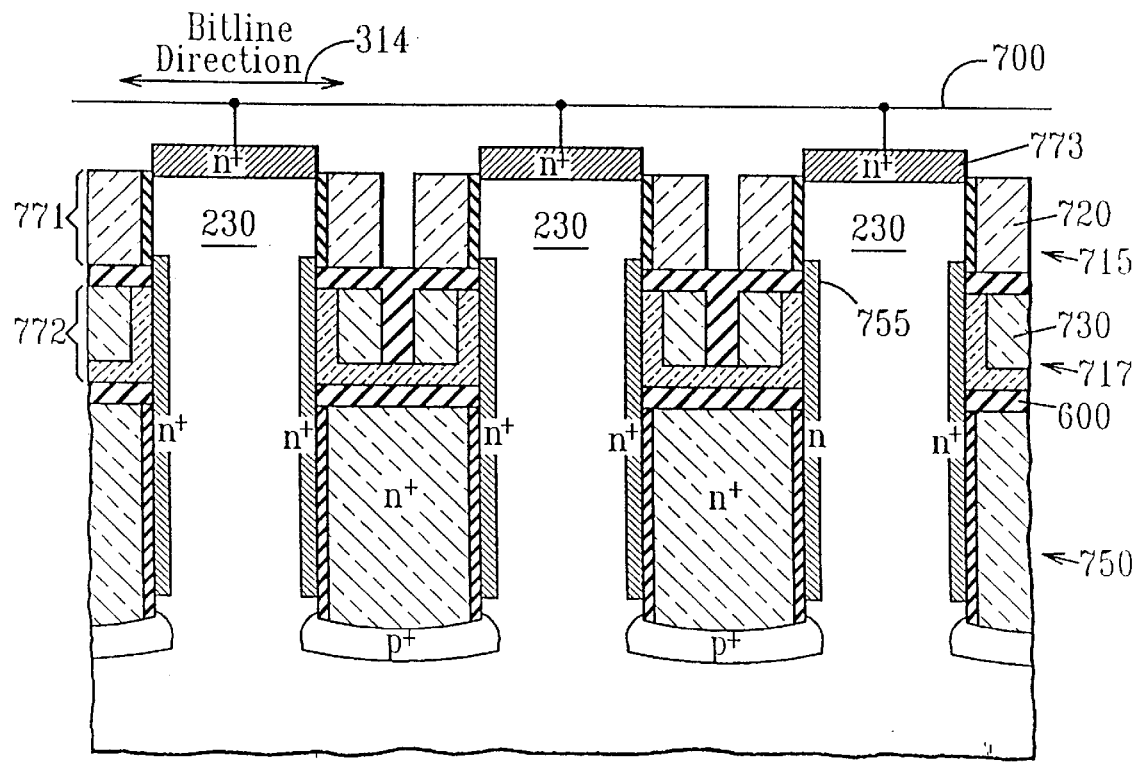
FIGS. 45–50 show a method of forming an array of memory cells each having a trench capacitor for a folded bitline architecture according to another embodiment of the present invention.
Figure 46:
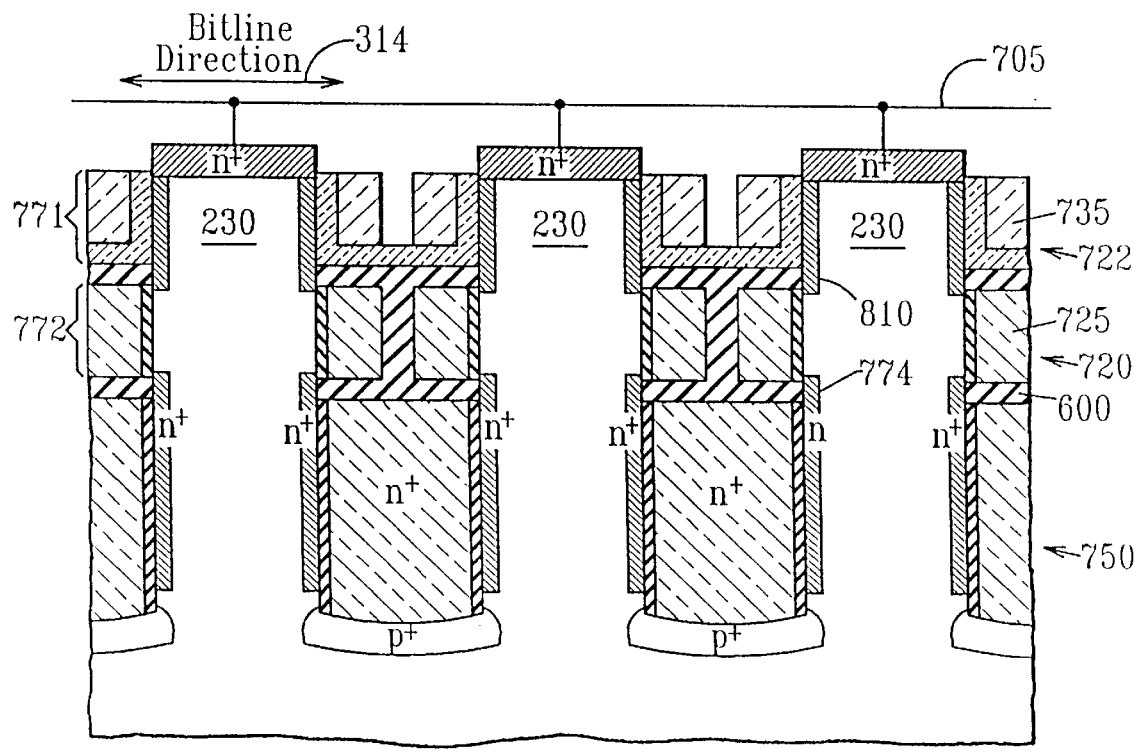

FIGS. 45, 46 show cross sections along the bitline direction of another embodiment of a folded bitline architecture. FIG. 6 shows a conventional folded bitline architecture. This is achieved by extending the process flow of the DRAM with the trench capacitor previously described. FIGS. 45, 46 show cross sections of adjacent bitlines 700, 705 of a cell array configured in a folded bitline architecture. For the folded embodiment, two transistors are fabricated on the top of each pillar 230, above the deep trench storage capacitor.

For each pillar 230, one transistor acts as the "active" transfer device for access to the charge stored on the capacitor, while the other transistor is a "passive" dummy transistor. In FIG. 45, the upper transistor 715 is active, while the lower transistor 717 is passive. FIG. 46 shows a bitline 705 which is adjacent to the bitline 715 of FIG. 45. In FIG. 46, the lower transistor 720 is active, while the upper transistor 722 is passive. Hence, only one of the two poly wordlines of each cell (720 of FIG. 45 and 725 of FIG. 46), crossing each pillar 230, is an "active" wordline capable of accessing the cell, while the other wordline (730 of FIG. 45, and 735 of FIG. 46) is a "passing" wordline which has no effect on the cell.

By alternating which transistor (i.e., the upper or lower device) is active on adjacent pillar bitline columns 715, 720, a folded bitline architecture is achieved, without increasing the cell size above the normal 4F-square area. Note that in FIGS. 45, 46, where the cross-sections are taken parallel to the bitline direction 314, all the active devices are either on the upper or lower wordline. In contrast, the cross-sections along the wordline direction 312, shown in FIGS. 47–50 that accompany the process flow to be described, the active devices alternate between upper and lower locations along each wordline.

To fabricate this pillar structure with alternating active and passive devices, the process steps 1–8 described in connection with FIGS. 36–44 for the open bitline configuration, is continued. Because two transistors are formed over the trench capacitor, instead of a single transistor, the deep trench etch performed in step 3, to define the pillars, is increased by approximately 0.5 µm to allow for a longer pillar height. This accommodates the additional transistor gate length. Except for this deeper etch in step 3, the process flow is identical to the previously described steps 1–8.

Figure 47:
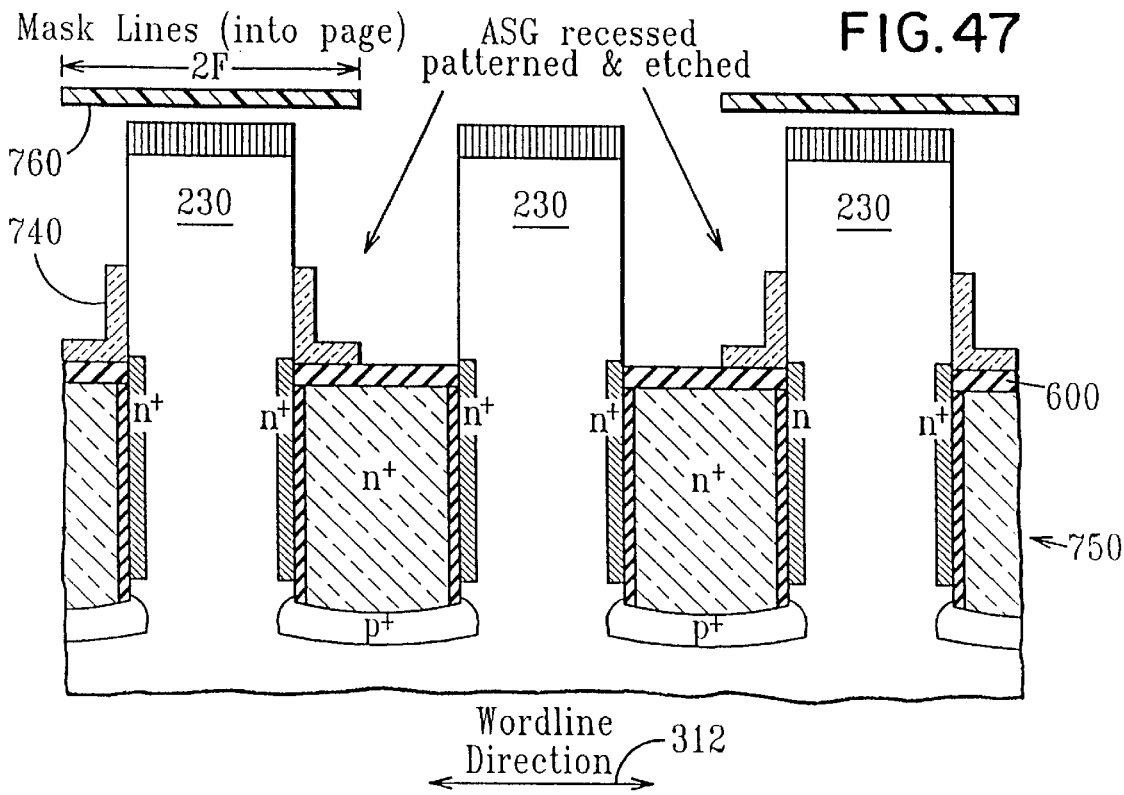

After step 8, processing continues as follows, where in lieu of steps 9–11, the following steps are performed, designated by primed numerals:

9') As shown in FIG. 47, which is a cross section along the wordline direction 312, a layer of ASG 740 is deposited on the wafer. The ASG layer 740 is recessed into the trenches so that it extends up the pillars to the top of what will become the lower transistor. The ASG 740 serves a dual function. First, some of the As from the ASG layer 740 diffuses into the pillar 230 during subsequent hot processes. This connects the deep trench capacitor 750 to the source 755 (FIG. 48) of the upper active transistor. Second, the ASG layer 740 decreases the capacitance between the lower wordline poly 730 of FIG. 45 (and 725 of FIG. 46) and the adjacent lower dummy devices located on alternating pillars.

Figure 48:
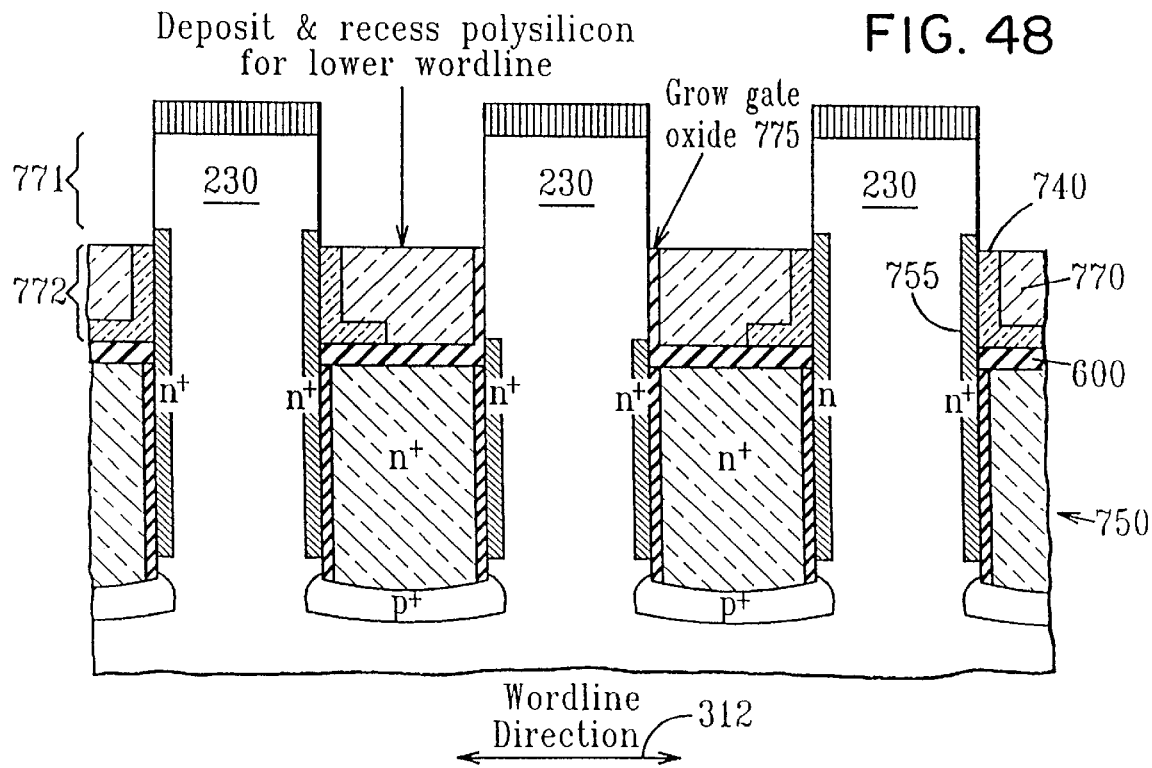

In FIGS. 45–46 and 48, the upper transistor region is referenced by numeral 771, while the lower transistor region is referenced by numeral 772. FIGS. 45 and 48 show the source 755 of an upper transistor, while FIG. 45 shows the drain 773 thereof. FIG. 46 shows the source 774 of a lower transistor, and FIGS. 46, 50 show the drain 810 thereof.

10') The ASG layer 740 is removed from alternating bitline rows by photo lithographic patterning and RIE etching. As shown in FIG. 47, a lithographic mask 760, used in this etching step, has lines that are parallel to each other and to the bitline direction 314 (FIGS. 45, 46). The mask lines 760 are aligned (non-critically) to the pillar array. The mask lines 760 each have a width 2F, and are spaced 2F apart. The pillars 230 which are left with this lower ASG collar 740, have the dummy transistors in the "lower" position. Hence, the lower poly wordlines 770 (FIG. 48) will be the passing wordlines.

11') As shown in FIG. 48, a gate oxide 775 is formed over the pillar sidewalls that are not covered by the ASG collar 740. The trenches are filled with polysilicon to form a polysilicon wordline 770 for the lower transistors. The gate oxide 775 and polysilicon wordline 770 are formed using the same basic process steps described above and referenced as steps 9–11 of the DRAM/trench capacitor fabrication process. The gate oxide 775 and poly wordline 770 are recessed in this case to the top of the lower ASG collar 740. This allows space on the pillar for the upper transistor, which is fabricated next.

Figure 49:
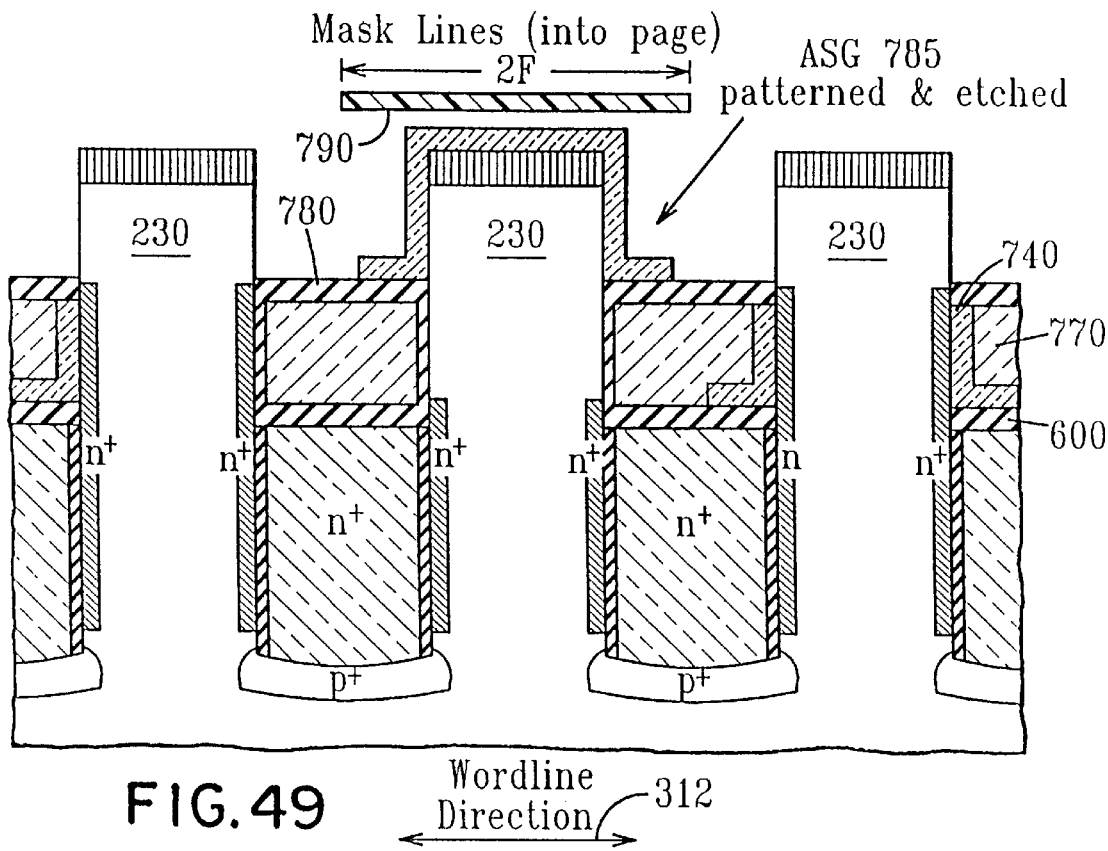
Figure 50:
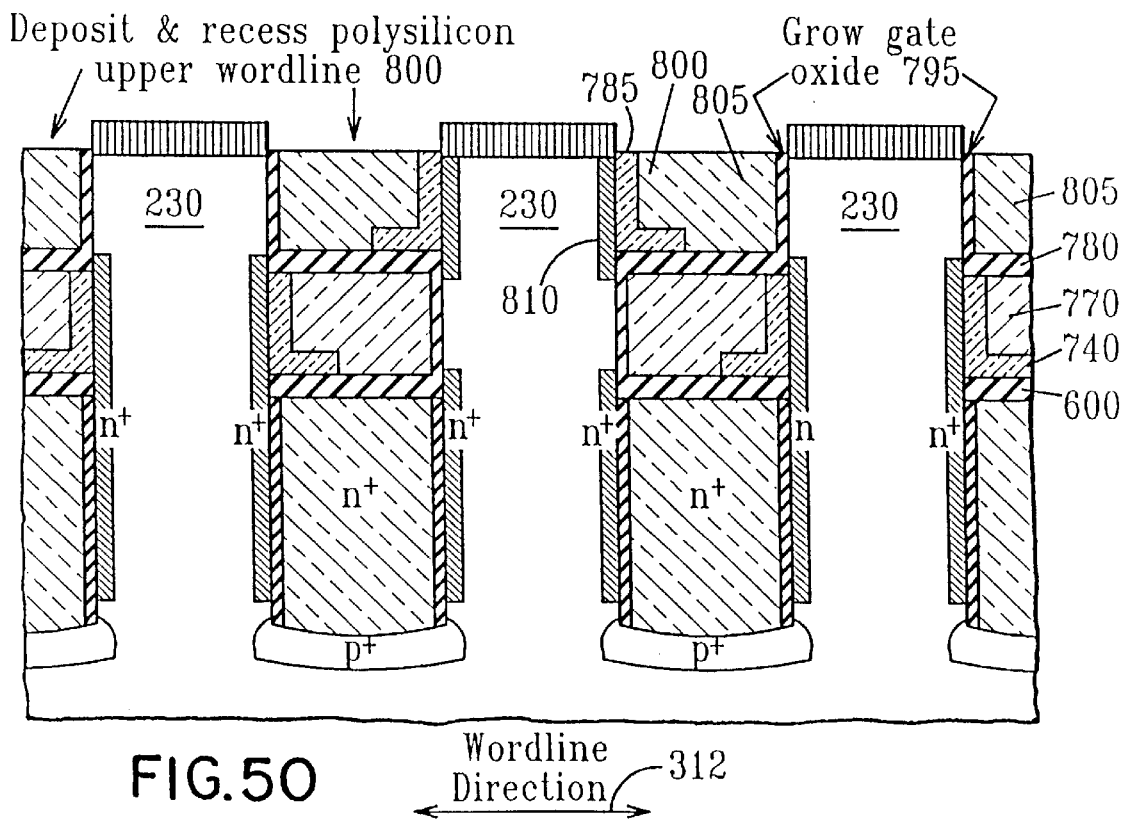

12') As shown in FIG. 49, a second barrier oxide 780, having a thickness of approximately 50 nm, for example, is deposited and recessed into the trenches to insulate the lower poly wordline 770 from subsequently formed upper poly wordline 800 (FIG. 50). The second barrier oxide 780 is formed similar to the first barrier oxide 600, described in step 8 of the DRAM/trench capacitor fabrication process.

13') A second layer of ASG 785 is deposited on the wafer. This second ASG layer 785 is patterned and RIE etched so that it will remain on alternating pillars which do not already have a lower ASG collar 740. A lithographic mask 790 is used, which is similar to the lithographic mask 760 of FIG. 47, where the lithographic mask 790 has lines of width 2F, with 2F spacing running parallel to the bitline direction. However, the mask 790 is offset by 2F from the mask 760 (FIG. 47) used in step 10'. The pillars which have this upper ASG collar 785, have the dummy transistors in this "upper" position.

14') As shown in FIG. 50 and similar to the description of step 11', an upper gate oxide 795 is formed on exposed sidewalls of the pillars not covered by the upper ASG collar 785. The trenches between the pillars are filled with polysilicon (poly). The poly surrounding the upper ASG collar 785, act as passing poly wordlines 800, while the poly surrounding the upper gate oxides 795 are active poly wordlines 805. Note, as shown in FIGS. 45, 46, the poly wordlines are separated from each other along the bitline direction 314.

In addition, the drain 810 of the lower transistor is formed by outdiffusion from the second ASG layer 785. Final device processing steps, including the drain implant, are performed, using the same process steps described above in steps 9–12 of the DRAM/trench capacitor fabrication process.

The final structure, shown in FIGS. 45–46 along the bitline direction 314 and in FIG. 50 along the wordline direction 312, offers all the features described for the open bitline architecture, including the minimum-sized cell area. In addition, the final structure offers the added advantages of the folded bitline architecture, additional noise immunity and relaxed-pitch sense amplifier design.

For use in other applications, this same process can be used for fabrication of pillars with stacked transistors (two or more), without the deep trench storage capacitor at the base of the pillars.

Figure 51:
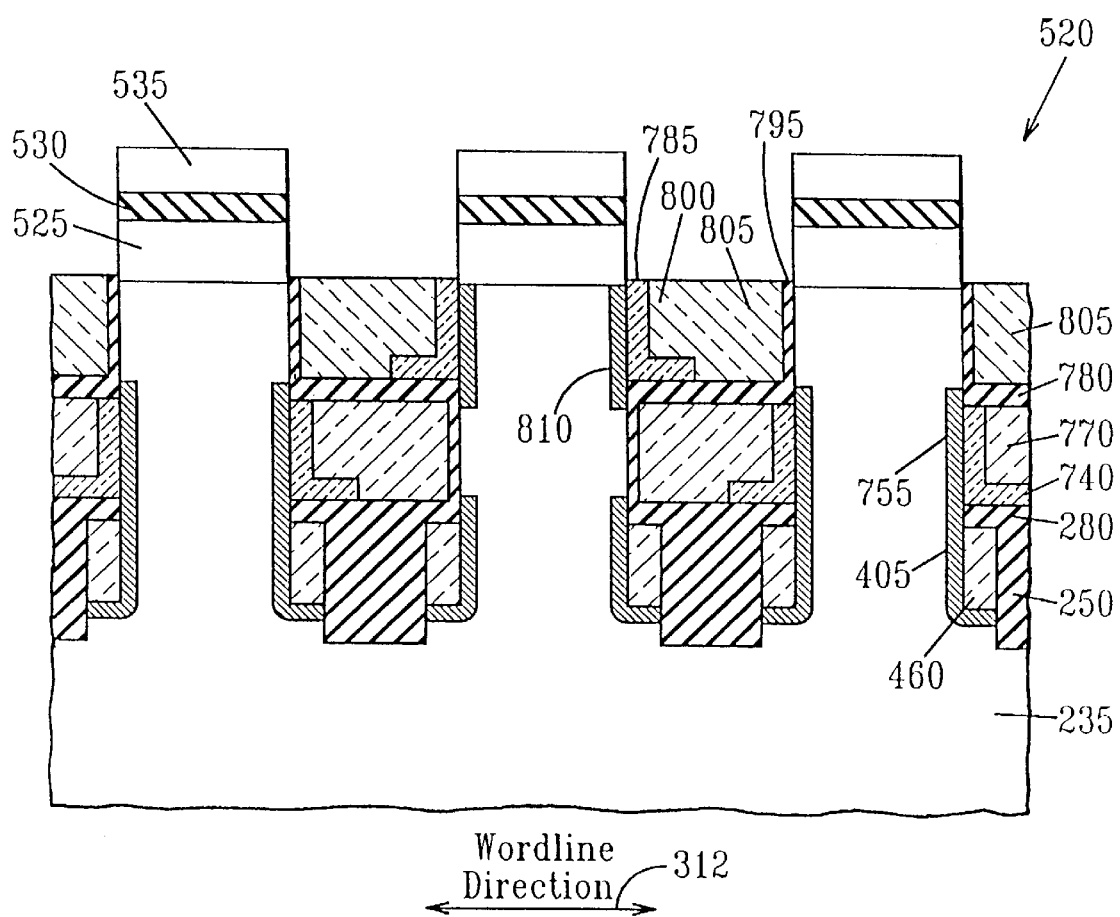
FIGS. 51 shows a cross section of memory cells each having a stack capacitor for a folded bitline architecture according to another embodiment of the present invention.

Instead of a trench capacitor, another embodiment includes forming a folded bitline architecture having a stack capacitor, formed on top of the pillars, for charge storage as described in connection with FIGS. 27–35. In this case, two transistors are fabricated on each pillar, to form active and passing wordlines with a buried, diffused bitline below the lower transistor, for accessing charge in the stack capacitor located above the pillars. This configuration is an inversion of the deep trench configuration described in connection with FIGS. 36–50, and is shown in FIG. 51. The actual stack capacitor structure 520 may vary from that shown in FIG. 51, as described in connection with FIGS. 34 and 35.

$2F^2$ Memory Cell

As an overview of the above embodiments, dense arrays of vertical pillars etched on Si substrates, such as the array 500 shown in FIG. 27, are used as the base structures for various memory cells. One advantage of these arrays is the small area each memory cell requires on the wafer, independent of the gate length of the transistor. This is crucial for reaching the high density necessary for gigabit memory chips, while maintaining reasonable bitline voltage and low device leakage.

By using the two etch process, such as steps III and V described in connection with FIGS. 13–14 and 8, or step (b) and (f) described in connection with FIGS. 17–22, square pillars of size F×F (where F is the minimum achievable lithographic line width) are fabricated, with an inter-pillar spacing of only F along the wordline direction. The inter-pillar spacing along the bitline direction is F+$\Delta$, resulting in a memory cell having a size of $4F^2+2F\Delta$.

This method also achieves a self-aligned, buried, diffused bitline under each cell column, which may be strapped with polysilicon to reduce the resistance. In addition, self-aligned polysilicon wordlines are formed perpendicular to the bitlines.

Once these pillar arrays are formed, each pillar forms a transistor having two heavily doped regions at the top and bottom of the pillar. The wordline poly is the gate electrode wrapped around the pillar body between the top and bottom heavily doped regions. Note that the effective width of these transistors is the circumference of the pillar, i.e., 4F, since the gate poly wraps around each pillar entirely.

In one of the previously described embodiments, if the gate stack includes a floating gate structure embedded in a dielectric material, such as silicon oxides that form tunnel and gate oxides around the floating gate, the memory cell is complete as is. In this embodiment, the memory cell operates as an EEPROM or Flash memory device, for example. As previously described in other embodiments, a DRAM cell is formed where the pillar transistor is used as a transfer device for either a stack capacitor, or a deep trench capacitor, without increasing the footprint thereof.

Figure 52:
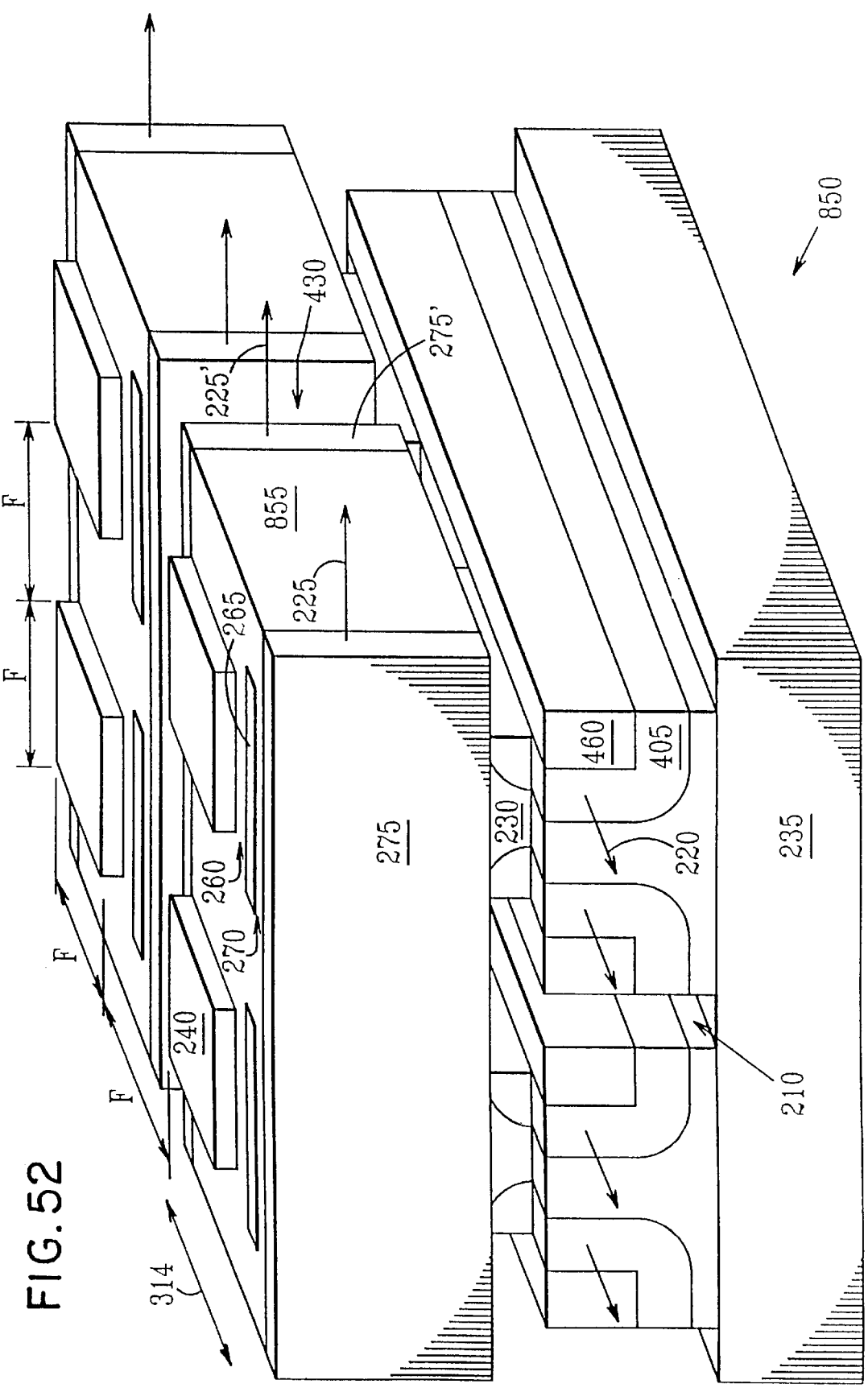
FIG. 52 show an array of memory cells having two transistors per pillar according to another embodiment of the present invention.

FIG. 52 shows an array 850 of memory cells in accordance with another embodiment which augments the previously discussed embodiments. In contrast to the arrays 420, 500 of FIGS. 16, 27 where pillars along the wordline direction have a single wordline 225, two wordlines 225, 225' are formed for the pillars arranged in the wordline direction.

The two wordlines 225, 225' are separated by an insulator or dielectric 855, such as oxides or other material depending on the application. The oxide 855 is formed within the inter-pillar space between the two wordlines 225, 225' prior to the wordlines 225, 225' formation, as will be described in the process flow below. The wordlines 225, 225' are the control gates 275, 275' of two transistors formed per each pillar, and are formed on pillar sidewalls which are opposite each other in the bitline direction 314.

Unlike previously described embodiment, when the two gates 275, 275' are formed, they no longer encircles each pillar. Instead of forming a single gate around each pillar, two gates 275, 275' or wordlines 225, 225' are formed along two opposite sides of the pillars arranged in the row or wordline direction 312. This has several advantages applicable to the previously described cell designs.

One advantage is a decrease by almost a factor of two of the overall capacitance of the wordline. The capacitance decrease is due to reduction in half of the effective device area. This reduces the wordline time delay significantly. Although the effective width of each wordline 225, 225' is decreased, any resulting increase in resistance can be compensated by conventional silicidation techniques.

Another advantage is that the inter-pillar spacing in all directions is F. That is, the additional spacing delta (Δ) between gates 275 along the bitline direction, shown in FIGS. 16, 27, is reduced to zero. Elimination of the additional spacing delta is achieved without deleterious effects, since the gates or wordlines of adjacent pillar rows are separated by controlling the thicknesses of the poly gates. These gate thicknesses are independently adjusted to assure that there is no shorting between wordlines. As such, no additional lithography is needed to separate the wordlines, despite the elimination of the spacing delta. This results in a true 4F-squared cell size.

Yet another advantage of this design, which is particularly important to arrays having a floating gate structure, is having the dual wordlines 225, 225' per wordline or row pillars, i.e., per pillars along the wordline or row direction 312. Each row pillar now has two wordlines 225, 225' on it, one on each side. While these two wordlines 225, 225' may be used as one wordline for the capacitor DRAM cells, each wordline 225, 225' may be contacted independently at the perimeter of the memory array.

With a properly isolated floating gate 265 located between each pillar and control gate 275, each pillar comprises two memory cells. This is in contrast to the array 420 of FIG. 16, where each pillar has one transistor.

One portion of the oxide fill 855 located between the control and floating gates 275, 265 acts as a gate oxide 270, while another oxide fill portion located between the floating gate 265 and pillar acts as a tunnel oxide 260. For other application using only the transistor (as opposed to a memory cell capable of charge storage), or a transistor with a capacitor, the floating gate 265 is dispensed with.

After gate formation is completed, isolation therebetween is achieved by removing material (either poly or oxide) located between the pillars along the wordline direction 312. Next, the exposed gate material (e.g., polysilicon) are oxidized and remaining voids are filled with the oxide fill 855. This isolates the floating gates 265 of each transistor.

Each of the two cells on a pillar has its own wordline and floating gate for charge storage. The two cells or transistors, formed on opposite sides of each pillar, share bitlines 220. This effectively reduces each memory cell area to 2F-square, which is half the size of previously described cells, used as EEPROM or Flash memory for example.

By achieving this higher density at a lithographic linewidth of F=0.18 μm, (which is a typical value for Gigabit memory), up to 1 giga-byte (Gbyte) of data may be stored in a six square-cm (6 cm$^2$) area. Even with additional overhead of support circuitry, up to 4 gigabytes of data is easily stored on a credit-card size area. This makes the memory array 800 very competitive with even magnetic disk drive storage.

It should be noted that the 2F-square cell size may also be used with the stack and trench capacitors described in connection with FIGS. 33–51.

An exemplary process flow which implements pillar formation and isolation is describe below. Note that this process flow implements many of the features of the previous embodiments. All steps here assume formation of NMOS devices on a P-type substrate, but a similar procedure could be used for PMOS devices on an N-type substrate. Also, sample thicknesses and depths are given, assuming F=0.18 μm.

1) As described in connection with FIGS. 17–18, nitride is deposited across the wafer, and patterned in parallel lines across the array region. These nitride lines 290 have width and spacing F, and define the pillars for the vertical MOS devices along the bitline direction 214.

2) Etching, e.g., RIE, is used to form a shallow trench 210 between these nitride lines 290. These trenches are referred to as bitline (or column) trenches, since they are along the bitline (or column) direction 314. Illustratively, the bitline trenches have a depth 455 of approximately 700 nm. This etch depth is deep enough to contain the expected drain implantation depth, the desired gate length, and the buried bitline diffusion.

3) N+ polysilicon (poly) 460 is formed to be conformally deposited on the wafer, up to a thickness of 60 nm for example. The 60 nm thick poly 460 lines the bottom and sidewalls of the bitline trenches 210. This poly layer 460 is then etched back to recess it into the trenches 210, leaving sidewall formations that extend a distance 462, which is approximately 250 nm, up the sidewalls of the trenches 210. Some poly 460 may remain on the bottom of the trenches 210. If necessary, resist coating is used during this etchback. However, no additional lithography is required.

4) An additional etching, e.g., RIE, step is performed to etch through the poly 460 located on the bottom of the trenches 210, and to etch into the Si substrate 235. The resulting structure along the wordline direction is same as shown in FIGS. 20. The cross section along the bitline direction 314 remains the same as shown in FIG. 18. This is because the top nitride layer 290 is in the form of parallel strips, (as opposed to nitride islands 245 shown in FIG. 21). Therefore, wordline trenches are not etched along the wordline direction 312, which is perpendicular to the bitline direction 314.

This additional etching separates the bitlines 405 between adjacent columns of pillars, i.e., between adjacent pillars along the wordline direction. Note that during subsequent heat cycles, dopant will diffuse out from the poly 460 into the Si pillars 230 to form the diffused bitlines 405.

Figure 56:
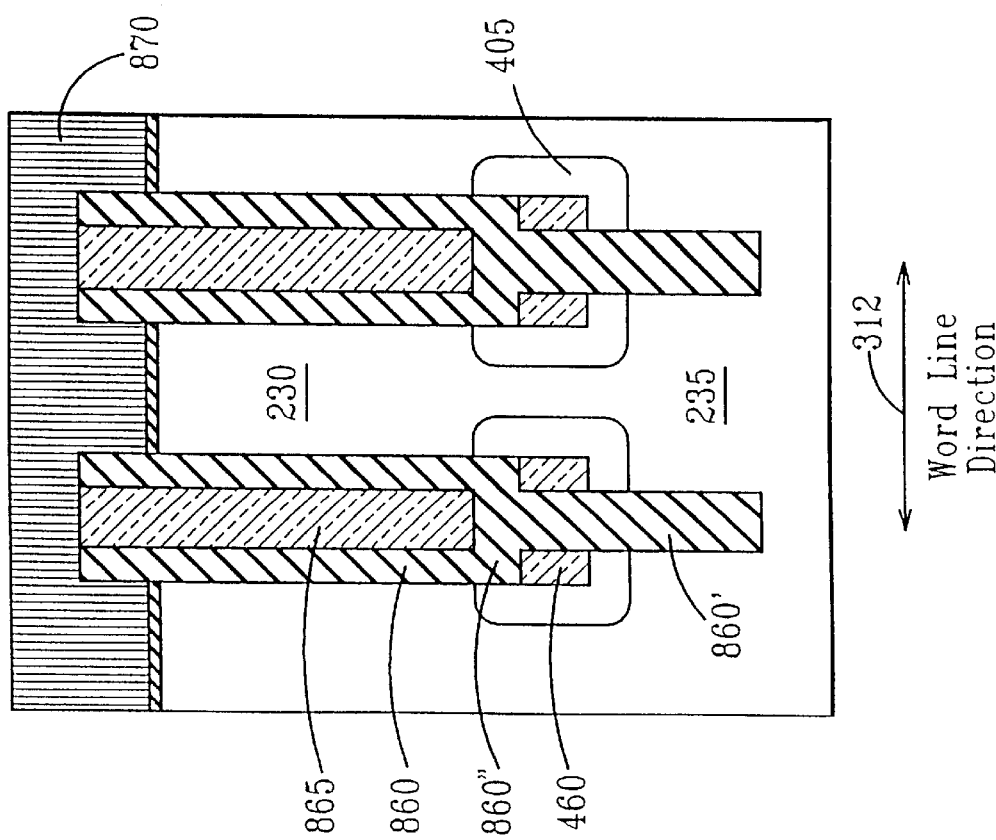

5) As shown in FIG. 53, the bitline trenches 210 are all filled with oxide 857, and the wafer is chemical-polished back to a planar surface, using the remaining nitride 290 as a stopping layer. The filled bitline trenches are designated as reference numeral 210'. As shown in FIG. 56, after the chemical-polishing, an additional layer of nitride 870 is deposited on the wafer.

As mentioned earlier, other materials besides the oxide fill 870 can be used for this fill. As shown in FIG. 54, if the material in the filled bitline trenches 210' will be removed in subsequent steps for floating gate isolation, another choice would be to line the trenches with an oxide liner 860, followed by a polysilicon fill 865.

One advantage of using the polysilicon fill 865 is that it can be easily etched selective to oxide and nitride during a subsequent removal or etch step. The remaining steps are described where polysilicon fill 865 is used. Except where noted, these remaining steps are identical for both oxide/poly filled trenches, as shown in FIG. 54, and purely oxide filled trenches, as shown in FIG. 53.

FIG. 55 shows a top view of the memory cell array structure shown in FIG. 54. The bitline nitride strips 290 cover the substrate 235 as shown in FIG. 18. In FIG. 55, the diffused $n^+$ regions 405, which are located in the substrate 235 below the nitride strips 290, are shown as dashed lines extending along the bitline direction 314. The filled bitline trenches 210' between the nitride strips 290 contain the oxide liner 860 and polysilicon fill 865.

Figure 57:
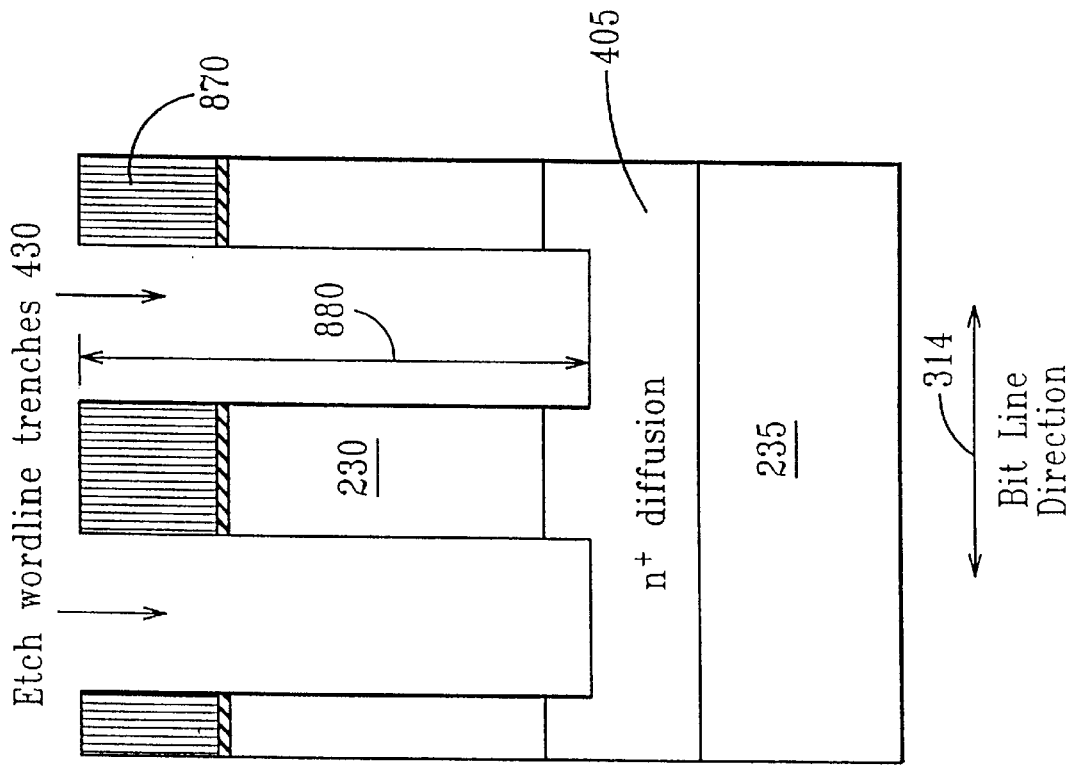

6) Next, an additional nitride layer is formed over the wafer. As shown in FIGS. 56–57, in order to complete pillar definition and form the wordlines, the nitride layer is patterned into nitride strips or lines 870 which are parallel to the wordline direction 312. The nitride lines 870 have a width F, are spaced from each other by a distance F, and are perpendicular to the filled bitline trenches 210'.

Note that along a wordline direction 312, when the nitride is etched, there will now be alternating sections of oxide 860 and Si forming the pillars 230. The oxide liner 860 extends above the Si pillars 230 by an amount equal to the thickness of the first nitride deposition, minus any loss resulting from the nitride etch. This oxide extension is subsequently planarized.

7) As shown in FIG. 57, etching, e.g., RIE, is again used to etch wordline trenches 430, which are perpendicular to the filled bitline trenches 210' (FIG. 53). As shown in FIG. 55, forming the wordline trenches 430, along the wordline direction 312, requires etching through both oxide and silicon/polysilicon.

In particular, forming the wordline trenches 430 requires etching through: the oxide liner 860; the polysilicon 275 that fills the oxide lined bitline trenches 210; and the silicon pillars 230 that are exposed after patterning the nitride layer into wordline nitride strips 870 (FIG. 57). Note, the wordline nitride strips 870 are perpendicular to the bitline nitride strips 290 (FIG. 54).

Figure 58:
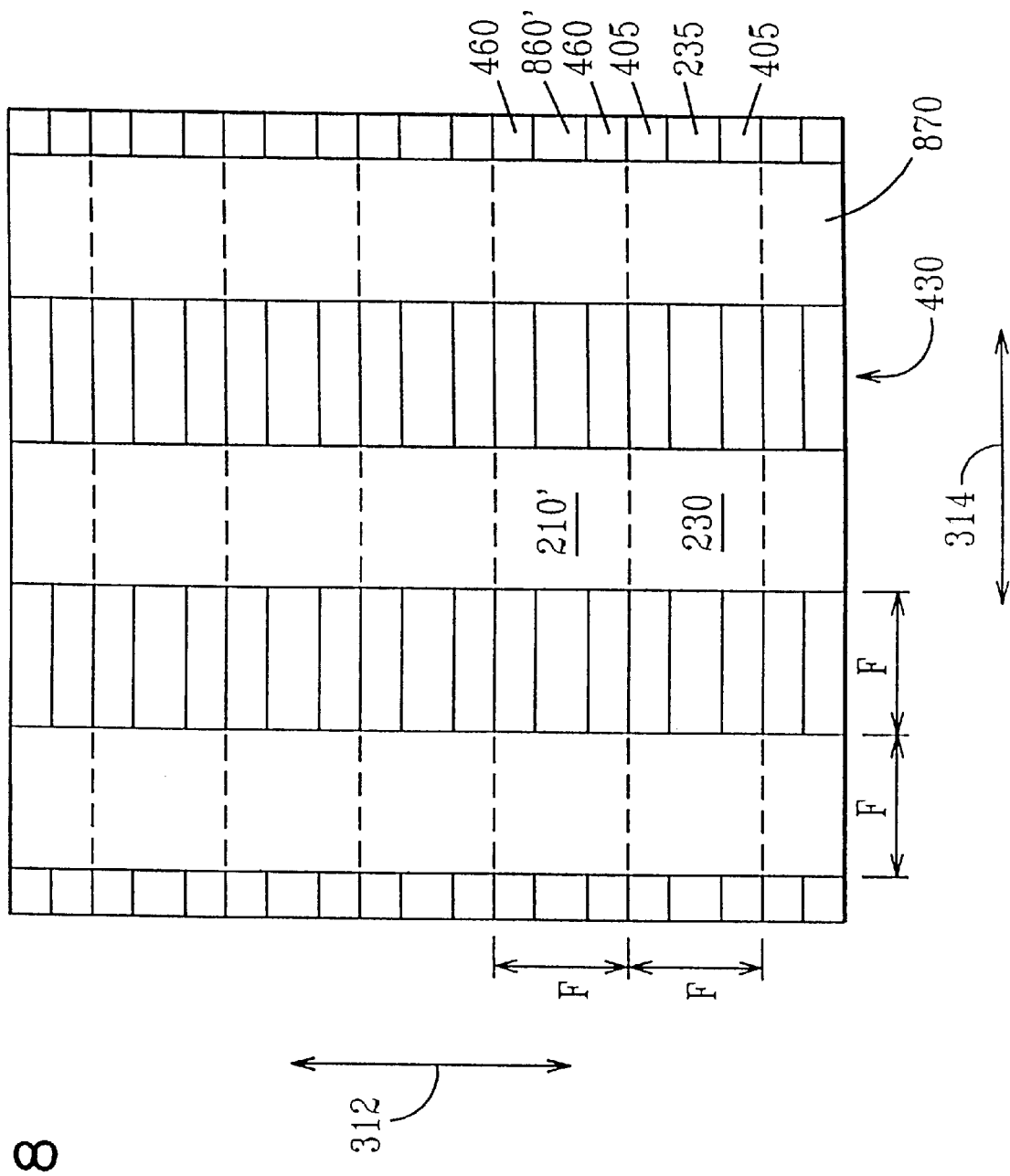

Due to the difficulty of etching these different material simultaneously, two approaches may be used:

(a) In the first approach, shown in FIGS. 56–58, wordline trenches 430 extending along the entire array are formed. Etching the wordline trenches 430 is performed by using an RIE chemistry that etches oxide and silicon, selective to nitride. This etches the oxide liner 860, the silicon of the pillar 230, and the polysilicon fill 865.

Although the depth of the etch may vary between the two materials, (oxide 860 and silicon of the pillar 230 or polysilicon 275,) the different etch depth does not effect final device structure or performance. This is because the step formed by the different height of the two materials, at the bottom of the wordline trenches, will be buried during a subsequent oxide fill.

As shown in FIG. 57, the depth 880 of this etch is set to reach just below the top of the diffused bitline regions 405, stopping on or near the buried bitline straps 460 (FIG. 56). Illustratively, the depth 880 is approximately 600 nm. Alternatively, the wordline trench etch may stop short of reaching the diffused bitline regions 405, leaving a layer of oxide 860 and/or poly filler 865 over the buried poly straps 460.

FIG. 58 shows a top view of the array structure after etching the wordline trenches 430 that extend along the entire array in the wordline direction 312. Etching the wordline trenches 430, exposes the $n^+$ diffusion region 405 located at the lower portions of the pillars, separated by the substrate 235 of the exposed lower pillar portion. In addition, the wordline trench etching step exposes the poly straps 460 and the lower portion 860' of the oxide liner 860 that fills the deep portion of the bitline trenches located between the poly straps 460. This oxide liner lower portion 860' is also shown in FIG. 56. Below the wordline nitride strips 870, the pillars 230 separated by the filled bitline trenches 210' are shown in FIG. 58.

(b) The second approach, uses an RIE chemistry that etches only Si (which includes polysilicon), selective to both oxide and nitride. The etch depth is the same as above, i.e., approximately 600 nm. Because the oxide liner 860 is not etched, the resulting wordline trenches 430', shown in a top view in FIG. 59, contain square and rectangular holes 890, 895 shown by dotted lines. These holes are separated by the oxide liner 860, which acts as walls of the holes 890, 895.

The square holes 890, which have a size of F×F, result from etching the exposed silicon of the pillars that are not covered by the wordline nitride strips 870. The pillar etching exposes the $n^+$ diffusion regions 405, as shown at the bottom of the holes 890 of FIG. 59. Within each square hole 890, the $n^+$ diffusion regions 405 are separated by the substrate 235.

The rectangular holes 895 result from etch or removal of the poly fill 865 shown in FIG. 56. These holes 890 are located between the oxide walls 860, on the opposite sides of the $n^+$ diffusion regions 405. The widths of the rectangular holes 895 abut against the wordline nitride strips 870. The base of each rectangular hole 895 is the lower portion 860" of the oxide 860 that covers the poly straps 460 shown in FIG. 56. For clarity, only one pillar 230 and filled bitline trench 210' are shown below the wordline nitride strips 870. The pillars 230 and filled bitline trench 210' are delineated in FIG. 58, which has an identical structure below the wordline nitride strips 870 as those of FIG. 59.

The oxide walls 860 may be recessed if desired. However, for efficiency, it is preferable not to etch or recess the oxide at this point, since the oxide will be recessed in the next step to form an oxide barrier 900 shown in FIG. 60.

Figure 59:
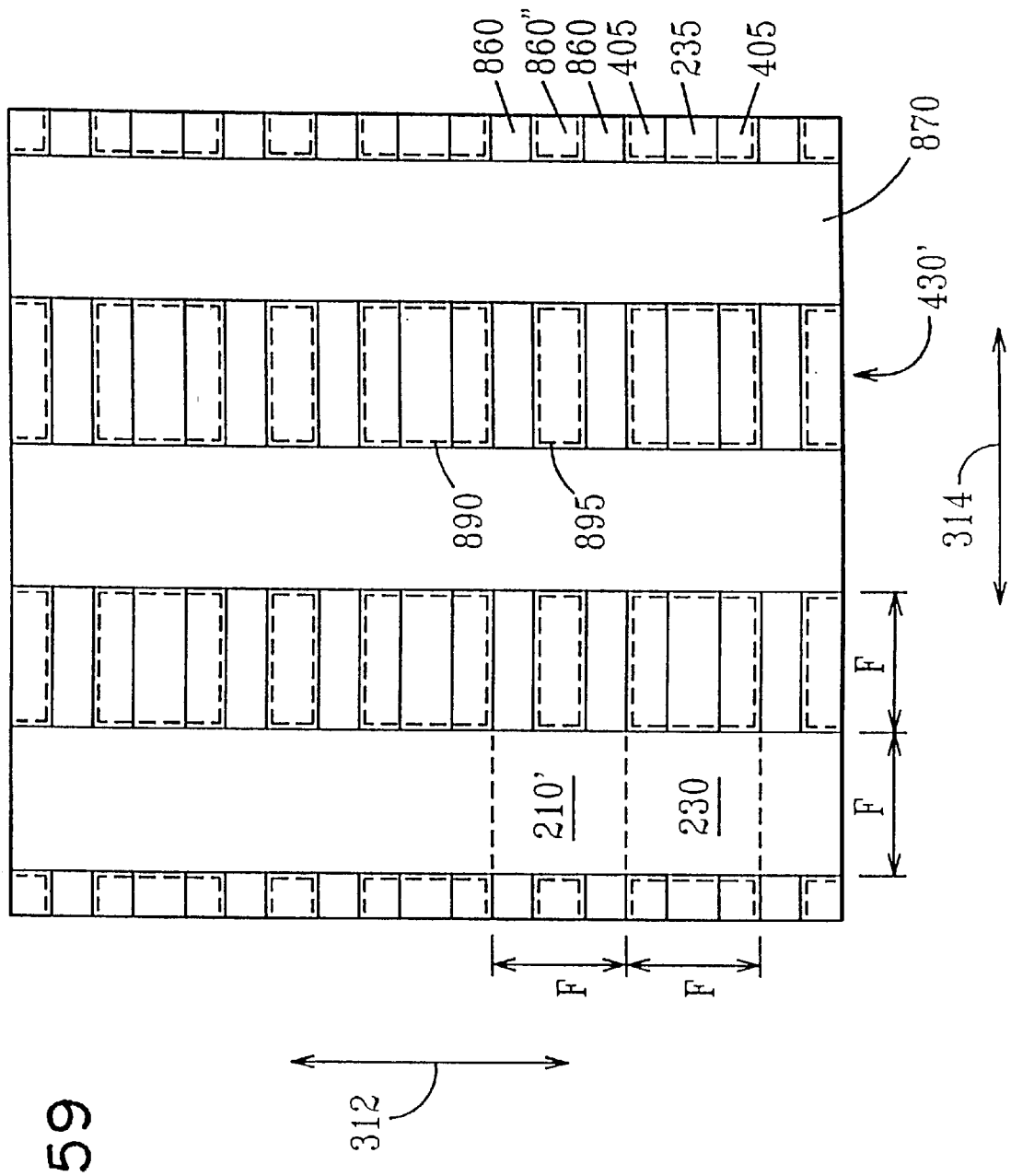

8) Regardless of the etch method (a) or (b) chosen above, the wordline trenches 430 of FIG. 58, or the holes 890, 895 of FIG. 59, are now filled with oxide. Next, the wafer is chem-polished back to achieve a planar surface, using the wordline nitride strips 870 as a stopping layer.

As shown in FIG. 60, the oxide in the wordline trenches 430 is then re-etched to a depth of approximately 560 nm. The oxide etch recesses the oxide fill approximately to the top of the diffused bitline regions 405. This leaves a planar oxide barrier layer 900 of about 40 nm thick, which separates the polysilicon wordlines or gates 275, to be formed, from the buried bitlines 405, 460 (FIG. 58). Note, FIG. 60 is the cross section along the bitline direction 314, while FIG. 56 remains the cross section of the array at this point of fabrication, along the wordline direction 312.

9) As shown in FIG. 61, and previously described, a gate stack is formed along the wordline trenches 430 by growing the desired gate stack and depositing the polysilicon gate/wordline 275. These gate stacks are recessed below the top of the pillars to allow for drain implantation. The gate stack shown in FIG. 61 is similar to the one shown in FIG. 26 and includes a floating gate 265, which is isolated between tunnel and gate oxides 260, 270.

Alternatively, the tunnel oxide 260 and floating gate 265 are not formed, so that each gate stack only has the gate oxide 270 and control poly gate/wordline 275.

If no floating gate is included, or if the floating gate is of a "self-isolating" nature, e.g., Si nanocrystals or silicon-rich oxide (SRO), then transistor formation is completed by removing the wordline nitride strips 870 and implanting the drain regions 240 (FIG. 26), as previously described.

For a DRAM cell, as previously described, a stack capacitor is formed on top of each pillar, yielding a 4F-square cell, with reduced wordline capacitance and bitline resistance. Similar to the stack capacitor 520 shown in FIG. 34, FIGS. 62, 63 show a stack capacitor 520' formed over the pillars 230 of the memory array. FIG. 62 shows the bitline trenches filled with oxide only. However, oxide and poly may fill the bitline trenches as shown in FIG. 34.

Figure 64:
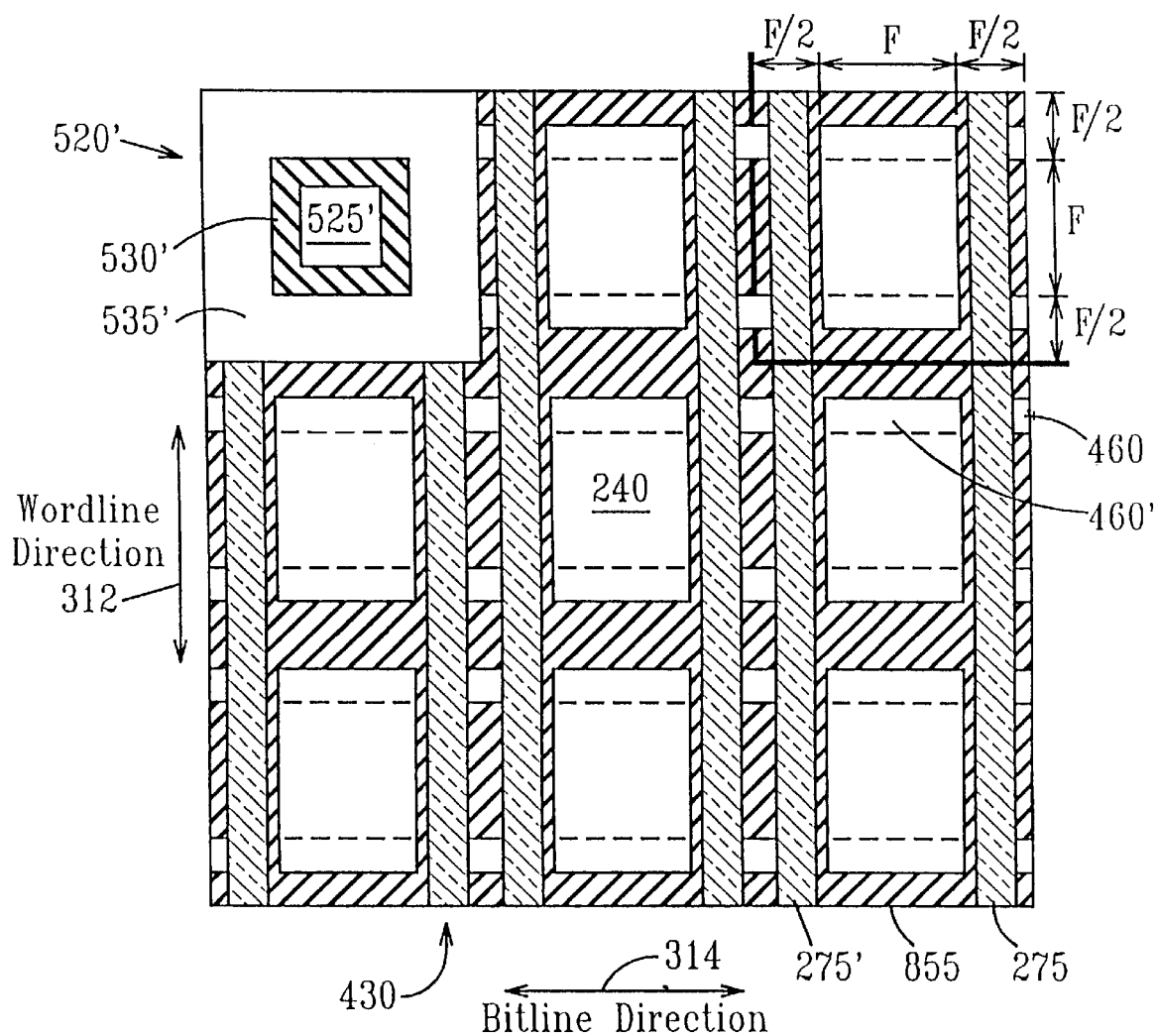

The stack capacitor 520' has a storage node 525' surrounded by a dielectric 530', such as BST or other high dielectric material. The storage node 525' and dielectric 530' are formed over each drain region 240, which is located at the top of each pillar 230, and are surrounded by a common plate 535'. FIG. 64 shows a top view of the stack capacitor 520'. Note, the area per pillar, which supports one bit, is $4F^2$, resulting in an array having one bit per $4F^2$. The poly straps covered by the oxide 855 are shown as reference numeral 460'. The two control gates 275, 275' per wordline pillars are separated by the oxide fill 855. Control gates of adjacent pillars are separated by the wordline trench, which may be filled with oxide. Except for the stack capacitor 520' and the lack of a floating gate 265 (FIG. 52), the top view of FIG. 64 is comparable to the three dimensional view of FIG. 52.

Alternatively, processing done prior to the transistors or FETs formation, forms a trench capacitor below each FET for charge storage similar to that previously described in connection with FIGS. 36–41. In addition, two separate capacitors, stack or trench, may be formed around each pillar. This forms a $2F^2$ DRAM cell, where each pillar has two such $2F^2$ DRAM cell.

If a self-isolated floating gate is present, then no capacitor is necessary. Referring to FIG. 52, the wordlines 225, 225' located on separate sides of each pillar, can be contacted to yield a 2F-square ($2F^2$) EEPROM or Flash type cell; two $2F^2$ cells per pillar.

If an amorphous Si floating gate 265 is desired, as shown in FIG. 52, additional processing steps are performed. These additional steps isolate the floating gate 265 on separate pillars along the wordline direction 312. At this stage of array fabrication, the wordline and bitline cross sections are shown in FIGS. 56 and 61, respectively. The additional steps include:

10) As shown in FIGS. 65–66, an additional layer of nitride 910 is deposited on the wafer to protect the gate stacks. In comparison to FIG. 56, the nitride layer 910 covers the nitride strips 870 of FIG. 59.

Figure 67:
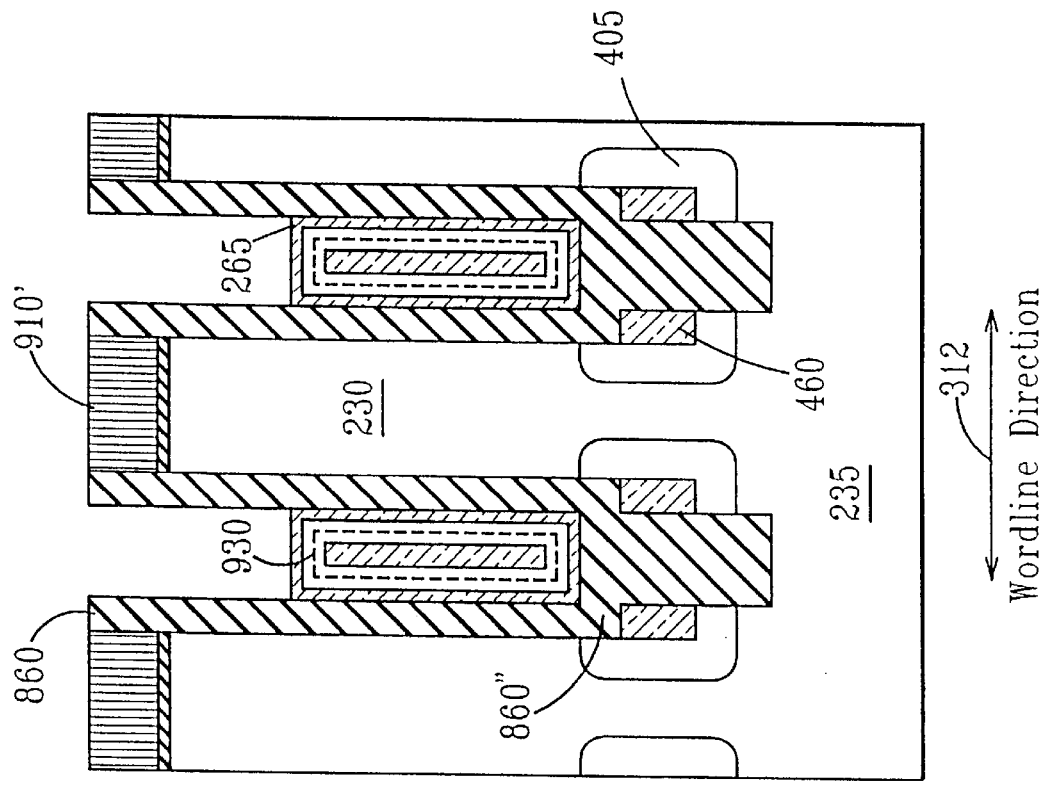

Next, as shown in FIG. 67, part of the nitride layer 910 is removed by RIE to expose the wordline interpillar material, (i.e., material located between pillars along the wordline direction 312), which material includes the polysilicon fill 865 and the oxide liner 860. After this nitride etch, the thickness of the nitride layer 910, shown in FIG. 66, is also reduced. Note, the thickness 920 (FIG. 65)of the nitride layer 910 over the wordline inter-pillar region is less than the thickness over the rest of the wafer. Therefore, no lithography is required to expose the wordline inter-pillar material.

Figure 68:
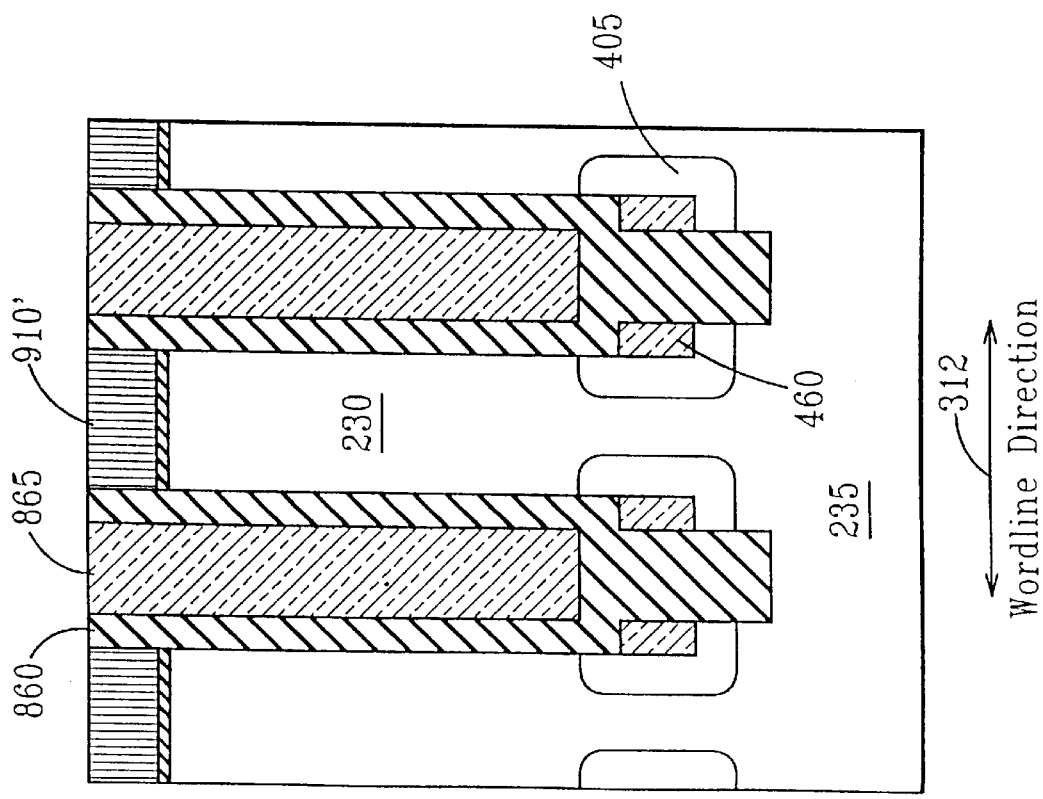
Figure 69:
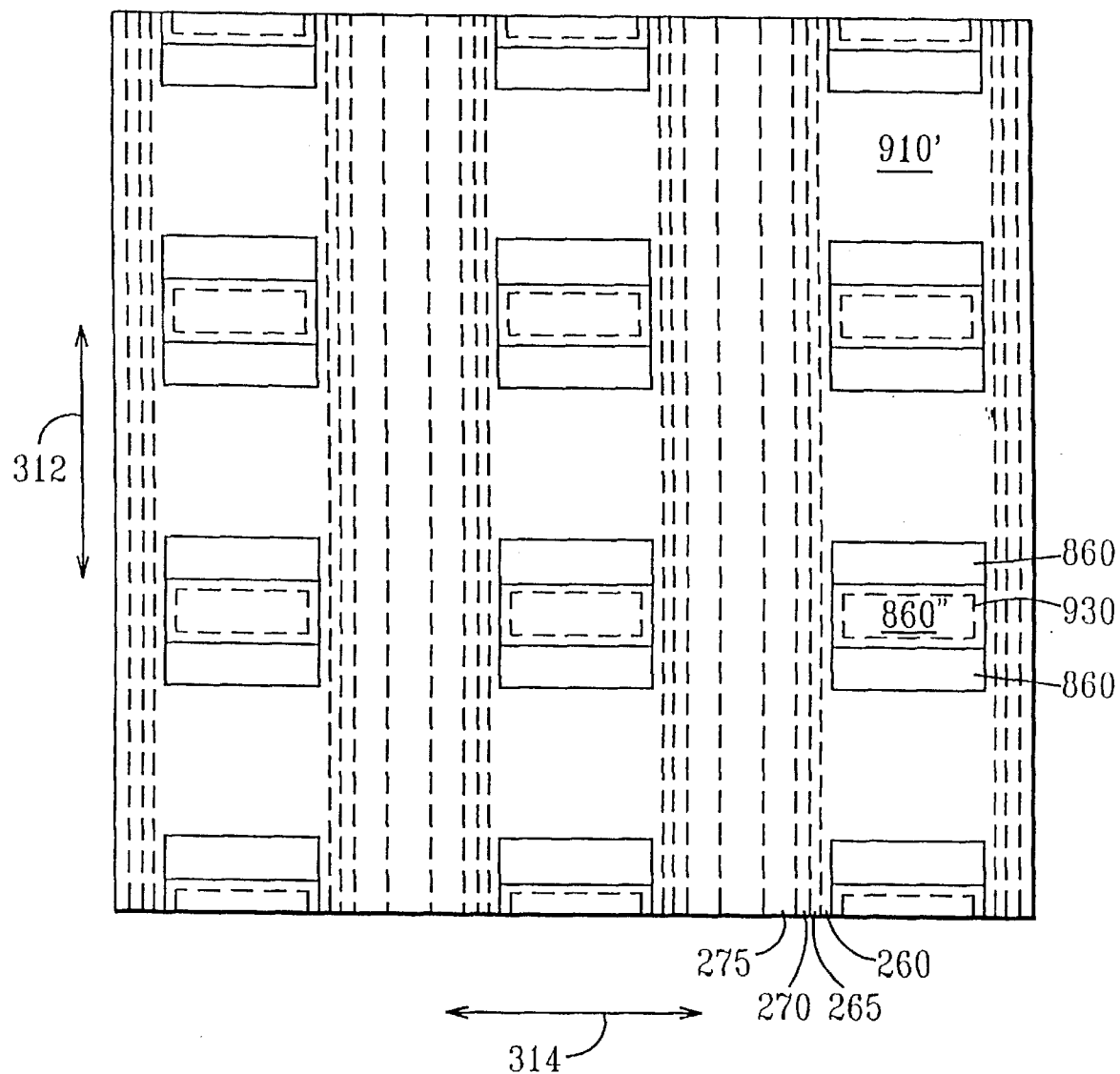

11) FIGS. 68 and 69 show the etched nitride layer 910' that exposes the wordline inter-pillar material. Next, the exposed polysilicon fill 865 is etched down, e.g., using RIE, to the bottom of the gate stack. Illustratively, the etch is performed to a depth in 560 nm and stops at the oxide liner bottom portion 860", which is around the same depth as the depth of the top of the buried bitline diffusion region 405.

This etch is selective to poly over oxide and nitride. Therefore, the poly etch forms holes between pillars along the wordline direction 312, referred to as wordline holes 930 and shown as dotted lines in FIGS. 68 and 69. As shown in FIG. 69, the entire wafer is covered with the etched nitride layer 910', except for F by F square exposed regions containing the oxide liner 860 and the poly fill 865, which is etched to form rectangular holes 930.

Forming the holes 930 exposes the floating gate 265 between the pillars along the wordline direction 312, i.e., between the wordline pillars. Depending on the degree of etch selectivity, the thin tunnel oxide 260 may remain on the exposed floating gate 265. The lengths of the holes 930 are bounded by the oxide liner 860 along the bitline direction 314. Along the wordline direction 312, the widths of the hole 930 are bounded by the floating gate 265 (or the tunnel oxide 260). The floating gate 265, shown in FIG. 68, is behind the hole 930.

Note, if only oxide had been used as the fill material, instead of both the oxide liner 860 and poly fill 865, then this etch step requires selective etching of oxide over nitride, which is more difficult to achieve. Also, it is important that the relative thicknesses of the oxide in both the bitline and wordline trenches have been set such that the entire floating gate portions are exposed after this polysilicon etch is complete, which portions are located between the oxide liners 860, along the wordline direction 312.

Figure 70:
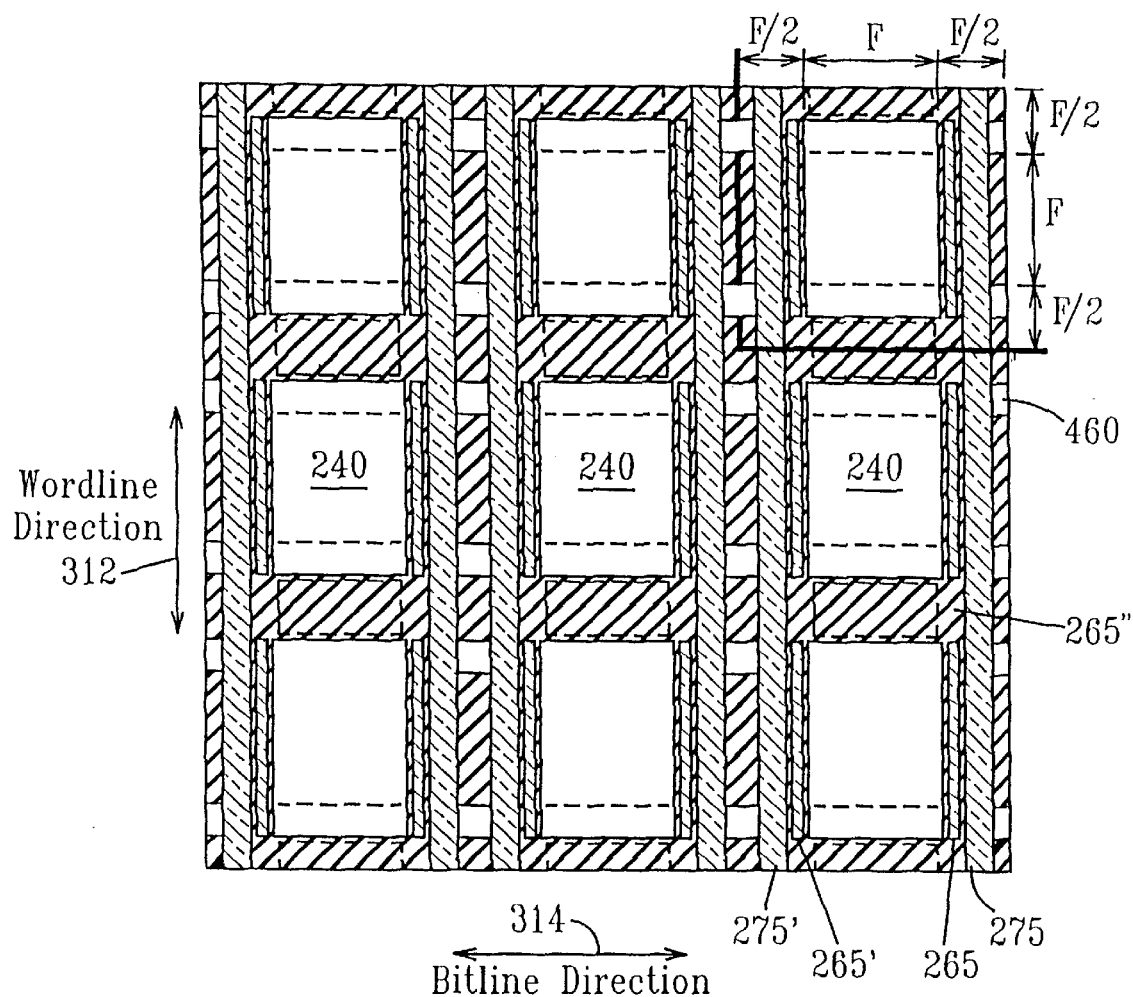
Figure 71:
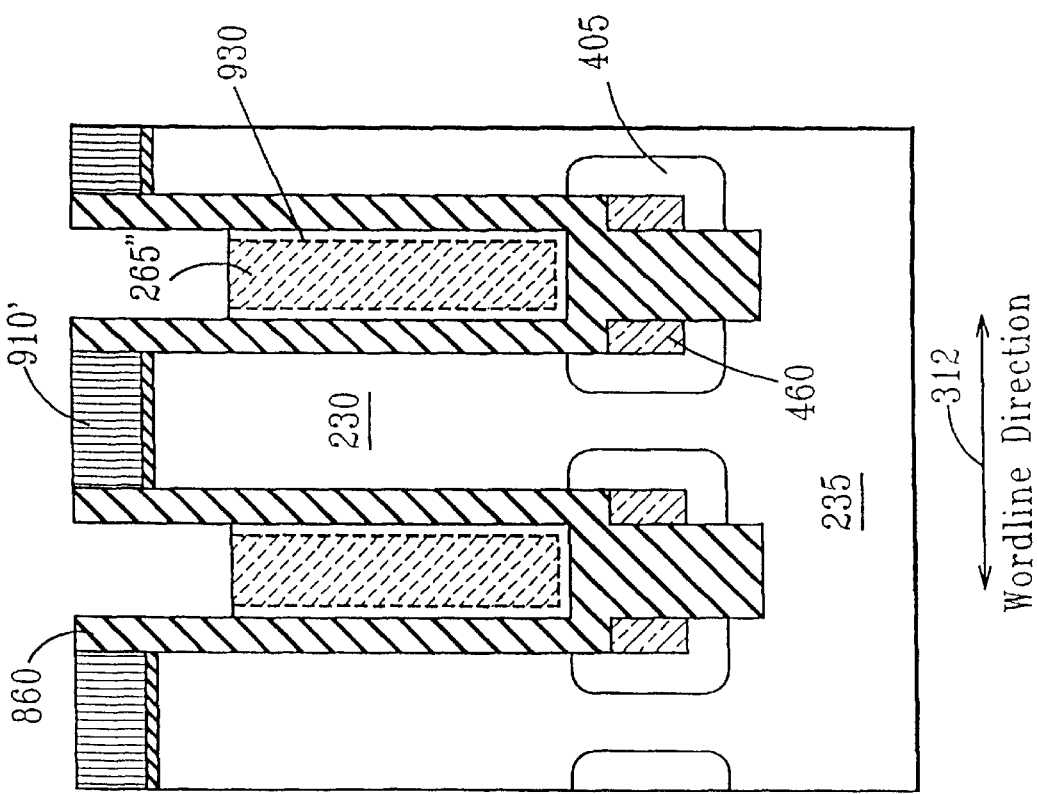

12) As shown in FIGS. 70–71, a brief reoxidation step is performed, sufficient to oxidize the exposed floating poly gate portions 265", or sufficient to oxidize the floating gate portion covered by the exposed thin tunnel oxide 260 of the holes 930. In FIG. 71, the oxidized floating gate portion 265' is shown, which is located behind the hole 930.

Oxidizing the floating gate portion 265" isolates the floating gates of each transistor along sides of the pillars from each other.

The top view of the array is shown in FIG. 70, where each pillar has two isolated floating gates 265, 265'. Each floating gate extends beyond the pillar along the wordline direction 312 a distance that includes the width of two poly straps 460 that are buried adjacent to the pillar. Each pillar has two transistors formed in a square 2F by 2F, i.e., $4F^2$, area. Thus, there is one transistor or one bit per $2F^2$ area.

Figure 72:
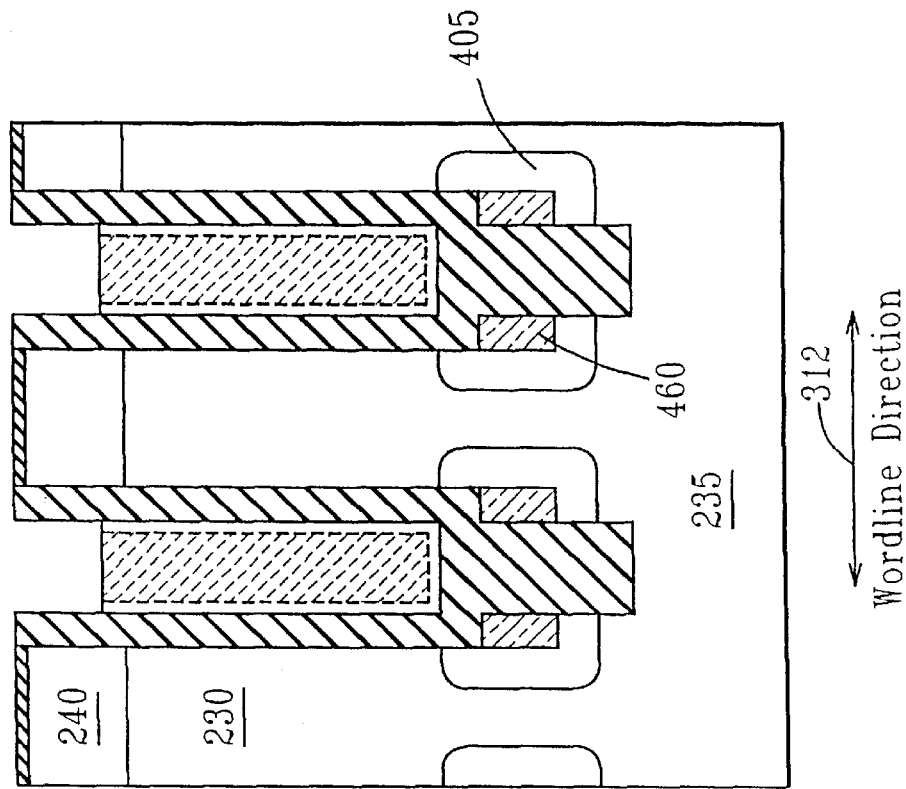

If desired, an additional oxide fill and chem-polish may be performed to fill in the holes 930 left between the wordline pillars. Then, as described above and shown in FIG. 72, the nitride is removed, and drain regions 240 are implanted on the top of each pillar.

This forms the array 850 of FIG. 52 shown in a three dimensional view. For clarity, the oxide that fills the wordline and bitline trenches 430, 210 is omitted in FIG. 52. To realize the 2F-square cell size, each of the two wordlines 225, 225' on each pillar is contacted separately at the end of the array 850.

Note that in all embodiments, additional conventional processing steps are performed to complete support devices and circuitry on the periphery of the array.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by letters patent is:

1. A semiconductor device comprising:
    a substrate;
    an array of cells having pillars formed on said substrate, said pillars being arranged in rows and columns, each of said pillars extending upward and having an upper region doped with a first type of impurity, a middle region doped with a second type of impurity, and separated lower regions extending from the pillars' sidewalls doped with said first type of impurity, said middle region being between said upper and lower regions and being continuous with said substrate; and first and second gate regions formed on pillar sidewalls over said middle region to control the resistance between said upper and lower regions, wherein said first and second gate regions are spaced apart by said pillars and are opposite each other along said columns.

2. The semiconductor device of claim 1, wherein said pillars along said rows are separated by an insulating material.

3. The semiconductor device of claim 1, wherein said first and second gate regions along said rows are continuous to form wordlines of said cells, and said lower regions along said columns are bit lines of said cells.

4. The semiconductor device of claim 1, wherein said lower regions occupy footprints of said pillars.

5. The semiconductor device of claim 1, wherein each of said first and second gate regions includes a first gate oxide formed on said sidewall and a first gate electrode formed over said first gate oxide.

6. The semiconductor device of claim 5, wherein each of said first and second gate regions further includes a second gate oxide formed on said first gate electrode and a second gate electrode formed over said second gate oxide.

7. The semiconductor device of claim 5, wherein said first gate electrode is insulated on all sides to form a floating gate.

8. The semiconductor device of claim 5, wherein a thickness of said first gate oxide is small so as to allow direct tunneling of electrons therethrough.

9. The semiconductor device of claim 1 further comprising a strap located adjacent each of said lower regions to reduce a resistance of said lower regions.

10. The semiconductor device of claim 1, wherein each of said first and second gate regions is common along pillars arranged in said rows, and separated from gate regions of pillars arranged in said columns.

11. The semiconductor device of claim 1 further comprising a stack capacitor formed on each of said pillars over said upper regions, each of said stack capacitors having a storage electrode formed over said upper region, a dielectric layer formed over said storage node, and a plate electrode formed over said dielectric layer.

12. The semiconductor device of claim 1 further comprising a trench capacitor formed around each of said pillars in trenches separating said pillars, said trenches being arranged in rows and columns, each of said trench capacitors having a storage electrode, a dielectric layer lining said trenches, and a plate electrode formed in said trenches over said dielectric layer, wherein said lower region acts as said storage electrode of said trench capacitor.

* * * * *